United States Patent
Yamada

(10) Patent No.: US 7,219,295 B2
(45) Date of Patent: May 15, 2007

(54) RECORDING-MEDIUM REPRODUCING APPARATUS, DECODING METHOD, DECODING PROGRAM, AND PROGRAM-RECORDED MEDIUM

(75) Inventor: Eiji Yamada, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 558 days.

(21) Appl. No.: 10/846,982

(22) Filed: May 14, 2004

(65) Prior Publication Data
US 2004/0237020 A1 Nov. 25, 2004

(30) Foreign Application Priority Data
May 14, 2003 (JP) ............... P2003-135559

(51) Int. Cl.
*H03M 13/00* (2006.01)
(52) U.S. Cl. .............. 714/758; 714/786; 714/755
(58) Field of Classification Search ........... 714/758, 714/769, 752, 786, 792, 755; 375/265
See application file for complete search history.

(56) References Cited

U.S. PATENT DOCUMENTS 7,095,812 B2 * 8/2006 Chan et al. .......... 375/341

2002/0174400 A1 11/2002 Yamada .............. 714/786

OTHER PUBLICATIONS

Laura McPheters, et al., *Turbo coded RLL constrained optical recording channels with DVD minimum mark size*, Optical Data Storage Topical Meeting 2001, pp. 91-93, Apr. 2001.

Eiji Yama da, et al., *Turbo Decoding with Run Length Limited Code for Optical Storage*, Japanese Journal Applied Physics, vol. 41 (2002), pp. 1753-1756, Part 1, No. 3B, Mar. 2002.

John L. Fan, et al., *Constrained Coding Techniques for Soft Iterative Decoders*, Global Telecommunications Conference 1999, pp. 723-727.

* cited by examiner

*Primary Examiner*—Guy J. Lamarre
(74) *Attorney, Agent, or Firm*—David G. Conlin; David A. Tucker; Edwards Angell Palmer & Dodge LLP

(57) ABSTRACT

An RLL demodulator for performing RLL demodulation on primary modulation data performs hard demodulation outside an iterative decoding loop. Further, decoding in compliance with a constraint concerning a PR transfer characteristic is performed by a PR-channel APP detector which performs iterative decoding by repeatedly feeding and receiving a priori information regarding the primary modulation data to and from an APP decoder for error-correcting codes.

70 Claims, 18 Drawing Sheets

| PRECEDING MODULATION DATA | CURRENT INPUT DATA | SUCCEEDING INPUT DATA | MODULATION DATA |
|---|---|---|---|
| X | 00 | 0X | 001 |
| 0 | 00 | 1X | 000 |
| 1 | 00 | 1X | 010 |
| 0 | 01 | 0X | 001 |
| 0 | 01 | 1X | 000 |
| 1 | 01 | 00 | 010 |
| 1 | 01 | NON-00 | 000 |
| 0 | 10 | 0X | 101 |
| 0 | 10 | 1X | 010 |
| 0 | 11 | 00 | 010 |
| 0 | 11 | NON-00 | 100 |

NON-00 : 01, 10, 11
X : 1 OR 0

Fig.6A

| CURRENT STATE | INPUT | OUTPUT | FOLLOWING STATE |
|---|---|---|---|
| 0 | 00 | 001 | 3 |
| 0 | 01 | 001 | 7 |
| 0 | 10 | 000 | 8 |
| 0 | 11 | 000 | 10 |
| 1 | 00 | 101 | 3 |
| 1 | 01 | 101 | 7 |
| 1 | 10 | 113 | 9 |
| 1 | 11 | 113 | 11 |
| 2 | 00 | 443 | 1 |
| 2 | 01 | 443 | 5 |
| 2 | 10 | 444 | 9 |
| 2 | 11 | 444 | 11 |
| 3 | 00 | 343 | 1 |
| 3 | 01 | 343 | 5 |
| 3 | 10 | 331 | 8 |
| 3 | 11 | 331 | 10 |
| 4 | 00 | 001 | 3 |
| 4 | 01 | 001 | 7 |
| 4 | 10 | 000 | 8 |
| 4 | 11 | 000 | 10 |
| 5 | 00 | 113 | 2 |
| 5 | 01 | 113 | 4 |
| 5 | 10 | 100 | 8 |
| 5 | 11 | 100 | 10 |

Fig.6B

| CURRENT STATE | INPUT | OUTPUT | FOLLOWING STATE |
|---|---|---|---|
| 6 | 00 | 443 | 1 |
| 6 | 01 | 443 | 5 |
| 6 | 10 | 444 | 9 |
| 6 | 11 | 444 | 11 |
| 7 | 00 | 331 | 0 |
| 7 | 01 | 344 | 6 |
| 7 | 10 | 344 | 9 |
| 7 | 11 | 344 | 11 |
| 8 | 00 | 133 | 1 |
| 8 | 01 | 133 | 5 |
| 8 | 10 | 013 | 9 |
| 8 | 11 | 013 | 11 |
| 9 | 00 | 311 | 3 |
| 9 | 01 | 311 | 7 |
| 9 | 10 | 431 | 8 |
| 9 | 11 | 431 | 10 |
| 10 | 00 | 013 | 2 |
| 10 | 01 | 134 | 6 |
| 10 | 10 | 134 | 9 |
| 10 | 11 | 134 | 11 |
| 11 | 00 | 431 | 0 |
| 11 | 01 | 310 | 4 |
| 11 | 10 | 310 | 8 |
| 11 | 11 | 310 | 10 |

Fig.9

| CURRENT STATE | INPUT | OUTPUT | FOLLOWING STATE |
|---|---|---|---|
| 0 | 00 | 001 | 4 |
| 0 | 01 | 001 | 5 |
| 0 | 10 | 000 | 2 |
| 0 | 11 | 000 | 3 |
| 1 | 00 | 001 | 4 |
| 1 | 01 | 001 | 5 |
| 1 | 10 | 000 | 2 |
| 1 | 11 | 000 | 3 |
| 2 | 00 | 101 | 4 |
| 2 | 01 | 101 | 5 |
| 2 | 10 | 010 | 2 |
| 2 | 11 | 010 | 3 |
| 3 | 00 | 010 | 0 |
| 3 | 01 | 100 | 1 |
| 3 | 10 | 100 | 2 |
| 3 | 11 | 100 | 3 |
| 4 | 00 | 001 | 4 |
| 4 | 01 | 001 | 5 |
| 4 | 10 | 010 | 2 |
| 4 | 11 | 010 | 3 |
| 5 | 00 | 010 | 0 |
| 5 | 01 | 000 | 1 |
| 5 | 10 | 000 | 2 |
| 5 | 11 | 000 | 3 |

RECORDING-MEDIUM REPRODUCING APPARATUS, DECODING METHOD, DECODING PROGRAM, AND PROGRAM-RECORDED MEDIUM

This nonprovisional application claims priority under 35 U.S.C. §119(a) on Patent Application No. 2003-135559 filed in Japan on May 14, 2003, the entire contents of which are hereby incorporated by reference.

BACKGROUND OF THE INVENTION

The present invention relates to an apparatus and method used for subjecting information data to an error-correcting coding and a modulation such as a run length limited ("RLL") modulation to create channel data, recording the channel data onto a recording medium, and subjecting channel data reproduced from the recording medium to a demodulation, such as an RLL demodulation, and an error-correcting decoding to reconstruct the information data, and more particularly to a recording-medium reproducing apparatus, a decoding method, a decoding program, and a program-recorded medium containing the decoding program.

Among error-correcting methods, the turbo code method and the low density parity check ("LDPC") code method have been capturing the spotlight mainly in the communication field by virtue of its having such high performance as to approach the theoretical limit of the transmission rate at which transmission can be achieved without errors (namely, Shannon limit). Further, studies on applications of the turbo code method and the LDPC code method to the recording medium field as well as the above-noted communication field, have energetically been presented.

A recording and reproducing apparatus using this turbo code is explained briefly. FIG. 17 is a schematic diagram of a recording and reproducing apparatus as a first background art, which performs coding and decoding processes of turbo codes. A turbo coder 1 performs turbo coding on inputted information data $u_i$ to output code data $c_i$. An RLL modulator 2 performs RLL modulation on the inputted code data $c_i$ to output modulated data $m_i$. A pre-coder 3 performs non-return-to-zero inverse ("NRZI") conversion on the inputted modulated data $m_i$ to output channel data $a_i$. The channel data $a_i$ outputted in this way is transmitted to a partial response ("PR") channel 4. This PR channel 4 has a property that adjacent channel data $a_i$ interfere with each other. As a result of this, an intersymbol interference occurs to a reproduced signal $y'_i$ reproduced from the PR channel 4. Also, the channel data $a_i$, when passing the PR channel 4, undergoes deformation such as noise addition, band limiting or crosstalk. Therefore, the reproduced signal $y'_i$ reproduced from the PR channel 4 has errors added thereto. It is noted here that a symbol with a prime (') indicates that the symbol is data reconstructed after reproduction (that is, indicating addition of errors by the PR channel 4), and a symbol without a prime (') indicates that the symbol is data before recording.

In the case where the PR channel 4 is a recording medium, i.e., in the case of a system which performs recording and reproduction on media such as magnetic recording, magneto-optical recording and optical recording, there exist constraints such as band limiting of the PR channel 4, intersymbol interference, clock synchronization and the like. Therefore, the RLL method is usually used for the modulation. Generally, RLL data is expressed as RLL(d, k), where "d" and "k" represent minimum and maximum run lengths of 0's in a modulated data sequence. The run length restriction on the modulated data sequence is called "RLL condition."

Describing the RLL in more detail, polarity inversion intervals of recording waveform sequences or trains are limited to a minimum polarity-inversion interval Tmin and a maximum polarity-inversion interval Tmax. That is, inversion intervals T of recording waveform trains are within the limits of $Tmin \leq T \leq Tmax$. Generally, the minimum polarity-inversion interval Tmin is expressed as $(d+1) \times Tw$. The maximum polarity-inversion interval Tmax is expressed as $(k+1) \times Tw$. It is noted here that "Tw," which denotes the width of a detection window for reproduced signals, is equal to the greatest common measure of polarity-inversion intervals, i.e., $Tw = \eta \times Tb$, where "Tb" denotes a data interval before modulation, and the symbol "$\eta$," called a coding rate, is equal to m/n. That is, pre-modulation m bits are transformed into post-modulation n bits.

Moreover, if a polarity per polarity-inversion interval T is expressed by one bit like "0" or "1", then a recording waveform train is equal to a channel data train. The channel data train is expressed, for example, as " . . . 011100001111111100111 . . . " In this channel data train, a series of succeeding "0" bits or a series of succeeding "1" bits has a bit length of not less than (d+1) and not more than (k+1). Hence, a constraint concerning the channel data is also called RLL condition. More specifically, the RLL condition can be expressed as a constraint concerning modulation data. Moreover, the RLL condition can also be expressed as a constraint concerning channel data.

A PR channel a posteriori probability ("APP") detector 5, to which the reproduced signal $y'_i$ is inputted, performs an a posteriori probability decoding in compliance with constraints concerning channel data $a_i$, pre-codes and a PR transfer characteristic, and outputs a logarithmic likelihood ratio $L(m'_i)$ relating to modulation data $m'_i$.

An APP decoder 6 for RLL modulation, to which the logarithmic likelihood ratio $L(m'_i)$ of the modulation data $m'_i$ from the PR-channel APP detector 5 is inputted, performs an a posteriori probability decoding in compliance with the constraint concerning RLL modulation, and outputs a logarithmic-likelihood ratio $L(c'_i)$ relating to coded data $c'_i$.

A turbo decoder 7 performs a turbo decoding in compliance with the constraint concerning turbo codes placed by the turbo coder 1, and outputs a logarithmic-likelihood ratio $L(u'_i)$ relating to information data $u'_i$. Thus, the logarithmic-likelihood ratio $L(u'_i)$ of the information data $u'_i$ outputted from the turbo decoder 7 is binarized by a comparator 8 and outputted as reconstructed information data $u'_i$.

A detailed description regarding the operation principle of a recording and reproducing apparatus employing turbo codes according to the first background art is found in, for example, "Turbo coded RLL constrained optical recording channels with DVD minimum mark size", Optical Data Storage Topical Meeting 2001, pp. 91–93, April 2001 (Literature 1), and "Turbo Decoding with Run Length Limited Code for Optical Storage", Japanese Journal Applied Physics, Vol.41 (2002) pp. 1753–1756, Part 1, No. 3B, March 2002 (Literature 2).

However, in the demodulation corresponding to the RLL modulation performed in the recording and reproducing apparatus, input modulation data is soft information and output coded data is also soft information as with the case of the APP decoder 6 for RLL modulation, which necessitates execution of a soft decoding. Herein, the term "soft decoding" refers to the decoding in which the coding results are outputted in the form of probabilities of being "0" or "1"

(likelihood). Such processing for performing the demodulation for RLL modulation (hereinbelow, referred to as RLL demodulation) through the soft decoding requires an extremely large calculating amount. This increases the size of an RLL demodulation circuit.

Accordingly, there has been proposed a recording and reproducing apparatus which can reduce an RLL demodulation processing amount to be lower than that in the recording and reproducing apparatus shown in FIG. 17. FIG. 18 is a schematic view showing a reproducing apparatus as second background art. The reproducing apparatus performs iterative decoding processing. Moreover, FIG. 19 is a schematic view showing a recording apparatus for transmitting channel data reproduced by the reproducing apparatus shown in FIG. 18 to a PR channel. Description will be first given of the recording apparatus with reference to FIG. 19.

A first RLL modulator 11 performs the RLL modulation upon inputted information data $u'_i$ and outputs primary modulation data $m1_i$. The primary modulation data $m1_i$ is then inputted into a primary pre-coder 12 and a systematic error-correcting coder 13. The primary pre-coder 12 performs the NRZI conversion upon the primary modulation data $m1_i$ to generate primary channel data $a1_i$ and outputs it to a multiplexer 16. The systematic error-correcting coder 13 performs the systematic error-correcting coding on the inputted primary modulation data $m1_i$ to generate and output checking data $p_i$. A second RLL modulator 14 performs the RLL modulation on the inputted checking data $p_i$ to output a secondary modulation data $m2_i$. A secondary pre-coder 15 performs the NRZI conversion on the inputted secondary modulation data $m2_i$ to generate a secondary channel data $a2_i$ and outputs it to the multiplexer 16.

The multiplexer 16 multiplexes the primary channel data $a1_i$ received from the primary pre-coder 12 and the secondary channel data $a2_i$ received from the secondary pre-coder 15 to generate channel data $a_i$ and outputs it to a PR channel 17.

Description is now given of the reproducing apparatus shown in FIG. 18. Data $y'_i$ reproduced by the PR channel 17 is inputted to a PR channel APP detector 21. Then, in compliance with constraints concerning channel data, precodes and a PR transfer characteristic, the a posteriori probability decoding is performed and a logarithmic likelihood ratio $L(m'_i)$ relating to modulation data $m'_i$ is outputted. A multiplexer 22 decomposes the logarithmic-likelihood ratio $L(m'_i)$ of the modulation data $m'_i$ and divides the data into a logarithmic-likelihood ratio $L(m1'_i)$ relating to primary modulation data and a logarithmic-likelihood ratio $L(m2'_i)$ relating to secondary modulation data. The logarithmic-likelihood ratio $L(m1'_i)$ relating to primary modulation data is inputted into an adder 24, while the logarithmic-likelihood ratio $L(m2'_i)$ relating to secondary modulation data is inputted into an APP decoder 23 for RLL modulation.

Generally, an APP decoder has 2-input and 2-output terminals, i.e., an information input terminal u;I into which the likelihood relating to information data is inputted, a code input terminal c;I into which the likelihood relating to code data is inputted, an information output terminal u;O from which the likelihood relating to information data is outputted, and a code output terminal c;O from which the likelihood relating to code data is outputted. The APP decoder, receiving inputs of the likelihood relating to information data and the likelihood relating to code data, updates those likelihoods in compliance with a constraint concerning codes. It is to be noted that likelihoods inputted to the information input terminal u;I are called a priori information. From the information output terminal u;O, likelihoods regarding information data are outputted as a posteriori probability decoding results. From the code output terminal c;O, likelihoods regarding code data are outputted as the a posteriori probability decoding results. Herein, the term "information data" refers to data inputted to a coder corresponding to an APP decoder, and the term "code data" refers to data outputted from the coder.

Moreover, the APP decoder can be expressed as a 1-input and 1-output block if a priori information regarding the information data is not inputted thereto and code data is not outputted therefrom as an a posteriori probability decoding result, i.e., if the information input terminal u;I and the code output terminal c;O are not provided. Receiving inputs of the likelihood relating to code data, this 1-input and 1-output APP decoder performs the a posteriori probability decoding in compliance with the constraint regarding codes and outputs the likelihood relating to information data. Such a 1-input and 1-output APP decoder is embodied by, for example, the PR-channel APP detector 21 and the APP decoder 23 for RLL modulation shown in FIG. 18.

Further, if the error-correcting codes are systematic error-correcting codes, the APP decoder for these systematic error-correcting codes has 2-input and 2-output terminals. The 2-input and 2-output terminals of the APP decoder for the systematic error-correcting codes are sometimes embodied in different forms. That is, the input terminals are composed of an information input terminal u;I into which likelihoods regarding information data are inputted, and a checking input terminal p;I into which likelihoods regarding checking data are inputted. The output terminals are composed of an information output terminal p;O from which likelihoods regarding information data are outputted, and a checking output terminal c;O from which likelihoods regarding checking data are outputted. Herein, the term "systematic code" refers to such a code that information data (i.e., input data) is contained as it is in code data (i.e., output data). Among the output data (code data), data other than the input data (information data) (i.e., a redundancy generated by coding) is called checking data. Such APP decoders include, for example, an APP decoder 28 for error-correcting codes that will be described later with reference to FIG. 18.

In FIG. 18, the APP decoder 23 for RLL modulation, into which the logarithmic-likelihood ratio $L(m2'_i)$ relating to the secondary modulation data is inputted, performs the RLL demodulation through the a posteriori probability decoding processing, and outputs a logarithmic-likelihood ratio $L(p'_i)$ relating to checking data $p'_i$.

The adder 24, into which the logarithmic-likelihood ratio $L(m1'_i)$ relating to the primary modulation data $m1'_i$ is inputted, further adds extrinsic information $L_{2,ext}(m1'_i)$ inputted from a later-described second subtracter 27 and outputs a result as a priori information $L_{1,a}(m1'_i)$ regarding the primary modulation data $m1'_i$.

Receiving inputs of the a priori information $L_{1,a}(m1'_i)$ regarding the primary modulation data from the adder 24, an APP decoder 25 for RLL condition performs the a posteriori probability decoding in compliance with an RLL condition, and outputs a logarithmic-likelihood ratio $L_{1,post}(m1'_i)$ relating to primary modulation data. The RLL condition can be expressed by a trellis diagram. For example, FIG. 20 is a trellis diagram showing the RLL condition in (1, 7)RLL modulation. In FIG. 20, bits "0" and "1" given to transmission branches extending from internal states $S_0$–$S_7$ at a point k to internal states $S_0$–$S_7$ at a point (k+1) represent modulation data. The RLL condition in this (1, 7)RLL modulation is: a minimum run length d=1, and a maximum run length k=7.

The trellis diagram shown in FIG. 20 has eight internal states of from "$S_0$" to "$S_7$". In this case, the point "k" is updated every bit of modulation data. A path that satisfies the trellis diagram is, for example, ". . . 010010001000000010100 . . . ". The RLL condition regarding modulation data in the (1, 7)RLL modulation is a constraint that a run of "0" bits between consecutive "1" bits must have a length of at least d and not more than k, i.e., a bit length of at least 1 and not more than 7. In other words, the APP decoder 25 for RLL condition performs a decoding based on the trellis diagram representing the RLL condition concerning modulation data.

A first subtracter 26 subtracts the extrinsic information $L_{2,ext}(m1'_i)$ regarding primary modulation data outputted from the second subtracter 27 from the logarithmic-likelihood ratio $L_{1,post}(m1'_i)$ relating to primary modulation data inputted from the APP decoder 25 for the RLL condition, and outputs a result as a logarithmic-likelihood ratio $L_{1,ext}(m1'_i)$ relating to primary modulation data.

In the APP decoder 28 for error-correcting codes, the logarithmic-likelihood ratio $L_{1,ext}(m1'_i)$ from the first subtracter 26 is inputted into the information input terminal u;I, while the logarithmic-likelihood ratio $L(p'_i)$ from the APP decoder 23 for RLL modulation is inputted into the checking input terminal p;I, and the logarithmic-likelihood ratio $L_{2,post}(m1'_i)$ relating to primary modulation data is outputted from the information output terminal u;O. It is to be noted that the checking output terminal p;O from which logarithmic-likelihood ratios regarding checking data are outputted is not connected to any terminal.

The second subtracter 27 is fed with the logarithmic-likelihood ratio $L_{2,post}(m1'_i)$ relating to primary modulation data $m1'_i$ that is outputted from the information output terminal u;O of the APP decoder 28 for error-correcting codes, and the logarithmic-likelihood ratio $L_{1,ext}(m1'_i)$ relating to primary modulation data $m1'_i$ from the first subtracter 26. Then, the second subtracter 27 subtracts the logarithmic-likelihood ratio $L_{1,ext}(m1'_i)$ from the logarithmic-likelihood ratio $L_{2,post}(m1'_i)$, and outputs a result as extrinsic information $L_{2,ext}(m1'_i)$ regarding primary modulation data to the first subtracter 26 and the adder 24.

Thus, between two APP decoders, i.e., the APP decoder 25 for RLL condition and the APP decoder 28 for error-correcting codes, the iterative decoding is performed by repeatedly delivering logarithmic-likelihood ratios regarding the primary modulation data. By this iterative decoding, errors of later-described reconstructed primary modulation data $m1'_i$ can be decreased.

A comparator 29 binarizes the logarithmic-likelihood ratio $L_{2,post}(m1'_i)$ relating to primary modulation data outputted from the information output terminal u;O in the APP decoder 28 for error-correcting codes, and outputs obtained binarized values as reconstructed primary modulation data $m1'_i$ to an RLL demodulator 30. Consequently, the RLL demodulator 30 performs the RLL demodulation on reconstructed primary modulation data $m1'_i$ and finally outputs a result as reconstructed information data $u'_i$. At this point, the RLL demodulator 30 performs a hard decoding involving inputting and outputting of binarized hard information. This drastically reduces a computing amount of soft decoding processing, allowing achievement of a smaller-sized demodulation circuit for RLL modulation.

A detailed description regarding the operation principle of a recording and reproducing system involving the iterative decoding according to the second background art is found in "Constrained Coding Techniques for Soft Iterative Decoders", Global Telecommunications Conference 1999, pp. 723–727.

However, the recording and reproducing system in the second background art has the following problems. That is, as described above, two APP decoders for executing iterative decoding are the APP decoder 25 for RLL condition and the APP decoder 28 for error-correcting codes. Among these, the APP decoder 25 for RLL condition performs the APP decoding in compliance with a constraint concerning a run length limit among the constraints concerning the RLL modulation. This implies that the decoding processing adopting iterative decoding would not contain a constraint concerning a PR transfer characteristic. As a result, decoding processing in the above recording and reproducing system in compliance with the constraint concerning the PR transfer characteristic is executed only once in the PR-channel APP detector 21.

In other words, in the above recording and reproducing system, decoding is not executed through iterative adoption of the constraint concerning the PR transfer characteristic. This causes deterioration of the error rate of reconstructed information data $u'_i$, thereby posing a problem of decreased recording density of a recording medium such as the PR channel 17. Moreover, there is also a problem that stricter tolerances are required for the recording medium and the recording and reproducing system.

Herein, the term "tolerances" refers to allowable errors in parameters that would cause increases in errors of reconstructed information data. The parameters with respect to the tolerances to the recording medium are exemplified by warpage expressed by tangential tilts or radial tilts, substrate noise, and the like. Further, when the recording medium is an optical disk, the parameters also include thickness errors of a cover glass, refractive index, birefringence index, and the like. On the other hand, the parameters with respect to the recording and reproducing apparatus include, for example, a detracking amount of a tracking servo, recording power, and the like. Furthermore, when the recording and reproducing apparatus is a recording and reproducing apparatus adopting the optical recording or magneto-optical recording scheme, the parameters further include aberrations of objective lenses, offsets of the focusing servo (defocus amount), reproducing power, and the like.

SUMMARY OF THE INVENTION

Accordingly, an object of the present invention is to provide a recording-medium reproducing apparatus, a decoding method, a decoding program and a program-recorded medium, which involve an APP decoding for the RLL demodulation with a reduced processing amount, and an iterative decoding loop that includes decoding in compliance with a constraint concerning PR channel.

In order to accomplish the above object, according to a first aspect of the present invention, there is provided a recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by performing at least systematic error-correcting coding on the primary modulation data to form checking data, then performing at least the modulation on the checking data to generate secondary modulation data, and then performing the pre-coding on the secondary modulation data. The apparatus includes reproducing means reproducing the primary channel data and the secondary channel data recorded on the recording medium and outputting reproduced data; iterative decoding means, based on the reproduced data, iteratively performing a posteriori probability decoding in compliance with a constraint concerning channel data and constraints concerning pre-codes and a recording and reproducing characteristic, and an a posteriori probability decoding in compliance with a constraint concerning systematic error-correcting codes while repeatedly delivering and receiving a priori information regarding the primary modulation data internally, so as to obtain an a posteriori probability of the primary modulation data; and demodulation means binarizing the a posteriori probability of the primary modulation data derived from the iterative decoding means and then performing demodulation corresponding to the modulation so as to reconstruct the information data.

With this constitution, the iterative decoding means is configured such that demodulation processing for RLL modulation, which requires a considerably large amount of computation if soft decoding is adopted, is not executed. This allows reduction of a computation amount in the iterative decoding repeated between both the a posteriori probability decodings. Further, the constraints employed in the decodings by the iterative decoding means include a constraint concerning a recording and reproducing characteristic. Therefore, as both the a posteriori probability decodings are iteratively repeated, decoding in compliance with the constraint concerning the recording and reproducing characteristic is also iteratively performed. Thus, iterative decoding suitable for the recording medium is performed.

There is provided, according to a second aspect of the present invention, a recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by sequentially performing first pseudo-random substitution and systematic error-correcting coding on the primary modulation data to generate checking data, then sequentially performing second pseudo-random substitution and the modulation on the checking data to generate secondary modulation data, and then performing the pre-coding on the secondary modulation data. The apparatus includes a reproduction section reproducing the primary channel data and the secondary channel data recorded on the recording medium and outputting reproduced data composed of primary reproduced data and secondary reproduced data; a communication channel value computing section computing a communication channel value representing a probability per bit in the reproduced data; a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data; a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section; a first substitution section performing the first pseudo-random substitution on the extrinsic information regarding the primary modulation data derived from the first computing section to generate extrinsic information regarding post-substitution primary modulation data and outputting the information as a priori information regarding the post-substitution primary modulation data; a second a posteriori probability decoding section receiving a priori information regarding the checking data, and performing a posteriori probability decoding on the a priori information regarding the checking data and the a priori information regarding the post-substitution primary modulation data derived from the first substitution section in compliance with a constraint concerning systematic error-correcting codes to generate an a posteriori probability of the post-substitution primary modulation data and an a posteriori probability of the checking data; a second computing section computing extrinsic information regarding the post-substitution primary modulation data updated by the second a posteriori probability decoding section, based on the a priori information regarding the post-substitution primary modulation data derived from the first substitution section and the a posteriori probability of the post-substitution primary modulation data derived from the second a posteriori probability decoding section; a first inverse substitution section performing inverse substitution of the first pseudo-random substitution on the extrinsic information regarding the post-substitution primary modulation data derived from the second computing section to generate extrinsic information regarding the primary modulation data and outputting the information as a priori information regarding the primary modulation data to the first a posteriori probability decoding section and the first computing section; a third a posteriori probability decoding section receiving a priori information regarding the post-substitution checking data, and performing a posteriori probability decoding on the a priori information regarding the post-substitution checking data and the communication channel value as to the secondary reproduced data derived from the communication channel value computing section in compliance with a constraint concerning modulation and constraints concerning pre-codes and a recording and reproducing characteristic so as to generate an a posteriori probability of the post-substitution checking data; a third computing section receiving the a priori information regarding the post-substitution checking data, and, based on the a priori information regarding the post-substitution checking data and the a posteriori probability of the post-substitution checking data derived from the third a posteriori probability decoding section, computing extrinsic information regarding the post-substitution checking data updated by the third a posteriori probability decoding section; a second inverse substitution section performing inverse substitution of the second pseudo-random substitution on the extrinsic information regarding the post-substitution checking data derived from the third computing section so as to generate extrinsic information regarding the checking data, and outputting the generated information as a priori information regarding the checking data to the second a posteriori probability decoding section; a fourth computing section computing extrinsic information regarding the checking data updated by the second a posteriori probability decoding section, based on the a priori information regarding the checking data derived from the second inverse substitution section and the a posteriori probability of the checking data derived from the second a posteriori probability decoding section; a second substitution section performing the second pseudo-random substitution on the extrinsic information regarding the checking data derived from the fourth computing section so as to generate extrinsic information regarding the post-substitution checking data, and outputting the generated information as a priori information regarding the post-substitution checking data to the third a posteriori probability decoding section and the third computing section; and a demodulation section receiving the a posteriori probability of the primary modulation data derived from the first a posteriori probability decoding section or the a posteriori probability of the post-substitution primary modulation data derived from the second a posteriori probability decoding section, and, upon receipt of the a posteriori probability of the primary modulation data, binarizing the a posteriori probability of the primary modulation data and then performing demodulation corresponding to the modulation so as to reconstruct the information data, whereas upon receipt of the a posteriori probability of the post-substitution primary modulation data, sequentially performing inverse substitution of the first pseudo-random substitution and binarization on the a posteriori probability of the post-substitution primary modulation data and then performing demodulation corresponding to the modulation so as to reconstruct the information data. The first and second a posteriori probability decoding sections performs iterative decoding while repeatedly delivering a priori information regarding the primary modulation data therebetween, and the second and third a posteriori probability decoding sections also perform iterative decoding while repeatedly delivering a priori information regarding the checking data therebetween, and after both the iterative decodings have been performed, the demodulation section performs demodulation processing so as to reconstruct the information data.

With this constitution, processings to be performed by the first a posteriori probability decoding section does not include demodulation processing for RLL modulation, which would require a considerably large amount of computation if soft decoding is adopted. This allows reduction of a computation amount in the iterative decoding repeated between the first and second a posteriori probability decoding sections. Further, constraints employed in decoding by the first a posteriori probability decoding section include the constraint concerning a recording and reproducing characteristic. Therefore, while the iterative decoding by the both first and second a posteriori probability decoding sections is performed, decoding in compliance with the constraint concerning the recording and reproducing characteristic is also iteratively performed. Thus, iterative decoding suitable for the recording medium is performed.

A priori information regarding the primary modulation data, which is iteratively delivered between the first and second a posteriori probability decoding sections is subjected to the first pseudo-random substitution and its inverse substitution. Thus, the iterative decoding carried out between the first and second a posteriori probability decoding sections allows reduction in the error rate. Similarly, a priori information regarding the checking data, which is iteratively delivered between the second and third a posteriori probability decoding sections is subjected to the second pseudo-random substitution and its inverse substitution. Thus, the iterative decoding carried out between the second and third a posteriori probability decoding sections allows further reduction in the error rate.

There is also provided, according to a third aspect of the present invention, a recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by sequentially performing first pseudo-random substitution and systematic error-correcting coding on the primary modulation data to generate checking data, then sequentially performing second pseudo-random substitution and the modulation on the checking data to generate secondary modulation data, and then performing the pre-coding on the secondary modulation data, the apparatus includes a reproduction section reproducing the primary channel data and the secondary channel data recorded on the recording medium and outputting reproduced data composed of primary reproduced data and secondary reproduced data; a communication channel value computing section computing a communication channel value representing a probability per bit in the reproduced data; a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data; a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section; a first substitution section performing the first pseudo-random substitution on the extrinsic information regarding the primary modulation data derived from the first computing section to generate extrinsic information regarding post-substitution primary modulation data and outputting the information as a priori information regarding the post-substitution primary modulation data; a second a posteriori probability decoding section receiving a priori information regarding the checking data, and performing a posteriori probability decoding on the a priori information regarding the checking data and the a priori information regarding the post-substitution primary modulation data derived from the first substitution section in compliance with a constraint concerning systematic error-correcting codes to generate an a posteriori probability of the post-substitution primary modulation data; a second computing section computing extrinsic information regarding the post-substitution primary modulation data updated by the second a posteriori probability decoding section, based on the a priori information regarding the post-substitution primary modulation data derived from the first substitution section and the a posteriori probability of the post-substitution primary modulation data derived from the second a posteriori probability decoding section; a first inverse substitution section performing inverse substitution of the first pseudo-random substitution on the extrinsic information regarding the post-substitution primary modulation data derived from the second computing section to generate extrinsic information regarding the primary modulation data and outputting the information as a priori information regarding the primary modulation data to the first a posteriori probability decoding section and the first computing section; a third a posteriori probability decoding section performing a posteriori probability decoding on the communication channel value as to the secondary reproduced data derived from the communication channel value computing section in compliance with a constraint concerning modulation and constraints concerning pre-codes and a recording and reproducing characteristic so as to generate an a posteriori probability of the post-substitution checking data; a second inverse substitution section performing inverse substitution of the second pseudo-random substitution on the a posteriori probability of the post-substitution checking data derived from the third a posteriori probability decoding section so as to generate a priori information regarding the checking data, and outputting the generated a priori information regarding the checking data to the second a posteriori probability decoding section; and a demodulation section receiving the a posteriori probability of the primary modulation data derived from the first a posteriori probability decoding section or the a posteriori probability of the post-substitution primary modulation data derived from the second a posteriori probability decoding section, and, upon receipt of the a posteriori probability of the primary modulation data, binarizing the a posteriori probability of the primary modulation data and then performing demodulation corresponding to the modulation so as to reconstruct the information data, whereas upon receipt of the a posteriori probability of the post-substitution primary modulation data, sequentially performing inverse substitution of the first pseudo-random substitution and binarization on the a posteriori probability of the post-substitution primary modulation data and then performing demodulation corresponding to the modulation so as to reconstruct the information data. The first and second a posteriori probability decoding sections performs iterative decoding while repeatedly delivering a priori information regarding the primary modulation data therebetween, and after the iterative decoding has been performed, the demodulation section performs demodulation processing so as to reconstruct the information data.

With this constitution, processings to be performed by the first a posteriori probability decoding section does not include demodulation processing for RLL modulation, which would require a considerably large amount of computation if soft decoding is adopted. This allows reduction of a computation amount in the iterative decoding repeated between the first and second a posteriori probability decoding sections. Further, constraints employed in decoding by the first a posteriori probability decoding section include the constraint concerning a recording and reproducing characteristic. Therefore, while the iterative decoding by the both first and second a posteriori probability decoding sections is performed, decoding in compliance with the constraint concerning the recording and reproducing characteristic is also iteratively performed. Thus, iterative decoding suitable for the recording medium is performed.

A priori information regarding the primary modulation data, which is iteratively delivered between the first and second a posteriori probability decoding sections is subjected to the first pseudo-random substitution and its inverse substitution. Thus, the iterative decoding carried out between the first and second a posteriori probability decoding sections can decrease the error rate. Moreover, the a priori information regarding checking data delivered from the third a posteriori probability decoding section to the second a posteriori probability decoding section is subjected to inverse substitution of the second pseudo-random substitution. Therefore, burst errors contained in the checking data outputted from the third a posteriori probability decoding section is decomposed into random errors. As a result, the error rate can be further reduced by the second a posteriori probability decoding section which generally has a higher capability in burst error correction than in random error correction. In addition, the third a posteriori probability decoding section does not iterate decoding processing, which reduces a computation amount accordingly.

Also, according to a fourth aspect of the present invention, there is provided a recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by sequentially performing pseudo-random substitution and systematic error-correcting coding on the primary modulation data to generate checking data, then performing the modulation on the checking data to generate secondary modulation data, and then performing the pre-coding on the secondary modulation data. The apparatus includes a reproduction section reproducing the primary channel data and the secondary channel data recorded on the recording medium and outputting reproduced data composed of primary reproduced data and secondary reproduced data; a communication channel value computing section computing a communication channel value representing a probability per bit in the reproduced data; a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data; a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section; a first substitution section performing the pseudo-random substitution on the extrinsic information regarding the primary modulation data derived from the first computing section to generate extrinsic information regarding post-substitution primary modulation data and outputting the information as a priori information regarding the post-substitution primary modulation data; a second a posteriori probability decoding section receiving a priori information regarding the checking data, and performing a posteriori probability decoding on the a priori information regarding the checking data and the a priori information regarding the post-substitution primary modulation data derived from the first substitution section in compliance with a constraint concerning systematic error-correcting codes to generate an a posteriori probability of the post-substitution primary modulation data and an a posteriori probability of the checking data; a second computing section computing extrinsic information regarding the post-substitution primary modulation data updated by the second a posteriori probability decoding section, based on the a priori information regarding the post-substitution primary modulation data derived from the first substitution section and the a posteriori probability of the post-substitution primary modulation data derived from the second a posteriori probability decoding section; a first inverse substitution section performing inverse substitution of the pseudo-random substitution on the extrinsic information regarding the post-substitution primary modulation data derived from the second computing section to generate extrinsic information regarding the primary modulation data and outputting the information as the priori information regarding the primary modulation data to the first a posteriori probability decoding section and the first computing section; a third a posteriori probability decoding section receiving a priori information regarding the checking data, and performing a posteriori probability decoding on the a priori information regarding the checking data and the communication channel value as to the secondary reproduced data derived from the communication channel value computing section in compliance with a constraint concerning modulation and constraints concerning pre-codes and a recording and reproducing characteristic so as to generate an a posteriori probability of the checking data; a third computing section receiving the a priori information regarding the checking data, and, based on the a priori information regarding the checking data and the a posteriori probability of the checking data derived from the third a posteriori probability decoding section, computing extrinsic information regarding the checking data updated by the third a posteriori probability decoding section, and outputting the extrinsic information as the priori information regarding the checking data to the second a posteriori probability decoding section; a fourth computing section computing extrinsic information regarding the checking data updated by the second a posteriori probability decoding section, based on the a priori information regarding the checking data derived from the second inverse substitution section and the a posteriori probability of the checking data derived from the second a posteriori probability decoding section; and a demodulation section receiving the a posteriori probability of the primary modulation data derived from the first a posteriori probability decoding section or the a posteriori probability of the post-substitution primary modulation data derived from the second a posteriori probability decoding section, and, upon receipt of the a posteriori probability of the primary modulation data, binarizing the a posteriori probability of the primary modulation data and then performing demodulation corresponding to the modulation so as to reconstruct the information data, whereas upon receipt of the a posteriori probability of the post-substitution primary modulation data, sequentially performing inverse substitution of the pseudo-random substitution and binarization on the a posteriori probability of the post-substitution primary modulation data and then performing demodulation corresponding to the modulation so as to reconstruct the information data. The first and second a posteriori probability decoding sections performs iterative decoding while repeatedly delivering a priori information regarding the primary modulation data therebetween, and the second and third a posteriori probability decoding sections also perform iterative decoding while repeatedly delivering a priori information regarding the checking data therebetween, and after both the iterative decodings have been performed, the demodulation section performs demodulation processing so as to reconstruct the information data.

With this constitution, processings to be performed by the first a posteriori probability decoding section does not include demodulation processing for RLL modulation, which would require a considerably large amount of computation if soft decoding is adopted. This allows reduction of a computation amount in the iterative decoding repeated between the first and second a posteriori probability decoding sections. Further, constraints employed in decoding by the first a posteriori probability decoding section include the constraint concerning a recording and reproducing characteristic. Therefore, while the iterative decoding by the both first and second a posteriori probability decoding sections is performed, decoding in compliance with the constraint concerning the recording and reproducing characteristic is also iteratively performed. Thus, iterative decoding suitable for the recording medium is performed.

A priori information regarding the primary modulation data, which is iteratively delivered between the first and second a posteriori probability decoding sections, is subjected to the first pseudo-random substitution and its inverse substitution. Thus, the iterative decoding carried out between the first and second a posteriori probability decoding sections, advantageously, allows reduction in the error rate. Further, a priori information regarding the checking data is iteratively delivered between the second and third a posteriori probability decoding sections. Thus, the iterative decoding carried out between the second and third a posteriori probability decoding sections reduces the error rate of the checking data. As a result, the reconstructed information data will have a reduced error rate.

Also, there is provided, according to a fifth aspect of the present invention, a recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by sequentially performing pseudo-random substitution and systematic error-correcting coding on the primary modulation data to generate checking data, then performing the modulation on the checking data to generate secondary modulation data, and then performing the pre-coding on the secondary modulation data. The apparatus includes a reproduction section reproducing the primary channel data and the secondary channel data recorded on the recording medium and outputting reproduced data composed of primary reproduced data and secondary reproduced data; a communication channel value computing section computing a communication channel value representing a probability per bit in the reproduced data; a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data; a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section; a first substitution section performing the pseudo-random substitution on the extrinsic information regarding the primary modulation data derived from the first computing section to generate extrinsic information regarding post-substitution primary modulation data and outputting the information as the priori information regarding the post-substitution primary modulation data; a second a posteriori probability decoding section receiving a priori information regarding the checking data, and performing a posteriori probability decoding on the a priori information regarding the checking data and the a priori information regarding the post-substitution primary modulation data derived from the first substitution section in compliance with a constraint concerning systematic error-correcting codes to generate an a posteriori probability of the post-substitution primary modulation data; a second computing section computing extrinsic information regarding the post-substitution primary modulation data updated by the second a posteriori probability decoding section, based on the a priori information regarding the post-substitution primary modulation data derived from the first substitution section and the a posteriori probability of the post-substitution primary modulation data derived from the second a posteriori probability decoding section; a first inverse substitution section performing inverse substitution of the pseudo-random substitution on the extrinsic information regarding the post-substitution primary modulation data derived from the second computing section to generate extrinsic information regarding the primary modulation data and outputting the information as the priori information regarding the primary modulation data to the first a posteriori probability decoding section and the first computing section; a third a posteriori probability decoding section performing a posteriori probability decoding on the communication channel value as to the secondary reproduced data derived from the communication channel value computing section in compliance with a constraint concerning modulation and constraints concerning pre-codes and a recording and reproducing characteristic so as to generate an a posteriori probability of the checking data, and outputting this a posteriori probability as the priori information regarding the checking data to the second a posteriori probability decoding section; and a demodulation section receiving the a posteriori probability of the primary modulation data derived from the first a posteriori probability decoding section or the a posteriori probability of the post-substitution primary modulation data derived from the second a posteriori probability decoding section, and, upon receipt of the a posteriori probability of the primary modulation data, binarizing the a posteriori probability of the primary modulation data and then performing demodulation corresponding to the modulation so as to reconstruct the information data, whereas upon receipt of the a posteriori probability of the post-substitution primary modulation data, sequentially performing inverse substitution of the pseudo-random substitution and binarization on the a posteriori probability of the post-substitution primary modulation data and then performing demodulation corresponding to the modulation so as to reconstruct the information data. The first and second a posteriori probability decoding sections performs iterative decoding while repeatedly delivering a priori information regarding the primary modulation data therebetween, and after the iterative decoding has been performed, the demodulation section performs demodulation processing so as to reconstruct the information data.

With this constitution, processings to be performed by the first a posteriori probability decoding section does not include demodulation processing for RLL modulation, which would require a considerably large amount of computation if soft decoding is adopted. This allows reduction of a computation amount in the iterative decoding repeated between the first and second a posteriori probability decoding sections. Further, constraints employed in decoding by the first a posteriori probability decoding section include the constraint concerning a recording and reproducing characteristic. Therefore, while the iterative decoding by the both first and second a posteriori probability decoding sections is performed, decoding in compliance with the constraint concerning the recording and reproducing characteristic is also iteratively performed. Thus, iterative decoding suitable for the recording medium is performed.

A priori information regarding the primary modulation data, which is iteratively delivered between the first and second a posteriori probability decoding sections, is subjected to the pseudo-random substitution and its inverse substitution. Thus, the iterative decoding carried out between the first and second a posteriori probability decoding sections advantageously allows further reduction in the error rate. In addition, the third a posteriori probability decoding section does not iterate decoding processing, which reduces a computation amount accordingly.

There is also provided, according to a sixth aspect of the present invention, a recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by performing systematic error-correcting coding on the primary modulation data to generate checking data, then performing the modulation on the checking data to generate secondary modulation data, and then performing the pre-coding on the secondary modulation data. The apparatus includes a reproduction section reproducing the primary channel data and the secondary channel data recorded on the recording medium and outputting reproduced data composed of primary reproduced data and secondary reproduced data; a communication channel value computing section computing a communication channel value representing a probability per bit in the reproduced data; a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data; a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section; a second a posteriori probability decoding section receiving a priori information regarding the checking data, and performing a posteriori probability decoding on the extrinsic information regarding the primary modulation data derived from the first computing section, which is used as a priori information regarding the primary modulation data, as well as on the a priori information regarding the checking data, in compliance with a constraint concerning systematic error-correcting codes to generate an a posteriori probability of the primary modulation data and an a posteriori probability of the checking data; a second computing section computing extrinsic information regarding the primary modulation data updated by the second a posteriori probability decoding section, based on the extrinsic information regarding the primary modulation data derived from the first computing section, which is used as a priori information regarding the primary modulation data, as well as based on the a posteriori probability of the primary modulation data derived from the second a posteriori probability decoding section, and outputting the computed extrinsic information as the a priori information regarding the primary modulation data to the first a posteriori probability decoding section and the first computing section; a third a posteriori probability decoding section receiving a priori information regarding the checking data, and performing a posteriori probability decoding on the a priori information regarding the checking data and the communication channel value as to the secondary reproduced data derived from the communication channel value computing section in compliance with a constraint concerning modulation and constraints concerning pre-codes and a recording and reproducing characteristic so as to generate an a posteriori probability of the checking data; a third computing section receiving the a priori information regarding the checking data, and, based on the a priori information regarding the checking data and the a posteriori probability of the checking data derived from the third a posteriori probability decoding section, computing extrinsic information regarding the checking data updated by the third a posteriori probability decoding section, and outputting the extrinsic information as a priori information regarding the checking data to the second a posteriori probability decoding section; a fourth computing section computing extrinsic information regarding the checking data updated by the second a posteriori probability decoding section, based on the a priori information regarding the checking data derived from the second inverse substitution section and the a posteriori probability of the checking data derived from the second a posteriori probability decoding section; and a demodulation section receiving the a posteriori probability of the primary modulation data derived from the first or second a posteriori probability decoding section, then binarizing the a posteriori probability of the primary modulation data, and then performing demodulation corresponding to the modulation so as to reconstruct the information data. The first and second a posteriori probability decoding sections performs iterative decoding while repeatedly delivering a priori information regarding the primary modulation data therebetween, and the second and third a posteriori probability decoding sections also perform iterative decoding while repeatedly delivering a priori information regarding the checking data therebetween, and after both the iterative decodings have been performed, the demodulation section performs demodulation processing so as to reconstruct the information data.

With this constitution, processings to be performed by the first a posteriori probability decoding section does not include demodulation processing for RLL modulation, which would require a considerably large amount of computation if soft decoding is adopted. This allows reduction of a computation amount in the iterative decoding repeated between the first and second a posteriori probability decoding sections. Further, constraints employed in decoding by the first a posteriori probability decoding section include the constraint concerning a recording and reproducing characteristic. Therefore, while the iterative decoding by the both first and second a posteriori probability decoding sections is performed, decoding in compliance with the constraint concerning the recording and reproducing characteristic is also iteratively performed. Thus, iterative decoding suitable for the recording medium is performed.

Further, a priori information regarding the primary modulation data is iteratively delivered between the first and second a posteriori probability decoding sections. Thus, the iterative decoding carried out between the first and second a posteriori probability decoding sections, advantageously, reduces the error rate of the primary modulation data. As a result, the reconstructed information data will have a reduced error rate. Similarly, a priori information regarding the checking data is iteratively delivered between the third and second a posteriori probability decoding sections. Thus, the iterative decoding carried out between the third and second a posteriori probability decoding sections reduces the error rate of the checking data. As a result, the reconstructed information data will have a reduced error rate.

Also, according to a seventh aspect of the present invention, there is provided a recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by performing systematic error-correcting coding on the primary modulation data to generate checking data, then performing the modulation on the checking data to generate secondary modulation data, and then performing the pre-coding on the secondary modulation data. The apparatus includes a reproduction section reproducing the primary channel data and the secondary channel data recorded on the recording medium and outputting reproduced data composed of primary reproduced data and secondary reproduced data; a communication channel value computing section computing a communication channel value representing a probability per bit in the reproduced data; a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data; a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section; a second a posteriori probability decoding section receiving a priori information regarding the checking data, and performing a posteriori probability decoding on the extrinsic information regarding the primary modulation data derived from the first computing section, which is used as a priori information regarding the primary modulation data, as well as on the a priori information regarding the checking data, in compliance with a constraint concerning systematic error-correcting codes to generate an a posteriori probability of the primary modulation data; a second computing section computing extrinsic information regarding the primary modulation data updated by the second a posteriori probability decoding section, based on the extrinsic information regarding the primary modulation data derived from the first computing section, which is used as a priori information regarding the primary modulation data, as well as based on the a posteriori probability of the primary modulation data derived from the second a posteriori probability decoding section, and outputting the computed extrinsic information as the a priori information regarding the primary modulation data to the first a posteriori probability decoding section and the first computing section; a third a posteriori probability decoding section performing a posteriori probability decoding on the communication channel value as to the secondary reproduced data derived from the communication channel value computing section in compliance with a constraint concerning modulation and constraints concerning pre-codes and a recording and reproducing characteristic so as to generate an a posteriori probability of the checking data, and outputting this a posteriori probability as the priori information regarding the checking data to the second a posteriori probability decoding section; and a demodulation section receiving the a posteriori probability of the primary modulation data derived from the first or second a posteriori probability decoding section, then binarizing the a posteriori probability of the primary modulation data, and then performing demodulation corresponding to the modulation so as to reconstruct the information data. The first and second a posteriori probability decoding sections performs iterative decoding while repeatedly delivering a priori information regarding the primary modulation data therebetween, and after the iterative decoding has been performed, the demodulation section performs demodulation processing so as to reconstruct the information data.

With this constitution, processings to be performed by the first a posteriori probability decoding section does not include demodulation processing for RLL modulation, which would require a considerably large amount of computation if soft decoding is adopted. This allows reduction of a computation amount in the iterative decoding repeated between the first and second a posteriori probability decoding sections. Further, constraints employed in decoding by the first a posteriori probability decoding section include the constraint concerning a recording and reproducing characteristic. Therefore, while the iterative decoding by the both first and second a posteriori probability decoding sections is performed, decoding in compliance with the constraint concerning the recording and reproducing characteristic is also iteratively performed. Thus, iterative decoding suitable for the recording medium is performed.

Further, a priori information regarding the primary modulation data is iteratively delivered between the first and second a posteriori probability decoding sections. Thus, the iterative decoding carried out between the first and second a posteriori probability decoding sections advantageously reduces the error rate. In addition, the third a posteriori probability decoding section does not iterate decoding processing, which reduces a computation amount accordingly.

In one embodiment, the recording and reproducing characteristic is a partial response ("PR") transfer characteristic, and the constraint concerning the recording and reproducing characteristic adopted by the first and the third a posteriori probability decoding sections is the PR transfer characteristic.

In this embodiment, the PR transfer characteristic is included in both constraints employed by the first a posteriori probability decoding section and constraints employed by the third a posteriori probability decoding section. This enables iterative decoding best adapted to reproduction of the recording medium, which improves an error rate reduction effect.

In one embodiment, the modulation is a run-length limited ("RLL") modulation, the constraint concerning channel data adopted by the first a posteriori probability decoding section is a RLL condition, and the constraint concerning modulation adopted by the third a posteriori probability decoding section is a correspondence rule between data before and after application of the RLL modulation.

In this embodiment, the RLL modulation is employed. This enables iterative decoding best adapted to reproduction of the recording medium, which improves an error rate reduction effect.

In one embodiment, the pre-coding comprises non-return-to-zero inverted (NRZI) conversion, the constraint concerning pre-codes adopted by the first a posteriori probability decoding section and the third a posteriori probability decoding section is a NRZI conversion rule.

In this embodiment, the NRZI conversion rule is employed for the pre-coding. This enables iterative decoding best adapted to reproduction of the recording medium, which improves an error rate reduction effect.

In one embodiment, the third a posteriori probability decoding section performs the a posteriori probability decoding based on a trellis diagram representing the constraint concerning the modulation and the constraints concerning the pre-codes and recording and reproducing characteristic.

According to this embodiment, a posteriori probability decoding of the a priori information regarding the post-substitution checking data and of the communication channel value as to the secondary reproduced data, is performed based on the trellis diagram representing the constraints concerning the modulation, the pre-codes, and the recording and reproducing characteristic. This enables a posteriori probability decoding in compliance with the constraints concerning the modulation, the pre-codes, and the recording and reproducing characteristic to be executed in simple processing.

In one embodiment, the third a posteriori probability decoding section includes secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and a checking data decoding means using the a posteriori probability of the secondary modulation data derived from the secondary modulation data decoding means as a priori information to perform a posteriori probability decoding on this a priori information regarding the secondary modulation data and the a priori information regarding the post-substitution checking data derived from the second substitution section in compliance with the constraint concerning the modulation so as to generate the a posteriori probability of the post-substitution checking data.

According to this embodiment, a posteriori probability decoding of the a priori information regarding the post-substitution checking data and of the communication channel value as to the secondary reproduced data, is performed separately for generation of an a posteriori probability of the secondary modulation data by the secondary modulation data decoding means and generation of an a posteriori probability of the post-substitution checking data by the checking data decoding means.

In one embodiment, the third a posteriori probability decoding section includes secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and a checking data decoding means using the a posteriori probability of the secondary modulation data derived from the secondary modulation data decoding means as a priori information to perform a posteriori probability decoding on this a priori information regarding the secondary modulation data and the a priori information regarding the checking data derived from the fourth calculating section in compliance with the constraint concerning the modulation so as to generate the a posteriori probability of the checking data.

According to this embodiment, a posteriori probability decoding of the a priori information regarding the checking data and of the communication channel value as to the secondary reproduced data, is performed separately for generation of an a posteriori probability of the secondary modulation data by the secondary modulation data decoding means and generation of an a posteriori probability of the checking data by the checking data decoding means.

In one embodiment, the third a posteriori probability decoding section includes secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and a checking data decoding means using the a posteriori probability of the secondary modulation data derived from the secondary modulation data decoding means as a priori information to perform a posteriori probability decoding on this a priori information regarding the secondary modulation data in compliance with the constraint concerning the modulation so as to generate the a posteriori probability of the post-substitution checking data.

According to this embodiment, a posteriori probability decoding of the communication channel value as to the secondary reproduced data is performed separately for generation of an a posteriori probability of the secondary modulation data by the secondary modulation data decoding means and generation of an a posteriori probability of the post-substitution checking data by the checking data decoding means.

In one embodiment, the third a posteriori probability decoding section includes secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and a checking data decoding means using the a posteriori probability of the secondary modulation data derived from the secondary modulation data decoding means as a priori information to perform a posteriori probability decoding on this a priori information regarding the secondary modulation data in compliance with the constraint concerning the modulation so as to generate the a posteriori probability of the checking data.

According to this embodiment, a posteriori probability decoding of the communication channel value as to the secondary reproduced data is performed separately for generation of an a posteriori probability of the secondary modulation data by the secondary modulation data decoding means and generation of an a posteriori probability of the post-substitution checking data by the checking data decoding means.

In one embodiment, the secondary modulation data decoding means performs the a posteriori probability decoding based on a trellis diagram representing the constraint concerning the channel data and the constraints concerning the pre-codes and the recording and reproducing characteristic.

According to this embodiment, a posteriori probability decoding of the communication channel value as to the secondary reproduced data is performed based on the trellis diagram representing the constraints concerning the channel data, the pre-codes, and the recording and reproducing characteristic. This enables a posteriori probability decoding in compliance with the constraints concerning the channel data, the pre-codes, and the recording and reproducing characteristic to be executed in simple processing.

In one embodiment, the checking data decoding means performs the a posteriori probability decoding based on one of a trellis diagram or a demodulation table representing the constraint concerning the modulation.

According to this embodiment, a posteriori probability decoding of the a priori information regarding the primary modulation data and the a priori information regarding the post-substitution checking data, a posteriori probability decoding of the a priori information regarding the primary modulation data and the a priori information regarding the checking data, or a posteriori probability decoding of the a priori information regarding the secondary modulation data is performed based on the trellis diagram or demodulation table representing the constraint concerning the modulation. This enables a posteriori probability decoding in compliance with the constraint concerning the modulation to be executed in simple processing.

In one embodiment, the systematic error-correcting coding is systematic convolutional coding, and the second a posteriori probability decoding section performs the a posteriori probability decoding in compliance with a constraint concerning systematic convolutional codes.

According to this embodiment, an extremely high error-correcting capability can be achieved in turbo decoding.

In one embodiment, the systematic error-correcting coding is turbo coding, and the second a posteriori probability decoding section performs the a posteriori probability decoding through turbo decoding corresponding to the turbo coding.

According to this embodiment, the systematic error-correcting coding itself is turbo coding. In response to this, decoding processing of error-correcting codes itself is turbo decoding. Therefore, in addition to the iterative decoding loop by the first and second a posteriori probability decoding sections and the iterative decoding loop by the third and second a posteriori probability decoding sections, a further iterative decoding loop is included, thereby contributing to further reduction of the error rate.

In one embodiment, the systematic error-correcting coding is low-density parity check ("LDPC") coding, and the second a posteriori probability decoding performs the a posteriori probability decoding through decoding corresponding to the LDPC coding.

According to this embodiment, with the decoding processing for the LDPC code and the turbo decoding processing in combination, the error rate of the information data reconstructed can be further reduced.

Furthermore, the present invention provides a method of decoding information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by performing at least systematic error-correcting coding on the primary modulation data to form checking data, then performing at least the modulation on the checking data to generate secondary modulation data, and then performing the pre-coding on the secondary modulation data. The method includes reproducing the primary channel data and the secondary channel data recorded on the recording medium to generate reproduced data; based on the reproduced data, iteratively performing a posteriori probability decoding in compliance with a constraint concerning channel data and constraints concerning pre-codes and a recording and reproducing characteristic as well as an a posteriori probability decoding in compliance with a constraint concerning systematic error-correcting codes, while repeatedly delivering and receiving a priori information regarding the primary modulation data, so as to obtain an a posteriori probability of the primary modulation data; and binarizing the obtained a posteriori probability of the primary modulation data and then performing demodulation corresponding to the modulation so as to reconstruct the information data.

With this constitution, in the iterative decoding of the a posteriori probability decoding in compliance with the constraints concerning channel data, pre-codes and a recording and reproducing characteristic and a posteriori probability decoding in compliance with the constraint concerning systematic error-correcting codes, there is no demodulation processing for RLL modulation, which processing would require a considerably large amount of computation if soft decoding is adopted. This allows reduction of a computation amount in the iterative decoding. Further, constraints to be employed in the iterative decoding includes the constraint concerning a recording and reproducing characteristic. Therefore, as both the a posteriori probability decodings are iteratively carried out, decoding in compliance with the constraint concerning the recording and reproducing characteristic is also iterated. Thus, iterative decoding suitable for the recording medium is performed.

A decoding processing program according to the present invention is configured such that a computer functions as the reproducing means, the iterative decoding means and the demodulation means of the recording medium reproducing apparatus of the present invention.

With this constitution, in the iterative decoding of the a posteriori probability decoding in compliance with the constraints concerning channel data, pre-codes and a recording and reproducing characteristic and a posteriori probability decoding in compliance with the constraint concerning systematic error-correcting codes, no demodulation processing for RLL modulation is performed. This allows reduction of a computation amount in the iterative decoding. Further, constraints to be employed in the iterative decoding includes the constraint concerning a recording and reproducing characteristic. Therefore, iterative decoding suitable for the recording medium is performed.

A program-recorded medium according to the present invention contains the decoding processing program according to the present invention.

With this constitution, the decoding processing program is read out and carried out by a computer to thereby achieve a reduced computation amount in the iterative decoding of the a posteriori probability decoding in compliance with the constraints concerning channel data, pre-codes and a recording and reproducing characteristic and a posteriori probability decoding in compliance with the constraint concerning systematic error-correcting codes. This allows reduction of a computation amount in the iterative decoding. Further, because constraints to be employed in the iterative decoding includes the constraint concerning a recording and reproducing characteristic, iterative decoding suitable for the recording medium is performed.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIGS. 6A and 6B are views showing correspondence tables, based on the trellis diagram shown in FIG. 5, defining the correspondence among the current state, input, output and the following state;

FIG. 9 is a view showing a correspondence table, based on the trellis diagram shown in FIG. 8, defining the correspondence among the current state, input, output and the following state;

DETAILED DESCRIPTION OF THE PREFERRED EMBODIMENTS

Hereinbelow, the present invention will be described in detail in conjunction with embodiments thereof illustrated in the accompanying drawings.

First Embodiment

Figure 1:
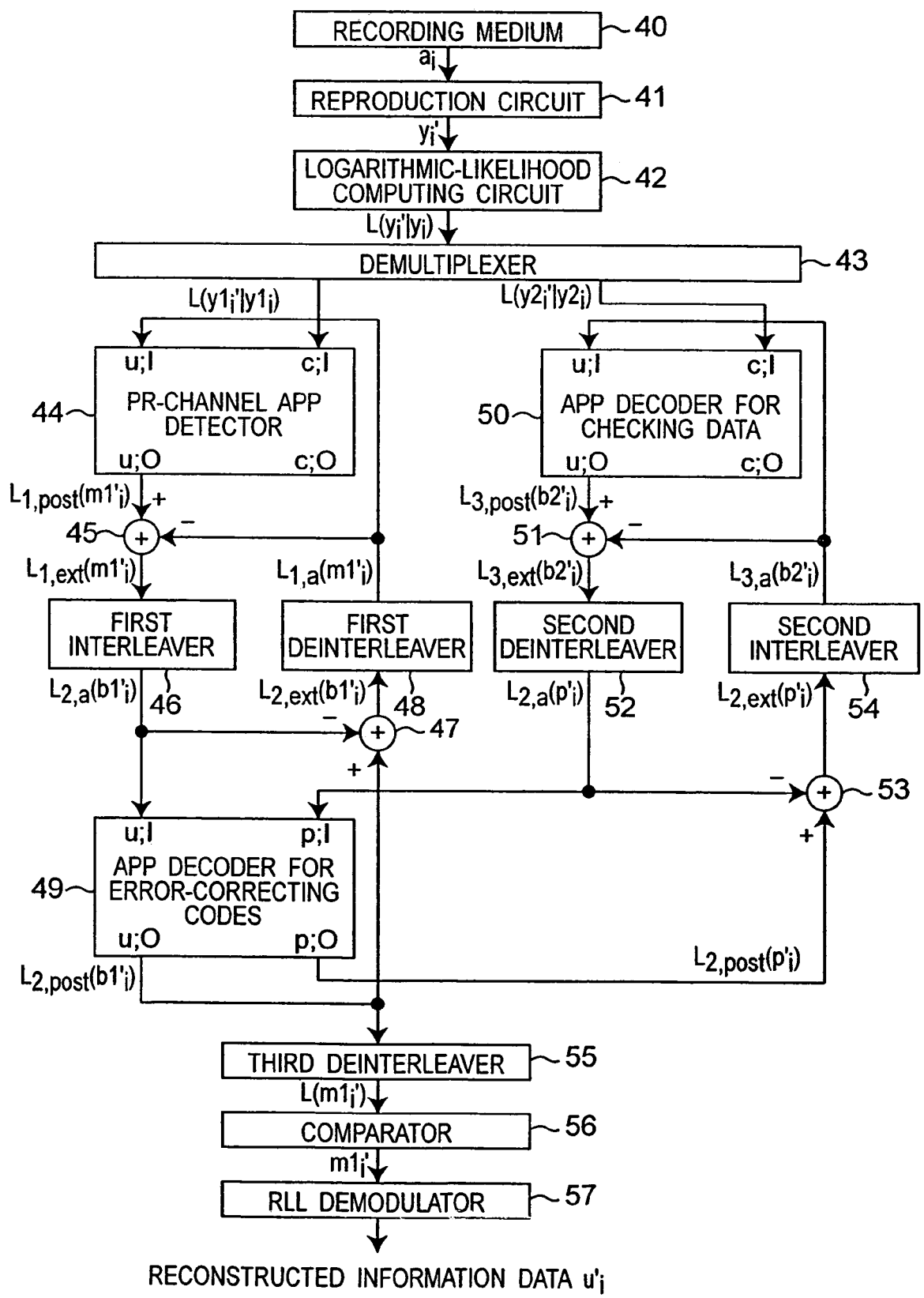
FIG. 1 is a block diagram showing a recording-medium reproducing apparatus in a first embodiment of the present invention.
Figure 2:
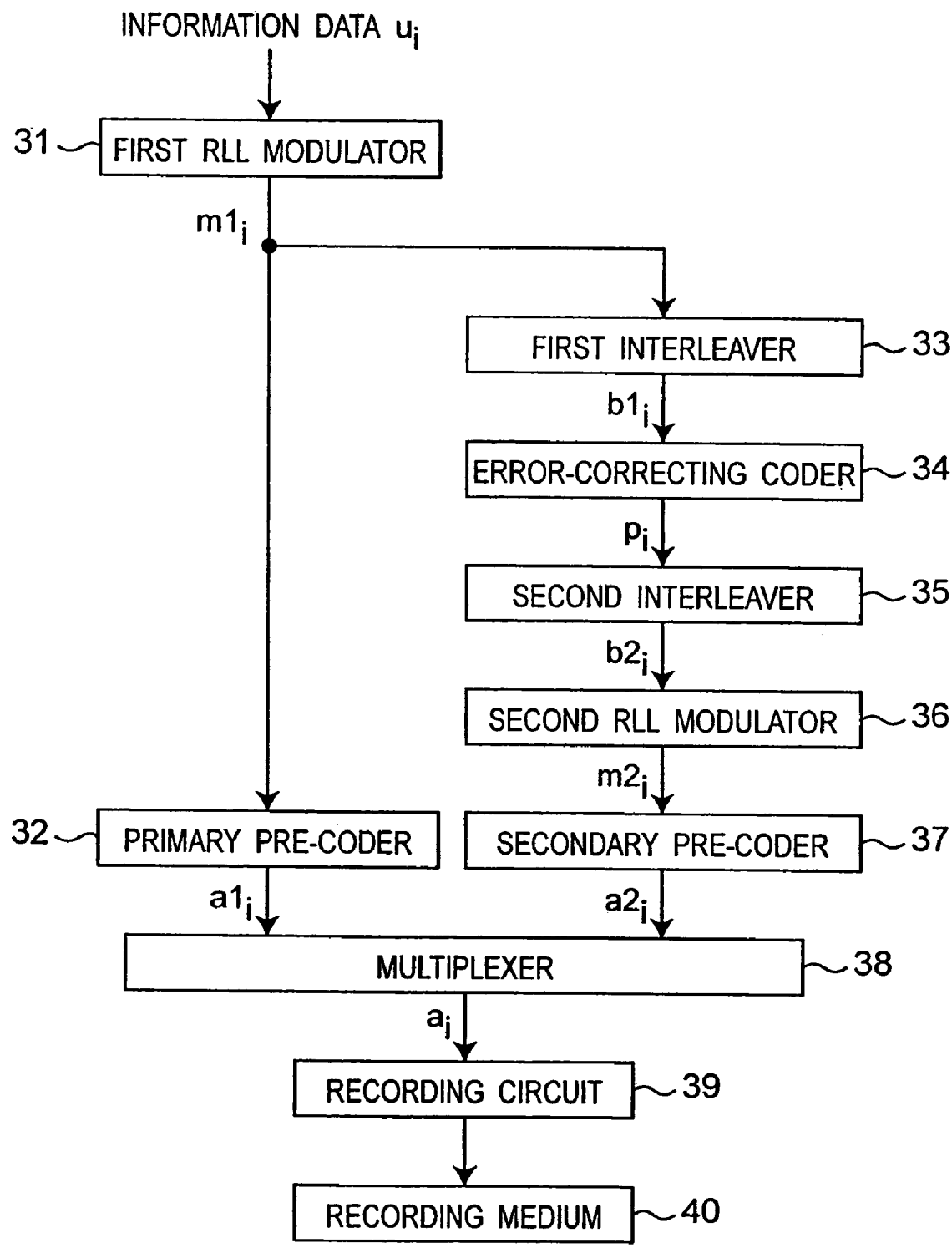
FIG. 2 is a block diagram showing a recording-medium recording apparatus for recording data that is reproduced by the recording-medium reproducing apparatus shown in FIG. 1.

FIG. 1 is a block diagram showing a recording-medium reproducing apparatus in this embodiment. FIG. 2 is a block diagram showing a recording-medium recording apparatus which records, on a recording medium, channel data $a_i$ reproduced by the recording-medium reproducing apparatus shown in FIG. 1. First, description will be given of the recording-medium recording apparatus.

In the recording-medium recording apparatus shown in FIG. 2, a first RLL modulator 31 performs RLL modulation on inputted information data $u_i$ and outputs primary modulation data $m1_i$. The primary modulation data $m1_i$ is then inputted into a primary pre-coder 32 and a first interleaver 33. The primary pre-coder 32 performs NRZI conversion on the inputted primary modulation data $m1_i$ to generate primary channel data $a1_i$, and outputs the data to a multiplexer 38. The first interleaver 33 performs pseudo-random substitution on the inputted primary modulation data $m1_i$ and outputs post-substitution primary modulation data $b1_i$. It is to be noted that pseudo-random substitution performed by the first interleaver 33 is hereinbelow referred to as first pseudo-random substitution.

An error-correcting coder 34 performs systematic error-correcting coding on the inputted post-substitution primary modulation data $b1_i$ and outputs checking data $p_i$. A second interleaver 35 performs pseudo-random substitution on the inputted checking data $p_i$ and outputs post-substitution checking data $b2_i$. It is to be noted that the pseudo-random substitution performed by the second interleaver 35 is hereinbelow referred to as second pseudo-random substitution. A second RLL modulator 36 performs RLL modulation on the inputted post-substitution checking data $b2_i$ and outputs secondary modulation data $m2_i$. A secondary pre-coder 37 performs NRZI conversion on the inputted secondary modulation data $m2_i$ to generate secondary channel data $a2_i$, and outputs the data to the multiplexer 38.

The multiplexer 38 multiplexes the primary channel data $a1_i$ inputted from the primary pre-coder 32 and the secondary channel data $a2_i$ inputted from the secondary pre-coder 37 and outputs channel data $a_i$. The channel data $a_i$ outputted in this way are recorded on a recording medium 40 by a recording circuit 39. At this point, the recording circuit 39 implements recording by magnetic recording, magneto-optical recording, optical recording or the like. Thus, this recording-medium recording apparatus performs both turbo coding and RLL modulation.

Description is now given of the recording-medium reproducing apparatus shown in FIG. 1. A reproduction circuit 41 serving as the reproduction section reproduces channel data recorded on the recording medium 40, and outputs reproduced data $y'_i$. The recording circuit 39, the recording medium 40 and the reproduction circuit 41, which constitute a PR channel, have a property that adjacent channel data $a_i$ interfere with each other. Due to this, intersymbol interference has occurred to the reproduced data $y'_i$. Moreover, the reproduced data $y'_i$, when passing the PR channel, undergoes deformation such as noise addition, band limiting or crosstalk. Therefore, errors are attached to the reproduced data $y'_i$.

A logarithmic-likelihood computing circuit 42 serving as the communication channel value computing section computes a logarithmic likelihood based on the inputted reproduced data $y'_i$, and outputs the logarithmic likelihood $L(y'_i|y_i)$ of the reproduced data $y'_i$. This logarithmic likelihood $L(y'_i|y_i)$ is then inputted into a demultiplexer 43. The demultiplexer 43 demultiplexes the inputted logarithmic likelihood $L(y'_i|y_i)$ into a logarithmic likelihood $L(y1'_i|y1_i)$ of primary reproduced data that belongs to primary modulation data and a logarithmic likelihood $L(y2'_i|y2_i)$ of secondary reproduced data that belongs to secondary channel data, and outputs the logarithmic likelihood $L(y1'_i|y1_i)$ regarding primary reproduced data to a PR-channel APP detector 44 while outputting the logarithmic likelihood $L(y2'_i|y2_i)$ regarding secondary reproduced data to an APP decoder 50 for checking data.

In the PR-channel APP detector 44 serving as the first a posteriori probability decoding section, the logarithmic likelihood $L(y1'_i|y1_i)$ regarding primary reproduced data derived from the demultiplexer 43 is inputted into a code input terminal c;I of a first APP decoder 43 whereas later-described a priori information $L_{1,a}(m1'_i)$ regarding primary modulation data derived from a first deinterleaver 48 is inputted into an information input terminal u;I. Then, a posteriori probability decoding is executed in compliance with a constraint concerning channel data and constraints concerning pre-codes and a recording and reproducing characteristic, and an a posteriori probability $L_{1,post}(m1'_i)$ of primary modulation data is outputted from an information output terminal u;O. Herein, the constraint concerning channel data is equal to the aforementioned RLL condition concerning channel data. Moreover, the constraint concerning pre-codes is equal to a NRZI conversion rule. Further, the constraint concerning a recording and reproducing characteristic is equal to a PR transfer characteristic. The PR-channel APP detector 44 performs a posteriori probability decoding so as to satisfy all these three constraints. It is to be noted the code output terminal c;O from which the a posteriori probability of primary modulation data is outputted is not connected to any terminal.

Figures 3, 4:
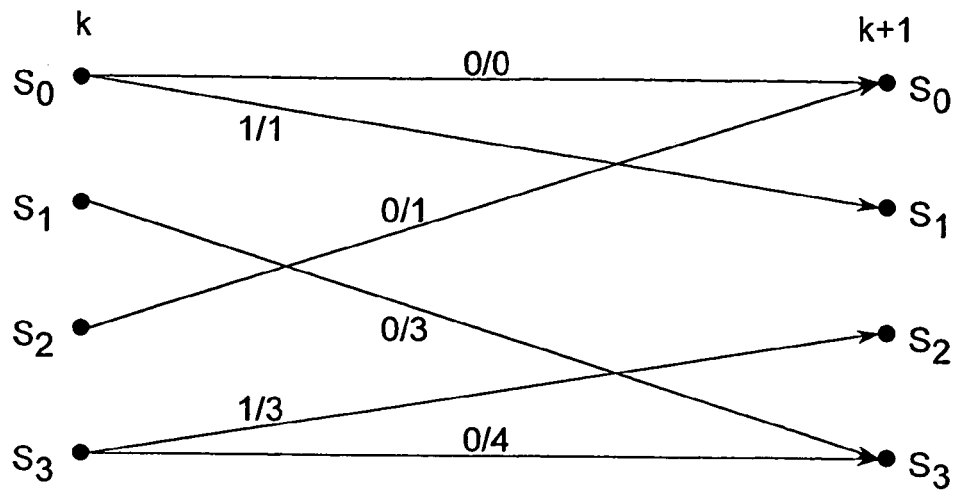
FIG. 3 is a trellis diagram showing constraints concerning channel data, pre-codes and a recording and reproducing characteristic.
FIG. 4 is a view showing a modulation table of (1, 7)RLL standardized by standard ECMA-195.

Meantime, the constraints concerning channel data, pre-codes and a recording and reproducing characteristic adopted for decoding by the PR-channel APP detector 44 can be expressed by a trellis diagram. FIG. 3 is a trellis diagram showing the constraints concerning channel data, pre-codes and a recording and reproducing characteristic. In this trellis diagram, the recording and reproducing characteristic is a PR transfer characteristic (1, 2, 1), and the minimum run length limit (d=1) is a constraint concerning channel data. Moreover, the NRZI conversion rule is defined by the following equation:

$$m_i = a_i \text{ xor } a_{i-1} \quad (1)$$

where "xor" represents an exclusive logical add operator. More specifically, if adjacent channel data $a_i$ and $a_{i-1}$ are different in polarity, then modulation data $m'_i$ becomes "1", whereas they are same in polarity, then modulation data m'i becomes "0". In the trellis diagram shown in FIG. 3, there are four internal states, $S_0$, $S_1$, $S_2$, and $S_3$. Moreover, $m_i$ in $m_i/y_i$ given to each transition branch represents modulation data, whereas $y_i$ represents an ideal reproduced data. It is to be noted that the meaning of the term "ideal" is clarified later. It is indicated that if, for example, the internal state at a point k is $S_0$ and the reproduced data $y_i$ is "0", then "0" is outputted as modulation data as a result of decoding, and the next internal state at a point (k+1) is $S_0$.

The reproduced data $y_i$ in the case of the PR transfer characteristic (1, 2, 1) is defined by the following equation (2):

$$y_i = a_i + 2 \cdot a_{i-1} + a_{i-2} \quad (2)$$

wherein the equation (2) defines a constraint concerning a recording and reproducing characteristic. Based on the constraint concerning the minimum run length limit (d=1), the reproduced data $y_i$ takes one of the four values, 0, 1, 3 and 4.

It is to be noted that the trellis diagram shown in FIG. 3 does not contain a constraint concerning the maximum run length limit (k=7). It is also possible to perform decoding based on a trellis diagram further containing this maximum run length limit. In such a case, the trellis diagram becomes complicated and a computing amount for decoding process is increased. However, an error rate can be further improved from the case in which the trellis diagram does not contain the maximum run length limit.

Moreover, in the PR-channel APP detector 44, logarithmic likelihood ratios are used for presenting probability values. For example, a logarithmic likelihood ratio $L(m1'_i)$ relating to the primary modulation data $m1'_i$ is defined by the following equation (3):

$$L(mI'_i) = \frac{P(mI'_i \mid mI_i = 1)}{P(mI'_i \mid mI_i = 0)} \quad (3)$$

wherein $P(m1'_i|m1_i=1)$ is a conditional probability at which reconstructed primary modulation data is $m1'_i$ when transmitted primary modulation data $m1'_i$ is 1, and similarly $P(m1'_i|m1_i=0)$ is a conditional probability at which reconstructed primary modulation data is $m1'_i$ when transmitted primary modulation data $m1'_i$ is 0. Further, as will be described later, logarithmic likelihoods are used to express probabilities of reproduced data $y'_i$.

Hereinbelow, detailed description will be given of the contents of computations by the logarithmic-likelihood computing circuit 42. Here, the contents of calculations by the logarithmic-likelihood computing circuit 42 will be described by taking an example of a PR transfer characteristic being (1,2,1). Generally, this computation is carried out on the assumption that the communication channel is a simple noise-addition source. That is, reproduced data $y'_i$ is defined by the following equation (4):

$$y'_i = y_i + n_i \quad (4)$$

where $y_i$ is an ideal reproduced signal that is not affected by the communication channel, and $n_i$ is noise. Here, the term "ideal" means that the signal, when passing the communication channel, never undergoes any deformation such as noise, band limiting, crosstalk or jitter. Therefore, ideal reproduced signals $y_i$ can be regarded as a signal sequence transmitted to a noise-adding communication channel. It is to be noted that $n_i$ represents error components added to the ideal reproduced signal $y_i$. Then, the logarithmic likelihood $L(y'_i|y_i)$ of the reproduced data $y'_i$ is defined as follows:

$$L(y'_i|y_i) = \ln[P(y'_i|y_i)] \quad (5)$$

where $P(y'_i|y_i)$ is a conditional probability of reception of the reproduced data $y'_i$ when ideal reproduced data $y'_i$ is transmitted, and "ln" represents a natural logarithmic function.

In this case, assuming that the communication channel is a white Gaussian channel, the conditional probability density at which $y'_i$ is received in the case of transmission of $y_i$ can be expressed as:

$$P(y'_i \mid y_i) = \frac{1}{\sigma_n \sqrt{2\pi}} \cdot \exp\left[-\frac{(y'_i - y_i)^2}{2\sigma_n^2}\right] \quad (6)$$

In the equation (6), $\sigma_n$ represents an effective amplitude (standard deviation) of the noise, and exp represents an exponential function.

As described before, the reproduced data $y_i$ takes one of the four values, 0, 1, 3 and 4. Therefore, from equations (5) and (6), the logarithmic-likelihood computing circuit 42 may well compute four logarithmic likelihoods $L(y'_i|y_i)$ according to equation (7):

$$L(y'_i|y_i) = (1/2\sigma_n^2)(2y_i y'_i - y_i^2) + \text{Const}_i \quad (7)$$

where $\text{Const}_i$, which is a constant value in four logarithmic likelihoods $L(y'_i|y_i)$, is determined so that a total of conditional probabilities $P(y'_i|y_i)$ at which four sets of reproduced data $y'_i$ are received becomes 1. However, since computation is performed in the PR-channel APP detector 44 so as to offset the constant $\text{Const}_i$, computation results of the PR-channel APP detector 44 remain unchanged even under the condition that constant $\text{Const}_i=0$. Accordingly, with constant $\text{Const}_i=0$, four logarithmic likelihoods $L(y'_i|y_i)$ can be specifically expressed as shown in equation (8):

$$L(y'_i|y_i=+4) = (1/\sigma_n^2)(4y'_i-8)$$

$$L(y'_i|y_i=+3) = (1/2\sigma_n^2)(6y'_i-9)$$

$$L(y'_i|y_i=+1) = (1/2\sigma_n^2)(2y'_i-1)$$

$$L(y'_i|y_i=0) = 0 \quad (8)$$

The logarithmic-likelihood computing circuit 42 has only to compute these four logarithmic likelihoods $L(y'_i|y_i)$.

A first subtracter 45 serving as the first computing section operates immediately after an a posteriori probability $L_{1,post}(m1'_i)$ of the primary modulation data $m1'_i$ is outputted from the PR-channel APP detector 44. The first subtracter 45 subtracts an output $L_{1,a}(m1'_i)$ of the later-described first interleaver 48 from the a posteriori probability $L_{1,post}(m1'_i)$ of the primary modulation data $m1'_i$, and outputs the subtraction result as $L_{1,ext}(m1'_i)$. That is, the first subtracter 45 calculates a difference between logarithmic-likelihood ratios of primary modulation data $m1'_i$ before and after updating by the PR-channel APP detector 44. This difference is called extrinsic information. A first interleaver 46 serving as the first substitution section performs the aforementioned pseudo-random substitution on the extrinsic information $L_{1,ext}(m1'_i)$ inputted from the first subtracter 45 to generate extrinsic information regarding post-substitution primary modulation data, and outputs the data as a priori information $L_{2,a}(b1'_i)$ regarding post-substitution primary modulation data.

In an APP decoder 49 for error-correcting codes serving as the second a posteriori probability decoding section, a priori information $L_{2,a}(b1'_i)$ regarding post-substitution primary modulation data derived from the first interleaver 46 is inputted into an information input terminal u;I, while a priori information $L_{2,a}(p'_i)$ regarding checking data derived from later-described second deinterleaver 52 is inputted into a checking input terminal p;I. The a priori information $L_{2,a}(p'_i)$, which is extrinsic information of checking data $p'_i$ updated by a later-described APP decoder 50 for checking data, is inputted into the APP decoder 49 for error-correcting codes as a priori information regarding checking data $p'_i$.

Then, the APP decoder 49 for error-correcting codes performs a posteriori probability decoding in compliance with the constraint concerning convolutional codes. Then, the second APP decoder 49 outputs an a posteriori probability $L_{2,post}(b1'_i)$ of post-substitution primary modulation data $b1'_i$ from an information output terminal u;O, while outputting an a posteriori probability $L_{2,post}(p'_i)$ of checking data $p'_i$ from a checking output terminal p;O. That is, the APP decoder 49 for error-correcting codes updates each likelihood in compliance with a constraint concerning convolutional codes.

Thus, the a posteriori probability $L_{2,post}(b1'_i)$ of post-substitution primary modulation data $b1'_i$ outputted from the information output terminal u;O of the APP decoder 49 for error-correcting codes is subjected to inverse substitution of the first pseudo-random substitution performed by a third deinterleaver 55 to be an logarithmic-likelihood ratio $L(m1'_i)$ relating to primary modulation data. A comparator 56 binarizes the inputted logarithmic-likelihood ratio $L(m1'_i)$ relating to primary modulation data and outputs reconstructed primary modulation data $m1'_i$. An RLL demodulator 57 performs demodulation for RLL modulation on the inputted reconstructed primary modulation data $m1'_i$, and outputs the data as reconstructed information data $u'_i$. More specifically, the third deinterleaver 55, the comparator 56 and the RLL demodulator 57 constitute the demodulation section. It is to be noted that the RLL modulation is equal to the RLL modulation performed by the first RLL modulator 31 in the recording-medium recording apparatus shown in FIG. 2.

It is to be noted that in this invention, the third deinterleaver 55 may be removed. In this case, the a posteriori probability $L_{1,post}(m1'_i)$ of primary modulation data outputted from the information output terminal u;O of the PR-channel APP detector 44 should be inputted to the comparator 56.

A second subtracter 47 serving as the second computing section operates immediately after the a posteriori probability $L_{2,post}(b1'_i)$ of post-substitution primary modulation data $b1'_i$ has been outputted from the APP decoder 49 for error-correcting codes. Then, the second subtracter 47, upon receiving inputs of the a priori information $L_{2,a}(b1'_i)$ regarding post-substitution primary modulation data $b1'_i$ derived from the first interleaver 46 and the a posteriori probability $L_{2,post}(b1'_i)$, subtracts the a priori information $L_{2,a}(b1'_i)$ from the a posteriori probability $L_{2,post}(b1'_i)$, and outputs a subtraction result $L_{2,ext}(b1'_i)$. That is, the second subtracter 47 calculates a difference between logarithmic-likelihood ratios regarding post-substitution primary modulation data $b1'_i$ before and after updating by the APP decoder 49 for error-correcting codes. It is to be noted that this difference is also called extrinsic information.

The first deinterleaver 48 serving as the first inverse substitution section performs the above-described inverse substitution of the first pseudo-random substitution on the extrinsic information $L_{2,ext}(b1'_i)$ derived from the second subtracter 47 to generate extrinsic information regarding primary modulation data $m1'_i$, and outputs the data as a priori information $L_{1,a}(m1'_i)$ regarding primary modulation data. The a priori information $L_{1,a}(m1'_i)$ outputted in this way is inputted to the first subtracter 45 and the information input terminal u;I of the PR-channel APP detector 44 as described above.

In this way, turbo decoding is performed by repeatedly delivering a priori information between the PR-channel APP detector 44 and the APP decoder 49 for error-correcting codes, allowing the reconstructed information data $u'_i$ to be reduced in errors. It is to be noted that at a first-time decoding operation, a zero is inputted to the information input terminal u;I of the PR-channel APP detector 44 as $L_{1,a}(m1'_i)$.

In the APP detector 50 for checking data serving as the third a posteriori probability decoding section, a logarithmic likelihood $L(y2'_i|y2_i)$ regarding secondary reproduced data is inputted into a code input terminal c;I, whereas a priori information $L_{3,a}(b2'_i)$ regarding post-substitution checking data derived from a later-described second interleaver 54 is inputted into an information input terminal u;I. Then, a posteriori probability decoding is executed in compliance with a constraint concerning modulation and constraints concerning pre-coding and a recording and reproducing characteristic, and an a posteriori probability $L_{3,post}(b2'_i)$ of post-substitution checking data is outputted from an information output terminal u;O. Herein, the constraint concerning modulation is equal to the constraint concerning RLL modulation. The RLL modulation is equal to the RLL modulation performed by the second RLL modulator 36 in the recording-medium recording apparatus shown in FIG. 2. The details of the constraint concerning the RLL modulation will be described later. Moreover, the constraint concerning pre-coding is equal to a NRZI conversion rule. Further, the constraint concerning a recording and reproducing characteristic is equal to a PR transfer characteristic. The APP decoder 50 for checking data performs a posteriori probability decoding so as to satisfy all these three constraints. It is to be noted a code output terminal c;O from which the a posteriori probability of secondary reproduced data $y2'_i$ is outputted is not connected to any terminal.

A third subtracter 51 serving as the third computing section operates immediately after the a posteriori probability $L_{3,post}(b2'_i)$ of post-substitution checking data has been outputted from the APP decoder 50 for checking data. Then, the third subtracter 51, upon receiving inputs of the a priori information $L_{3,a}(b2'_i)$ regarding post-substitution checking data derived from a later-described second interleaver 54 and the a posteriori probability $L_{3,post}(b2'_i)$, subtracts the a priori information $L_{3,a}(b2'_i)$ from the a posteriori probability $L_{3,post}(b2'_i)$, and outputs a subtraction result $L_{3,ext}(b2'_i)$. That is, the third subtracter 51 calculates a difference between logarithmic-likelihood ratios regarding post-substitution checking data b2'$_i$ before and after updating by the APP decoder 50 for checking data, i.e., extrinsic information.

The second deinterleaver 52 serving as the second inverse substitution section performs the above-described inverse substitution of the second pseudo-random substitution on the extrinsic information L$_{3,ext}$(b2'$_i$) regarding post-substitution checking data inputted from the third subtracter 51 to generate extrinsic information regarding checking data, and outputs the data as a priori information L$_{2,a}$(p'$_i$) regarding checking data. The a priori information L$_{2,a}$(p'$_i$) regarding checking data outputted in this way is inputted to a fourth subtracter 53 and the information input terminal p;I of the APP decoder 49 for error-correcting codes.

The fourth subtracter 53 serving as the fourth computing section operates immediately after the a posteriori probability L$_{2,post}$(p'$_i$) of checking data p'$_i$ has been outputted from the APP decoder 49 for error-correcting codes. Then, the fourth subtracter 53, upon receiving inputs of the a priori information L$_{2,a}$(p'$_i$) regarding checking data p'$_i$ derived from the second deinterleaver 52 and the a posteriori probability L$_{2,post}$(p'$_i$), subtracts the a priori information L$_{2,a}$(p'$_i$) from the a posteriori probability L$_{2,post}$(p'$_i$), and outputs a subtraction result L$_{2,ext}$(p'$_i$). That is, the fourth subtracter 53 calculates a difference between logarithmic-likelihood ratios regarding checking data before and after updating by the APP decoder 49 for error-correcting codes, i.e., extrinsic information.

The second interleaver 54 serving as the second substitution section performs the above-described second pseudo-random substitution on the extrinsic information L$_{2,ext}$(p'$_i$) regarding checking data derived from the fourth subtracter 53 to generate extrinsic information regarding post-substitution checking data, and outputs the data as a priori information L$_{3,a}$(b2'$_i$) regarding post-substitution checking data. The a priori information L$_{3,a}$(b2'$_i$) outputted in this way is inputted to the third subtracter 51 and the information input terminal u;I of the APP decoder 50 for checking data as described above.

In this way, turbo decoding is performed by repeatedly delivering the logarithmic-likelihood ratio relating to checking data between the APP decoder 50 for checking data and the APP decoder 49 for error-correcting codes, allowing the reconstructed information data u'$_i$ to be reduced in errors. It is to be noted that at a first-time decoding operation, a zero is inputted as L$_{3,a}$(b2'$_i$) to the information input terminal u;I of the APP decoder 50 for checking data.

Next, operation of the APP decoder 50 for checking data will be described concretely. FIG. 4 is a modulation table of (1, 7)RLL standardized by standard ECMA-195 of Standardizing Information and Communication Systems. In this case, the number m of bits of input data before modulation is 2 (m=2) and the number n of bits of modulation data after modulation is 3 (n=3). In the modulation table shown in FIG. 4, a "1" of modulation bits represents a polarity inversion of the reproduced signal, and a "0" of modulation bits represents an obtainment of the same polarity as the preceding bit (i.e., preceding-polarity holding). This modulation table allows the first RLL modulator 31 and the second RLL modulator 36 shown in FIG. 2 to compute three bits of modulation data by referring to two bits of input data before modulation and one bit of modulation data modulated immediately before.

The first RLL modulator 31 and the second RLL modulator 36 in the recording-medium recording apparatus shown in FIG. 2 are capable of sequentially receiving inputs of 2 bits of input data before modulation and, in response to this, sequentially outputting 3 bits of modulation data. In this case, values of the 3 bits of modulation data to be outputted are related not only to the 2 bits of current input data but to 2 bits of input data inputted immediately before and 1 bit of modulation data outputted immediately before. In other words, 3 bits of modulation data are constrained not only to 2 bits of current input data but also to 2 bits of past input data and 1 bit of modulation data. Accordingly, codes to be subjected to RLL (1, 7) modulation can be regarded as trellis codes.

Figure 5:
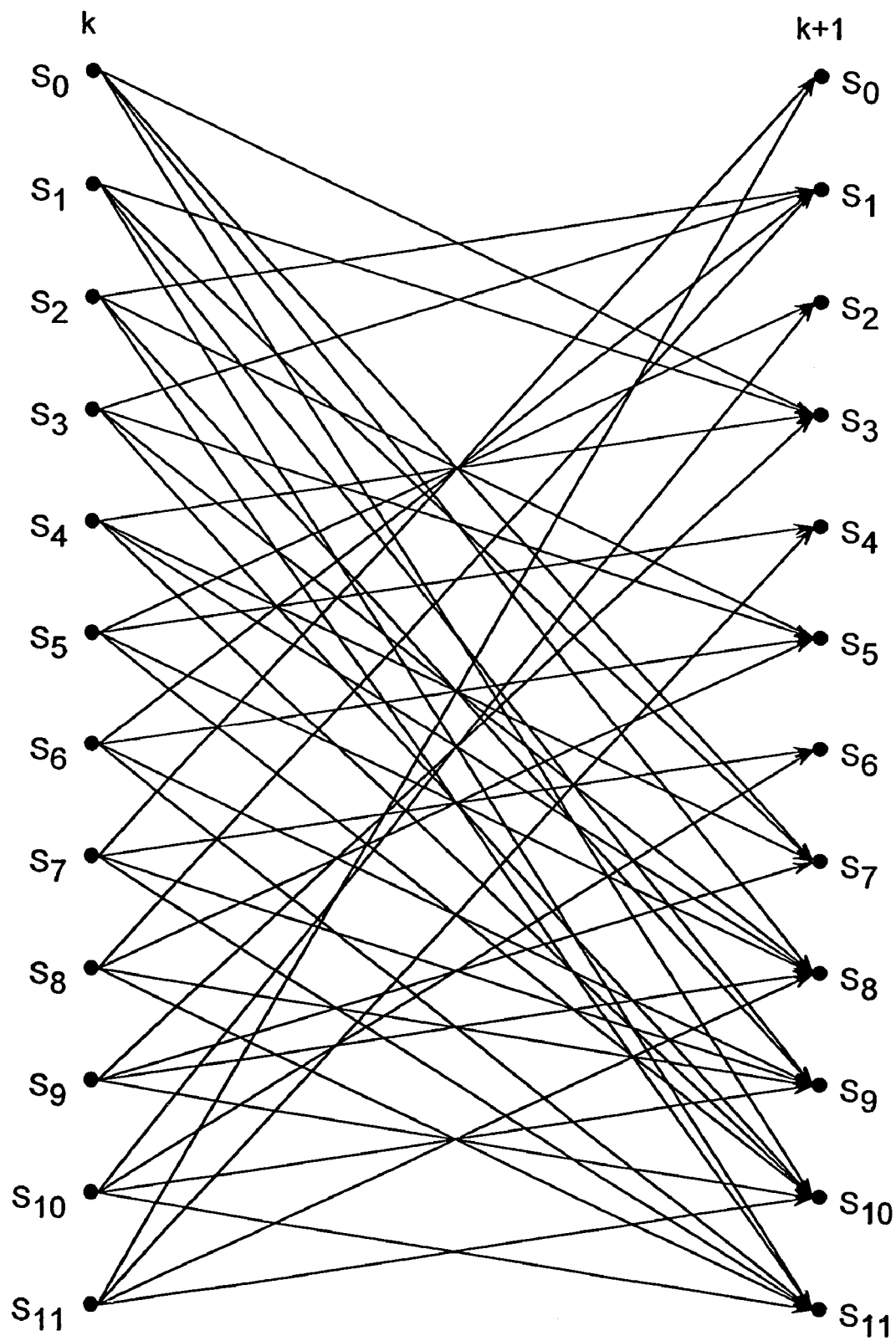
FIG. 5 is a trellis diagram showing constraints concerning modulation, pre-codes and a recording and reproducing characteristic.

FIG. 5 is a trellis diagram showing the constraints concerning modulation, pre-codes and a recording and reproducing characteristic. It is to be noted that a PR transfer characteristic is (1, 2, 1) in FIG. 5. FIGS. 6A and 6B show correspondence tables, based on the trellis diagram shown in FIG. 5, defining the correspondence among the current state, input, output and the following state. The input in these tables corresponds to the "succeeding input data" in the modulation table shown in FIG. 4. The output corresponds to the reproduced data y'$_i$. The trellis diagram shown in FIG. 5 has twelve kinds of internal states, S$_0$–S$_{11}$. In this case, a point "k" is updated on a basis of every 2 bits. At every advance of the point "k" by one, 2 bits of input data are sequentially subjected to (1, 7)RLL modulation and pre-coding, and then pass through the PR channel, and then 3 bits of reproduced data are outputted. For example, with the internal state being S$_{11}$ at the point "k," if the input 2 bits are (1,1), then the output 3 bits are (3,1,0), resulting in an internal state of S$_{10}$ at the succeeding point (k+1). Thus, the trellis diagram corresponds to constraints concerning modulation, pre-codes, and a recording and reproducing characteristic.

Accordingly, in this recording-medium reproducing apparatus, conversion tables shown in FIGS. 6A and 6B based on the trellis diagram are previously stored in a ROM or the like as the trellis diagram information. Then, the APP decoder 50 for checking data performs the APP decoding according to the conversion tables. It is to be noted that the PR transfer characteristic is not limited to (1,2,1), and the present embodiment is applicable with any PR transfer characteristic. What is needed is to create a trellis diagram according to the PR transfer characteristic and perform the APP decoding according to the created trellis diagram.

As described above, the recording-medium reproducing apparatus shown in FIG. 1 has two loops that perform turbo decoding. They are, a first loop in which a logarithmic-likelihood ratio regarding primary modulation data is repeatedly delivered between the PR-channel APP detector 44 and the APP decoder 49 for error-correcting codes, and a second loop in which a logarithmic-likelihood ratio regarding checking data is repeatedly delivered between the APP decoder 50 for checking data and the APP decoder 49 for error-correcting codes. By executing turbo decoding in these two loops simultaneously, errors in reconstructed information data u'$_i$ can be further decreased lower than those in the case of the turbo decoding executed in one loop, allowing enhanced recording density of the recording medium. Further, tolerances for recording media and tolerances for the recording-medium reproducing apparatus are allowed to be larger.

As described above, the recording-medium reproducing apparatus shown in FIG. 1 performs iterative decoding. However, RLL demodulation of primary modulation data m1'$_i$ is executed only once by the RLL demodulator 57 that is disposed outside the loop of iterative decoding of the primary modulation data. In this case, the RLL demodulator 57, upon receiving inputs of binarized primary modulation data m1'$_i$, performs a hard demodulation and outputs binarized information data u'$_i$. More specifically, the RLL demodulator 57 only has to perform a hard modulation involving a smaller computation amount outside the iterative decoding loop as to the primary modulation data, and therefore does not have to perform soft-decision modulation involving a larger computation amount. Therefore, compared to the case of the first background art, the RLL demodulator can be achieved with a simple circuit by employing the hard processing.

Figure 18:
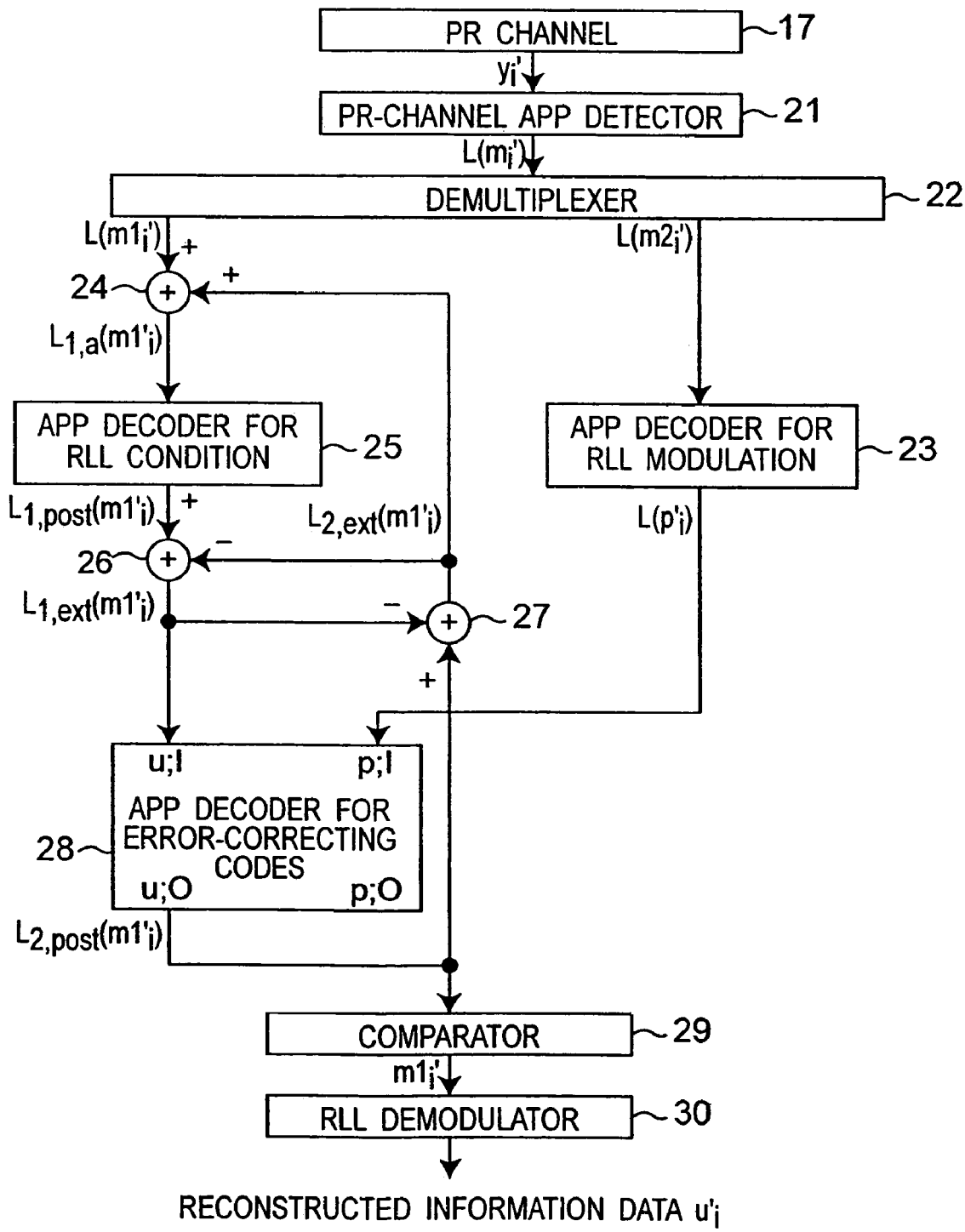
FIG. 18 is a block diagram showing a reproducing apparatus according to background art.
Figure 19:
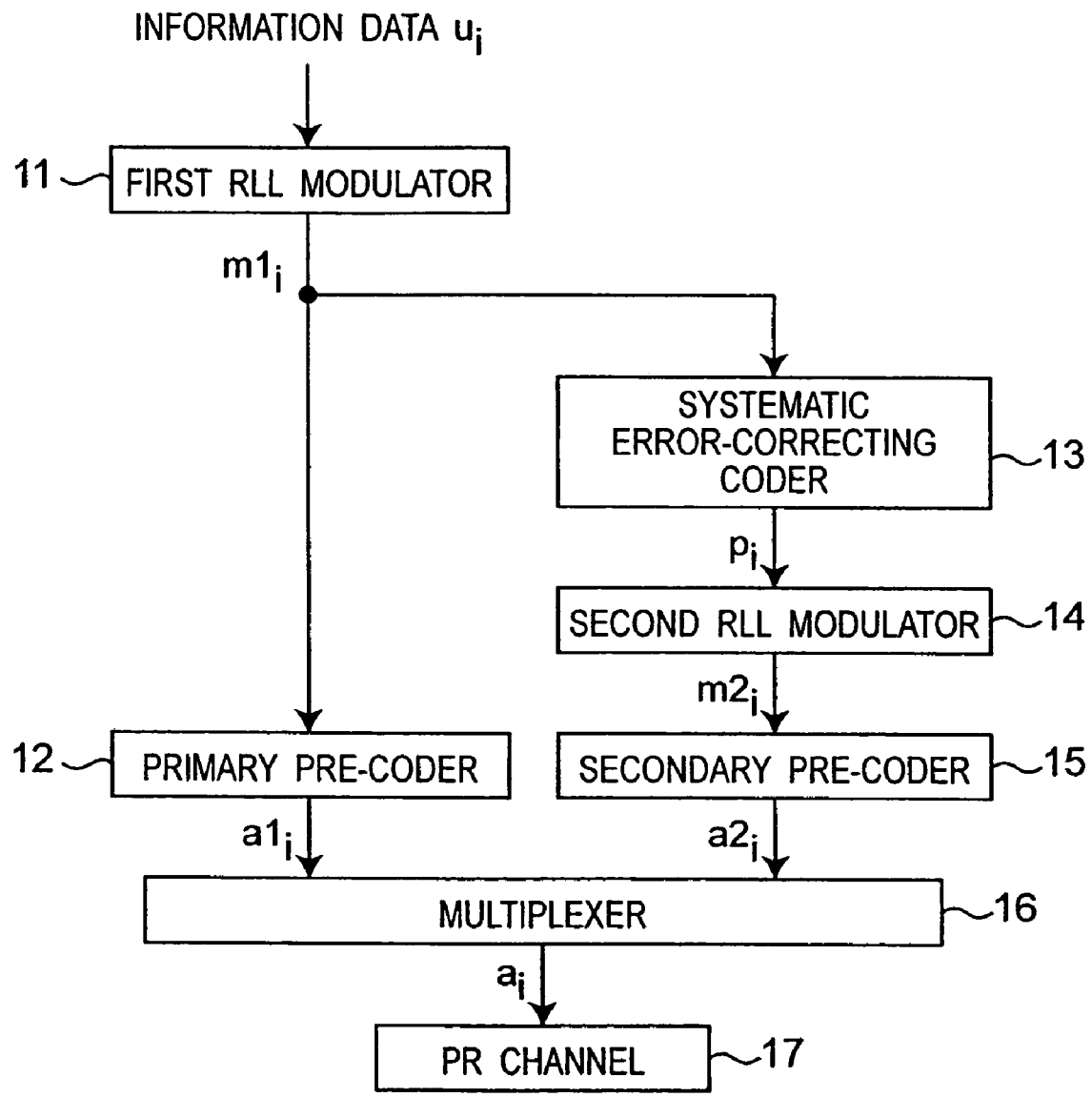
FIG. 19 is a block diagram showing a recording apparatus for recording channel data that is reproduced by the reproducing apparatus shown in FIG. 18.
Figure 20:
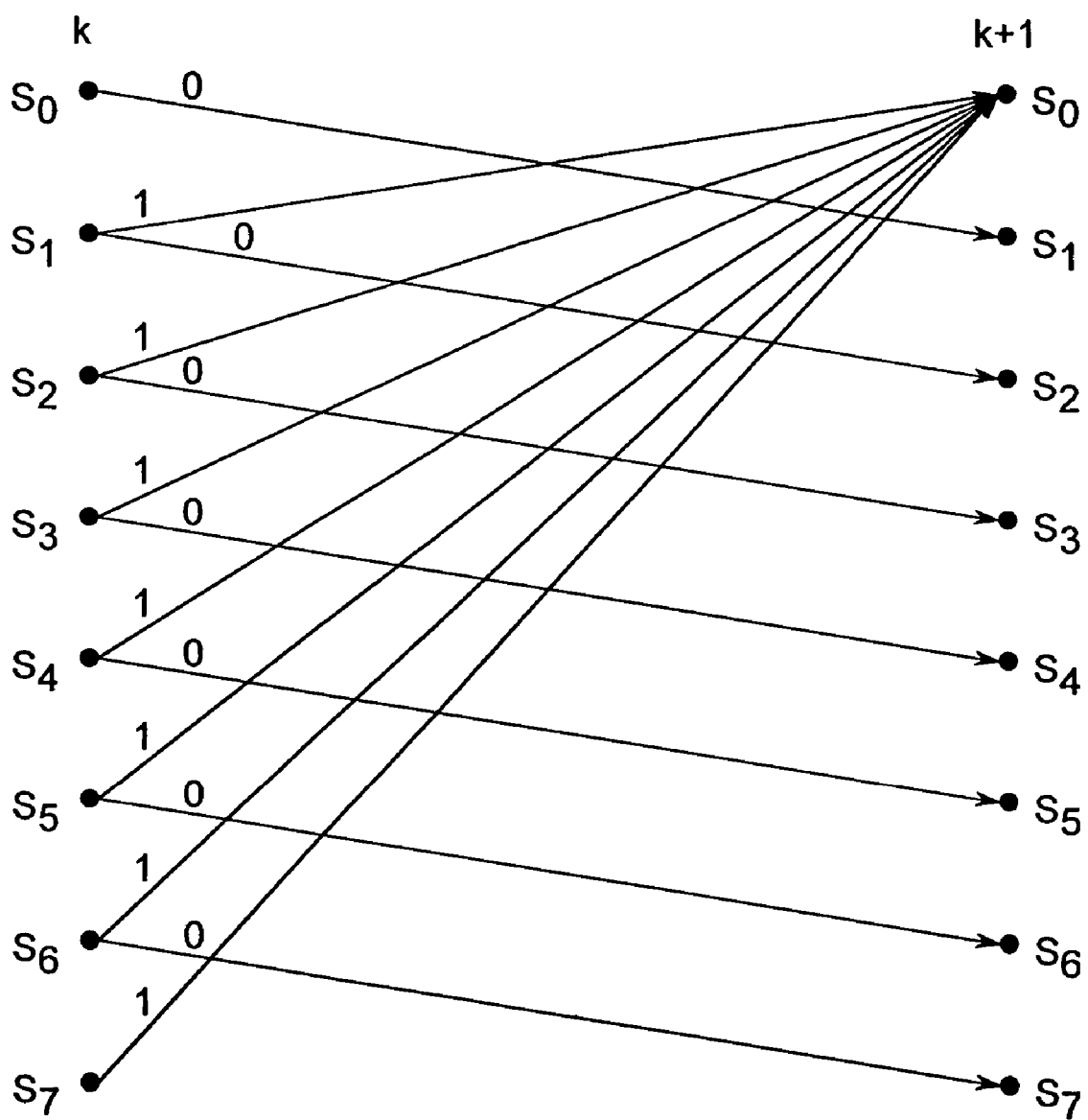
FIG. 20 is a trellis diagram showing the RLL condition in (1, 7)RLL modulation.

Further, in the aforementioned second background art, decoding in compliance with the constraint concerning the PR transfer characteristic is, as shown in FIG. 18, performed by the PR-channel APP detector 21 outside the turbo decoding loop. In the second background art, therefore, the decoding in compliance with the constraint concerning the PR transfer characteristic cannot be repeated iteratively. Contrary to this, in the recording-medium reproducing apparatus shown in FIG. 1, the decoding in compliance with the constraint concerning the PR transfer characteristic is performed by the PR-channel APP detector 44 that is within the first turbo decoding loop. This allows iterative decoding suitable for the recording medium. Thus, the recording-medium reproducing apparatus in the first embodiment can further enhance the error rate improvement effect by the turbo decoding compared to the case of the second background art.

Further, in the recording-medium reproducing apparatus shown in FIG. 1, a priori information regarding primary modulation data which is delivered through iterative repetition between the PR-channel APP detector 44 and the APP decoder 49 for error-correcting codes is subjected to the first pseudo-random substitution performed by the first interleaver 46 and the inverse substitution of the first pseudo-random substitution performed by the first deinterleaver 48. This allows further enhancement of the error rate improvement effect by the turbo decoding.

Further, a priori information regarding checking data which is delivered through iterative repetition between the APP decoder 49 for error-correcting codes and the APP decoder 50 for checking data is subjected to the second pseudo-random substitution performed by the second interleaver 54 and the inverse substitution of the second pseudo-random substitution performed by the second deinterleaver 52. This allows further enhancement of the error rate improvement effect by the turbo decoding.

Figure 7:
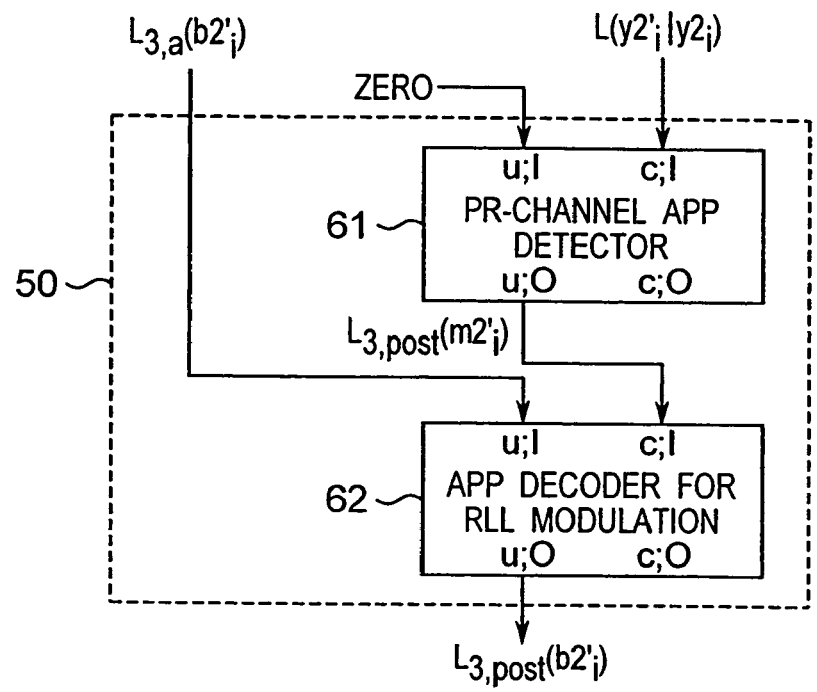
FIG. 7 is a block diagram showing another configuration of an APP decoder for checking data in FIG. 1.

FIG. 7 is a block diagram showing another configuration of the APP decoder 50 for checking data. In the APP decoder 50 for checking data, the decoding performed by the APP decoder 50 for checking data in FIG. 1 is divided so as to be performed by a PR-channel APP detector 61 and an APP decoder 62 for RLL modulation. In this case, in addition to the APP decoder 49 for error-correcting codes shown in FIG. 1, only the APP decoder 62 for RLL modulation performs the iterative decoding.

The PR-channel APP detector 61 is not included in an iterative decoding loop (the second loop) as described above. Consequently, a communication channel value $L(y2'_i|y2_i)$ regarding secondary channel data derived from the demultiplexer 43 shown in FIG. 1 is inputted into a code input terminal c;I, while a zero is always inputted into an information input terminal u;I. Then, in compliance with the constraints concerning channel data, pre-codes and a recording and reproducing characteristic, a posteriori probability decoding is performed, and an a posteriori probability $L_{3,post}(m2'_i)$ of secondary channel data is outputted from an information output terminal u;O. It is to be noted that a code output terminal c;O from which a logarithmic likelihood ratio relating to checking data is outputted is not connected to any terminal. Moreover, the a posteriori probability decoding in this case is performed based on the trellis diagram showing the constraints concerning channel data, pre-codes and a recording and reproducing characteristic shown in FIG. 3. Thus, the PR-channel APP detector 61 performs the same a posteriori probability decoding as with the case of the PR-channel APP detector 44.

In the APP decoder 62 for RLL modulation, a priori information $L_{3,a}(b2'_i)$ regarding post-substitution checking data derived from the second interleaver 54 in FIG. 1 is inputted into a information input terminal u;I, while a posteriori probability $L_{3,post}(m2'_i)$ of secondary channel data derived from the PR-channel APP detector 61 is inputted into a code input terminal c;I. Then, the APP decoder 62 for RLL modulation performs the RLL demodulation on the modulation data through execution of a posteriori probability decoding in compliance with a constraint concerning modulation, and outputs a posteriori probability $L_{3,post}(b2'_i)$ of post-substitution checking data from a information output terminal u;O. It is to be noted that a code output terminal c;O from which the a posteriori probability regarding secondary channel data is outputted is not connected to any terminal. More specifically, the APP decoder 62 for RLL modulation performs the RLL demodulation through soft decoding. The constraint concerning the RLL modulation in this case can be expressed as a trellis diagram as shown below.

Figure 8:
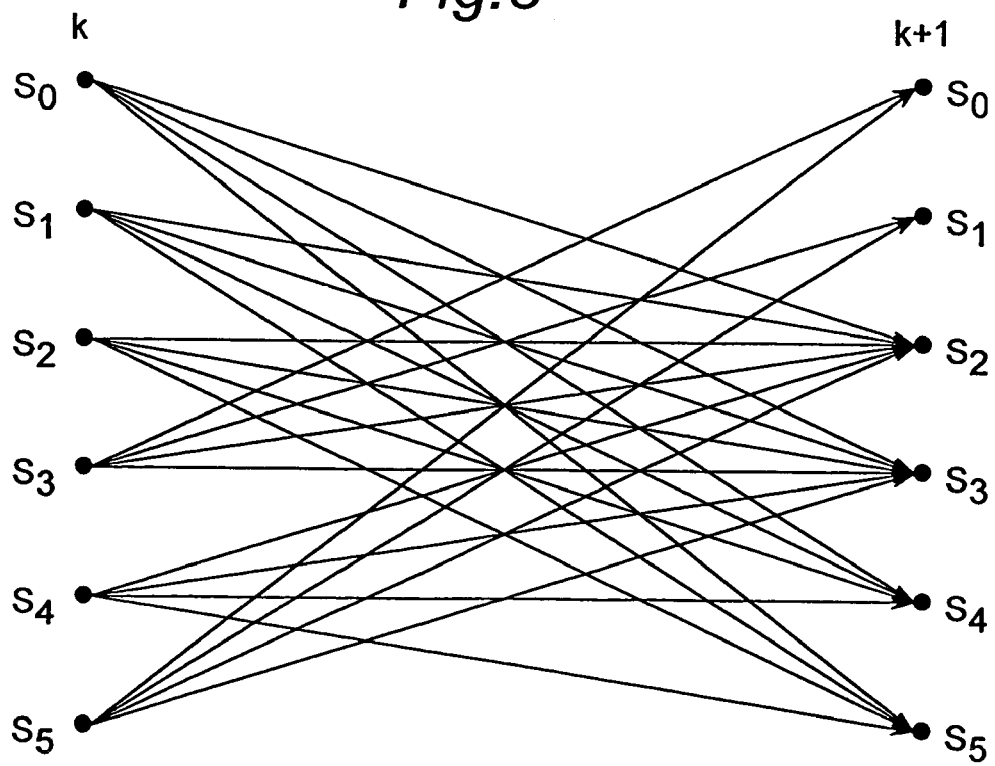
FIG. 8 is a trellis diagram showing a constraint concerning the (1, 7)RLL modulation shown in FIG. 4.

FIG. 8 is a trellis diagram showing the constraint concerning the RLL modulation. In this case, the RLL modulation method is a (1, 7)RLL modulation method shown in FIG. 4. FIG. 9 shows a correspondence table, based on the trellis diagram shown in FIG. 8, defining the correspondence among the current state, input, output and the following state. The input in this table corresponds to the "succeeding input data" in the modulation table shown in FIG. 4. The output corresponds to the modulation data shown in FIG. 4. The trellis diagram shown in FIG. 8 has six internal states, $S_0$–$S_5$. In this case, a point "k" is updated on a basis of every 2 bits. At every advance of the point "k" by one, 2 bits of input data are subjected to (1, 7)RLL modulation and 3 bits of modulation data are outputted. For example, with the internal state being $S_5$ at the point "k," if the input 2 bits are (1, 1), then the output 3 bits are (0, 0, 0), resulting in an internal state of $S_3$ at the succeeding point (k+1). Thus, the trellis diagram corresponds to the constraint concerning RLL modulation.

In the comparison between the trellis diagram shown in FIG. 5 adopted for the APP decoder 50 for checking data show in FIG. 1 and the trellis diagram shown in FIG. 8 adopted for the APP decoder 62 for RLL modulation shown in FIG. 7, it is clear that a computation amount in the processing by the APP decoder 62 for RLL modulation is smaller than a computation amount in the processing by the APP decoder 50 for checking data. For example, the number of states of the trellis codes is "12" in the trellis diagram shown in FIG. 5, whereas the number is dropped by half to "6" in the trellis diagram shown in FIG. 8. Similarly, the number of transition branches of the trellis codes is "48" in the trellis diagram shown in FIG. 5, whereas the number is dropped by half to "24" in the trellis diagram shown in FIG. 8. Therefore, it becomes possible to drastically reduce a computation amount of the iterative processing of turbo decoding in which a logarithmic likelihood ratio relating to checking data is repeatedly delivered between the APP decoder 62 for RLL modulation and the APP decoder 49 for error-correcting codes compared to the case of using the APP decoder 50 for checking data.

Second Embodiment

Figure 10:
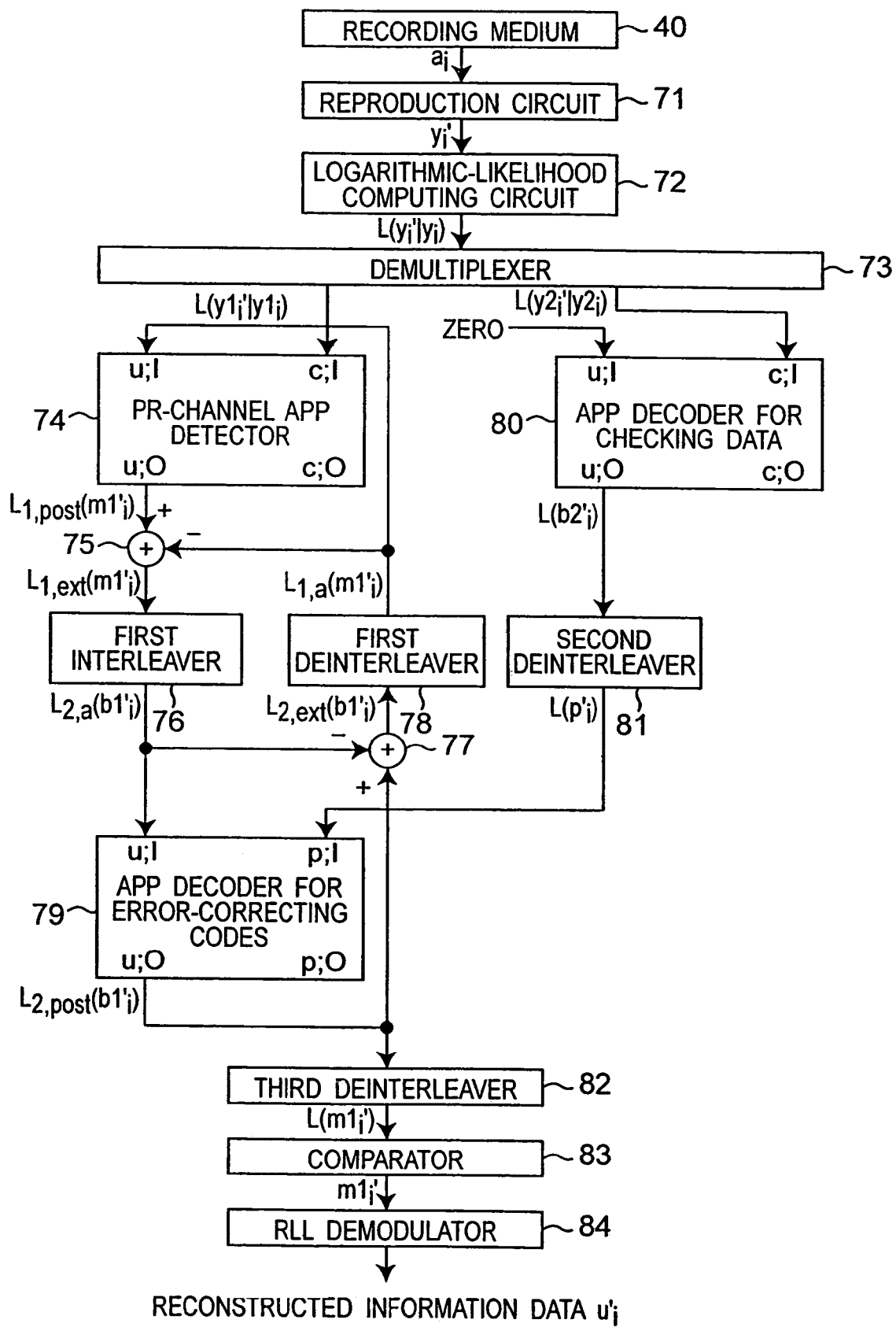
FIG. 10 is a block diagram showing a recording-medium reproducing apparatus in a second embodiment of the present invention.

FIG. 10 is a block diagram showing a recording-medium reproducing apparatus in this embodiment. As with the case of the recording-medium reproducing apparatus shown in FIG. 1, the recording-medium reproducing apparatus reproduces channel data $a_i$ recorded on a recording medium 40 by a recording-medium recording apparatus shown in FIG. 2. In FIG. 10, a reproduction circuit 71, a logarithmic likelihood ratio computing circuit 72, a demultiplexer 73, a PR-channel APP detector 74, a first subtracter 75, a first interleaver 76, a second subtracter 77, a first deinterleaver 78, a third deinterleaver 82, a comparator 83 and an RLL demodulator 84 have behaviors identical to the reproduction circuit 41, the logarithmic-likelihood computing circuit 42, the demultiplexer 43, the PR-channel APP detector 44, the first subtracter 45, the first interleaver 46, the second subtracter 47, the first deinterleaver 48, the third deinterleaver 55, the comparator 56 and the RLL demodulator 57 in the recording-medium reproducing apparatus shown in FIG. 1.

The recording-medium reproducing apparatus in this embodiment does not have equivalences of the third subtracter 51, the fourth subtracter 53 and the second interleaver 54 in the recording-medium reproducing apparatus in the first embodiment shown in FIG. 1. Moreover, a posteriori probability $L_{2,post}(p'_i)$ of checking data outputted from a checking output terminal p;O of an APP decoder 79 for error-correcting codes is not to be returned to an APP decoder 80 for checking data. Accordingly, a zero is always inputted into an information input terminal u;I of the APP decoder 80 for checking data. A logarithmic likelihood ratio $L(b2'_i)$ relating to post-substitution checking data derived from an information output terminal u;O of the APP decoder 80 for checking data is inputted into a second deinterleaver 81, where inverse substitution of the second pseudo-random substitution is performed to output a logarithmic-likelihood ratio $L(p'_i)$ relating to checking data. The logarithmic-likelihood ratio $L(p'_i)$ relating to checking data is inputted into a checking input terminal p;I of the APP decoder 79 for error-correcting codes.

Thus, the recording-medium reproducing apparatus in this embodiment has only one turbo decoding loop in which a logarithmic likelihood ratio relating to primary modulation data is repeatedly delivered between the PR-channel APP detector 74 and the APP decoder 79 for error-correcting codes. Executing the turbo decoding in this one loop enables errors in reconstructed information data $u'_i$ to be decreased. This allows enhanced recording density of the recording medium. Further, tolerances for recording media and tolerances for the recording-medium reproducing apparatus are allowed to be larger.

Moreover, when an a posteriori probability of checking data is delivered from the APP decoder 80 for checking data to the APP decoder 79 for error-correcting codes, inverse substitution of the second pseudo-random substitution is performed by the second deinterleaver 81. Therefore, burst errors contained in the post-substitution checking data outputted from the APP decoder 80 for checking data are decomposed into random errors by the second deinterleaver 81, and checking data containing these random errors is inputted into the APP decoder 79 for error-correcting codes. More precisely, the APP decoder 79 for error-correcting codes receives inputs of a priori information regarding checking data containing errors that are decomposed into random errors. Generally, the APP decoders for error-correcting codes have a higher capability in burst error correction than in random error correction. Therefore, according to this embodiment, the error improvement effect can be further enhanced.

Moreover, as described above, the recording-medium reproducing apparatus in this embodiment does not have an equivalence of the iterative decoding loop disposed between the APP decoder 50 for checking data and the APP decoder 49 for error-correcting codes in the recording-medium reproducing apparatus in the first embodiment shown in FIG. 1, in which a logarithmic likelihood ratio relating to checking data is repeatedly delivered. Therefore, compared to the recording-medium reproducing apparatus in the first embodiment, the recording-medium reproducing apparatus can be simplified.

Third Embodiment

Figure 11:
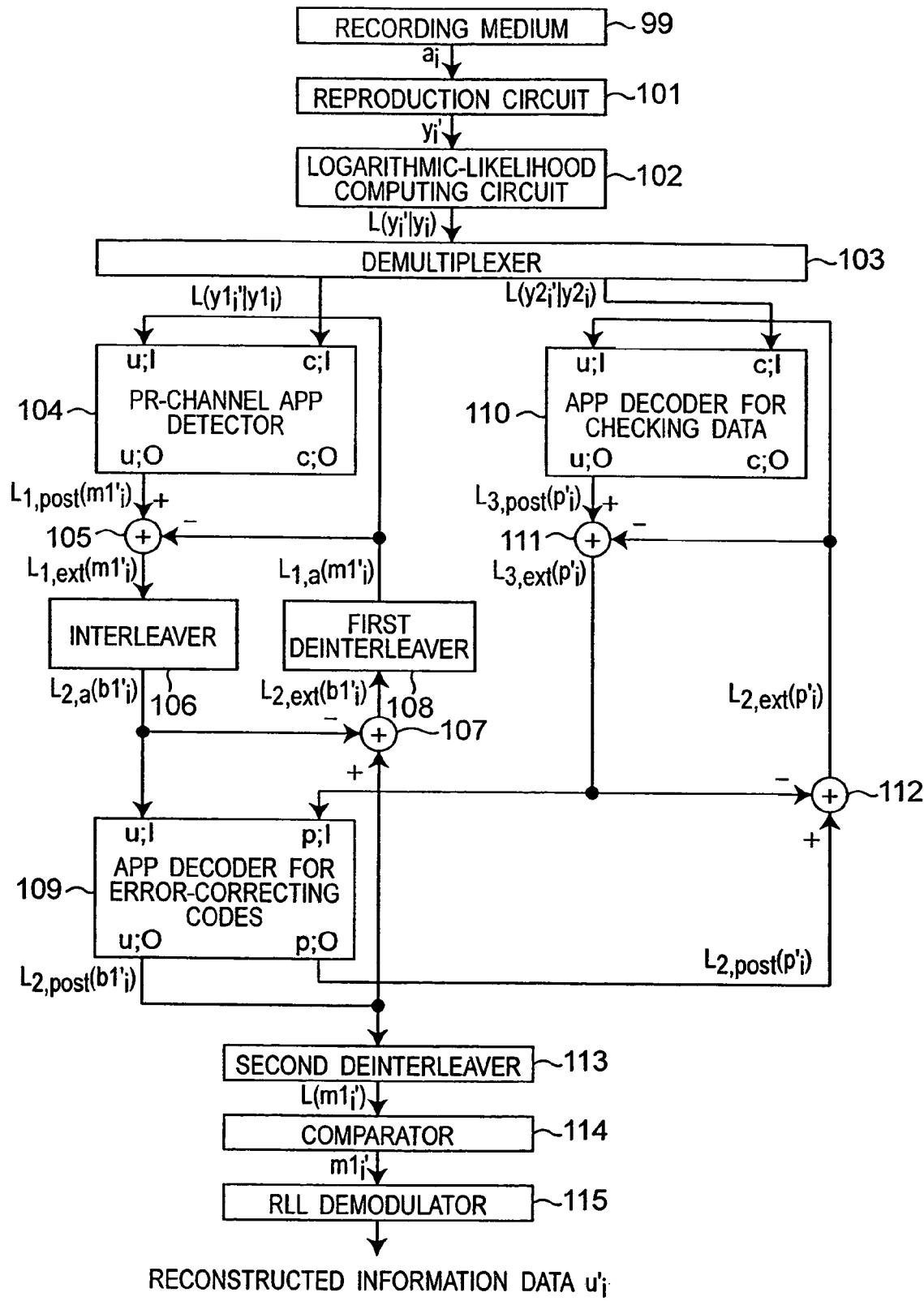
FIG. 11 is a block diagram showing a recording-medium reproducing apparatus in a third embodiment of the present invention.
Figure 12:
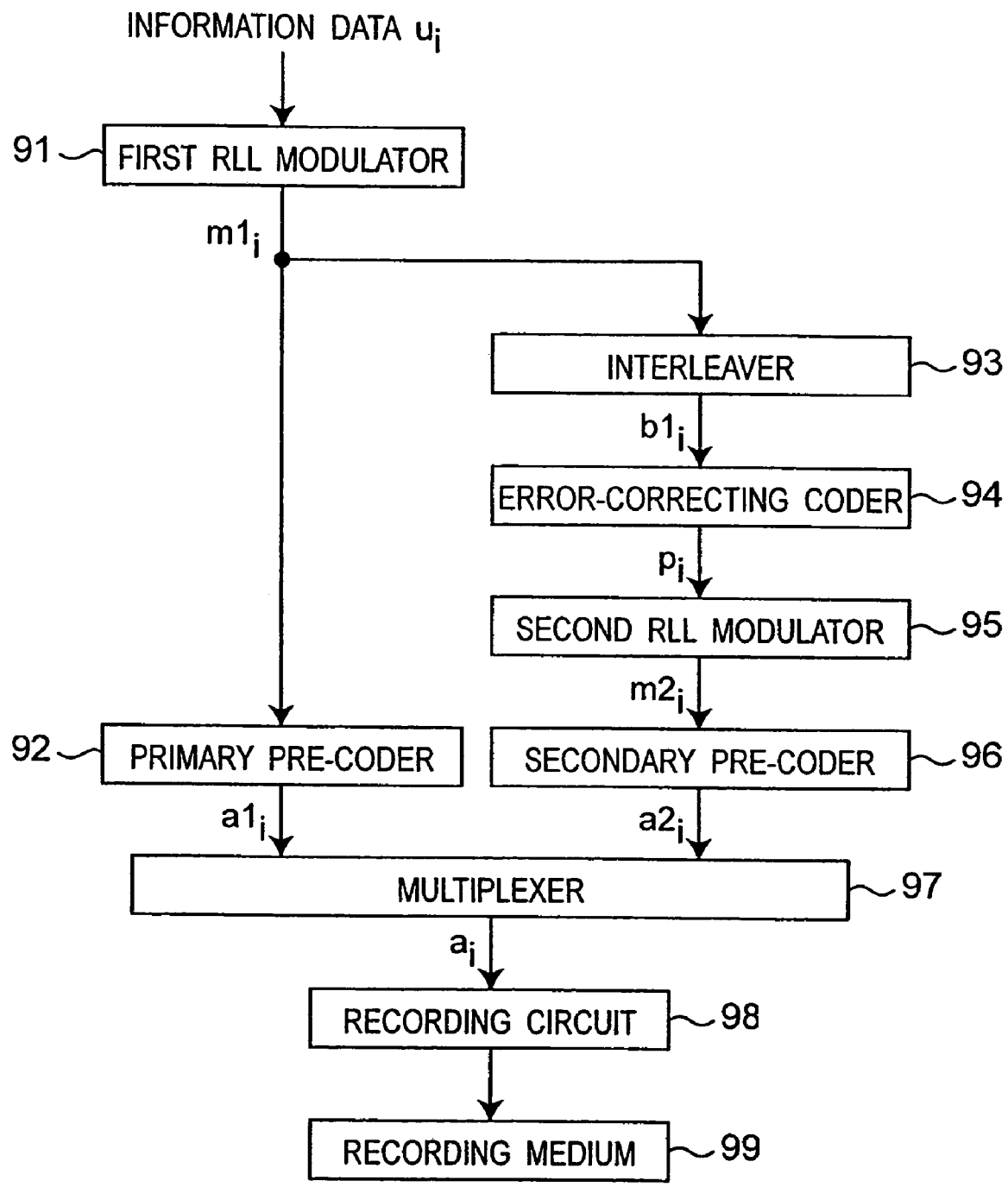
FIG. 12 is a block diagram showing a recording-medium recording apparatus different from that in FIG. 2.

FIG. 11 is a block diagram showing a recording-medium reproducing apparatus in a third embodiment. FIG. 12 is a block diagram of a recording-medium recording apparatus which records, on a recording medium, channel data $a_i$ reproduced by the recording-medium reproducing apparatus shown in FIG. 11. First, description will be given of the recording-medium recording apparatus.

In the recording-medium recording apparatus shown in FIG. 12, a first RLL modulator 91 performs RLL modulation on inputted information data $u_i$ and outputs primary modulation data $m1_i$. The primary modulation data $m1_i$ is then inputted into a primary pre-coder 92 and an interleaver 93. The primary pre-coder 92 performs NRZI conversion on the inputted primary modulation data $m1_i$ to generate primary channel data $a1_i$, and outputs the data to a multiplexer 97. The interleaver 93 performs pseudo-random substitution on the inputted primary modulation data $m1_i$ and outputs post-substitution primary modulation data $b1_i$.

An error-correcting coder 94 performs systematic error-correcting coding on the inputted post-substitution primary modulation data $b1_i$ and outputs checking data $p_i$. A second RLL modulator 95 performs RLL modulation on the inputted checking data $p_i$ and outputs secondary modulation data $m2_i$. A secondary pre-coder 96 performs NRZI conversion on the inputted secondary modulation data $m2_i$ to generate secondary channel data $a2_i$, and outputs the data to the multiplexer 97.

The multiplexer 97 multiplexes the primary channel data $a1_i$ inputted from the primary pre-coder 92 and the secondary channel data $a2_i$ inputted from the secondary pre-coder 96 and outputs channel data $a_i$. The channel data $a_i$ outputted in this way are recorded on a recording medium 99 by a recording circuit 98. At this point, the recording circuit 98 implements recording by magnetic recording, magneto-optical recording, optical recording or the like. Thus, this recording-medium recording apparatus performs both turbo coding and RLL modulation.

Description is now given of the recording-medium reproducing apparatus shown in FIG. 11. A reproduction circuit 101, a logarithmic likelihood ratio computing circuit 102, a demultiplexer 103, a PR-channel APP detector 104, a first subtracter 105, an interleaver 106, a second subtracter 107, a first deinterleaver 108, a second deinterleaver 113, a comparator 114 and an RLL demodulator 115 have behaviors identical to the reproduction circuit 41, the logarithmic-likelihood computing circuit 42, the demultiplexer 43, the PR-channel APP detector 44, the first subtracter 45, the first interleaver 46, the second subtracter 47, the first deinterleaver 48, the third deinterleaver 55, the comparator 56 and the RLL demodulator 57 in the recording-medium reproducing apparatus shown in FIG. 1. It is to be noted that the reproduction circuit 101 reproduces channel data stored on a recording medium 99 and outputs reproduced data y'$_i$.

The recording-medium reproducing apparatus in this embodiment does not have equivalences of the second deinterleaver 52 and the second interleaver 54 in the recording-medium reproducing apparatus in the first embodiment shown in FIG. 1. Moreover, a third subtracter 111 subtracts extrinsic information L$_{2,ext}$(p'$_i$) regarding checking data derived from a fourth subtracter 112 from an a posteriori probability L$_{3,post}$(p'$_i$) of checking data derived from an APP decoder 110 for checking data, and outputs a subtraction result L$_{3,ext}$(p'$_i$). Thus, the extrinsic information L$_{3,ext}$(p'$_i$) outputted in this way is inputted into the fourth subtracter 112 and an checking input terminal p;I of an APP decoder 109 for error-correcting codes. The APP decoder 109 for error-correcting codes operates exactly the same way as the APP decoder 49 for error-correcting codes, except the point that extrinsic information L$_{3,ext}$(p'$_i$) regarding checking data is inputted into the checking input terminal p;I. The fourth subtracter 112 subtracts the extrinsic information L$_{3,ext}$(p'$_i$) regarding checking data derived from the third subtracter 111 from an a posteriori probability L$_{2,post}$(p'$_i$) of checking data derived from the APP decoder 109 for error-correcting codes, and outputs a subtraction result L$_{2,ext}$(p'$_i$). Thus, the extrinsic information L$_{2,ext}$(p'$_i$) regarding checking data outputted in this way is inputted into the third subtracter 111 and an information input terminal u;I of an APP decoder 110 for checking data. The APP decoder 110 for checking data operates exactly the same way as the APP decoder 50 for checking data in the first embodiment, except the point that the extrinsic information L$_{2,ext}$(p'$_i$) regarding checking data is inputted into the information input terminal u;I.

As described above, the recording-medium reproducing apparatus in this embodiment does not have a second interleaver for performing second pseudo-random substitution on the checking data nor a second deinterleaver for performing inverse substitution thereof. Because of this, the configuration can be simplified compared to the recording-medium reproducing apparatus in the first embodiment shown in FIG. 1.

Moreover, there are two loops for turbo decoding. More specifically, they are, a first loop in which a logarithmic-likelihood ratio regarding primary modulation data is repeatedly delivered between the PR-channel APP detector 104 and the APP decoder 109 for error-correcting codes, and a second loop in which a logarithmic-likelihood ratio regarding checking data is repeatedly delivered between the APP decoder 110 for checking data and the APP decoder 109 for error-correcting codes. By executing turbo decoding in these two loops simultaneously, errors in reconstructed information data u'$_i$ can be further decreased lower than those in the case of the turbo decoding executed in one loop, allowing enhanced recording density of the recording medium. Further, tolerances for recording media and tolerances for the recording-medium reproducing apparatus are allowed to be larger.

Fourth Embodiment

Figure 13:
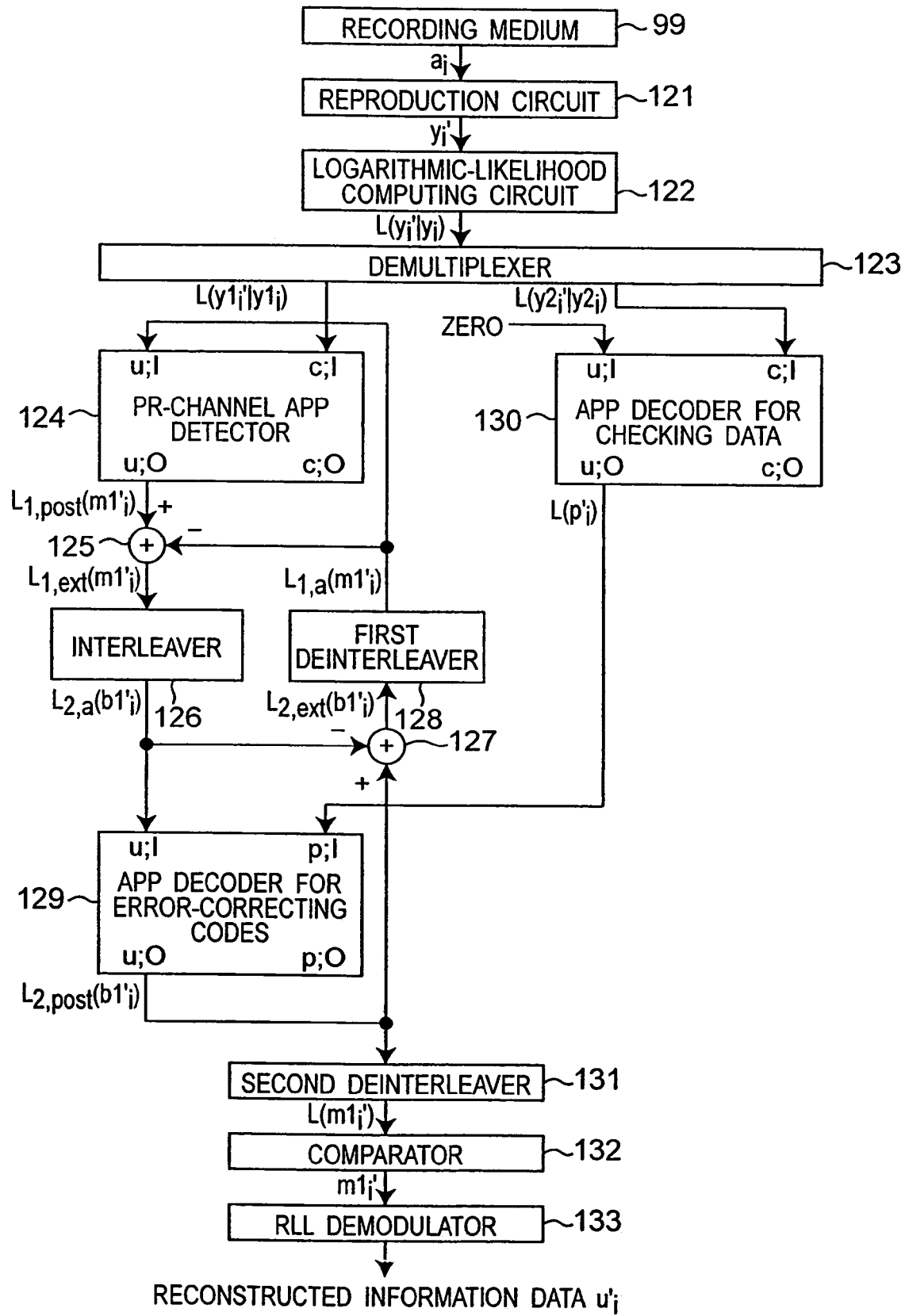
FIG. 13 is a block diagram showing a recording-medium reproducing apparatus in a fourth embodiment of the present invention.

FIG. 13 is a block diagram showing a recording-medium reproducing apparatus in this embodiment. As with the case of the recording-medium reproducing apparatus shown in FIG. 11, the recording-medium reproducing apparatus reproduces channel data a$_i$ recorded on a recording medium 99 by a recording-medium recording apparatus shown in FIG. 12. In FIG. 13, a reproduction circuit 121, a logarithmic likelihood ratio computing circuit 122, a demultiplexer 123, a PR-channel APP detector 124, a first subtracter 125, an interleaver 126, a second subtracter 127, a first deinterleaver 128, a second deinterleaver 131, a comparator 132 and an RLL demodulator 133 have behaviors identical to the reproduction circuit 101, the logarithmic-likelihood computing circuit 102, the demultiplexer 103, the PR-channel APP detector 104, the first subtracter 105, the interleaver 106, the second subtracter 107, the first deinterleaver 108, the second deinterleaver 113, the comparator 114 and the RLL demodulator 115 in the recording-medium reproducing apparatus in the third embodiment shown in FIG. 11.

The recording-medium reproducing apparatus in this embodiment does not have equivalences of the third subtracter 111 and the fourth subtracter 112 in the recording-medium reproducing apparatus in the third embodiment shown in FIG. 11. Moreover, a posteriori probability L$_{2,post}$ (p'$_i$) of checking data outputted from a checking output terminal p;O of an APP decoder 129 for error-correcting codes is not to be returned to an APP decoder 130 for checking data. Accordingly, a zero is always inputted into an information input terminal u;I of the APP decoder 130 for checking data, while a logarithmic likelihood ratio L(p'$_i$) relating to checking data outputted from an information output terminal u;O is inputted into a checking input terminal p;I of the APP decoder 129 for error-correcting codes.

Thus, the recording-medium reproducing apparatus in this embodiment has only one turbo decoding loop in which a logarithmic likelihood ratio relating to primary modulation data is repeatedly delivered between the PR-channel APP detector 124 and the APP decoder 129 for error-correcting codes. Executing the turbo decoding in this one loop enables errors in reconstructed information data u'$_i$ to be decreased. This allows enhanced recording density of the recording medium. Further, tolerances for recording media and tolerances for the recording-medium reproducing apparatus are allowed to be larger.

Further, as described above, the recording-medium reproducing apparatus in this embodiment does not have an equivalence of the iterative decoding loop disposed between the APP decoder 110 for checking data and the APP decoder 109 for error-correcting codes in the recording-medium reproducing apparatus in the third embodiment shown in FIG. 11, in which a logarithmic likelihood ratio relating to checking data is repeatedly delivered. Therefore, compared to the recording-medium reproducing apparatus in the third embodiment, the recording-medium reproducing apparatus can be simplified.

Fifth Embodiment

Figure 14:
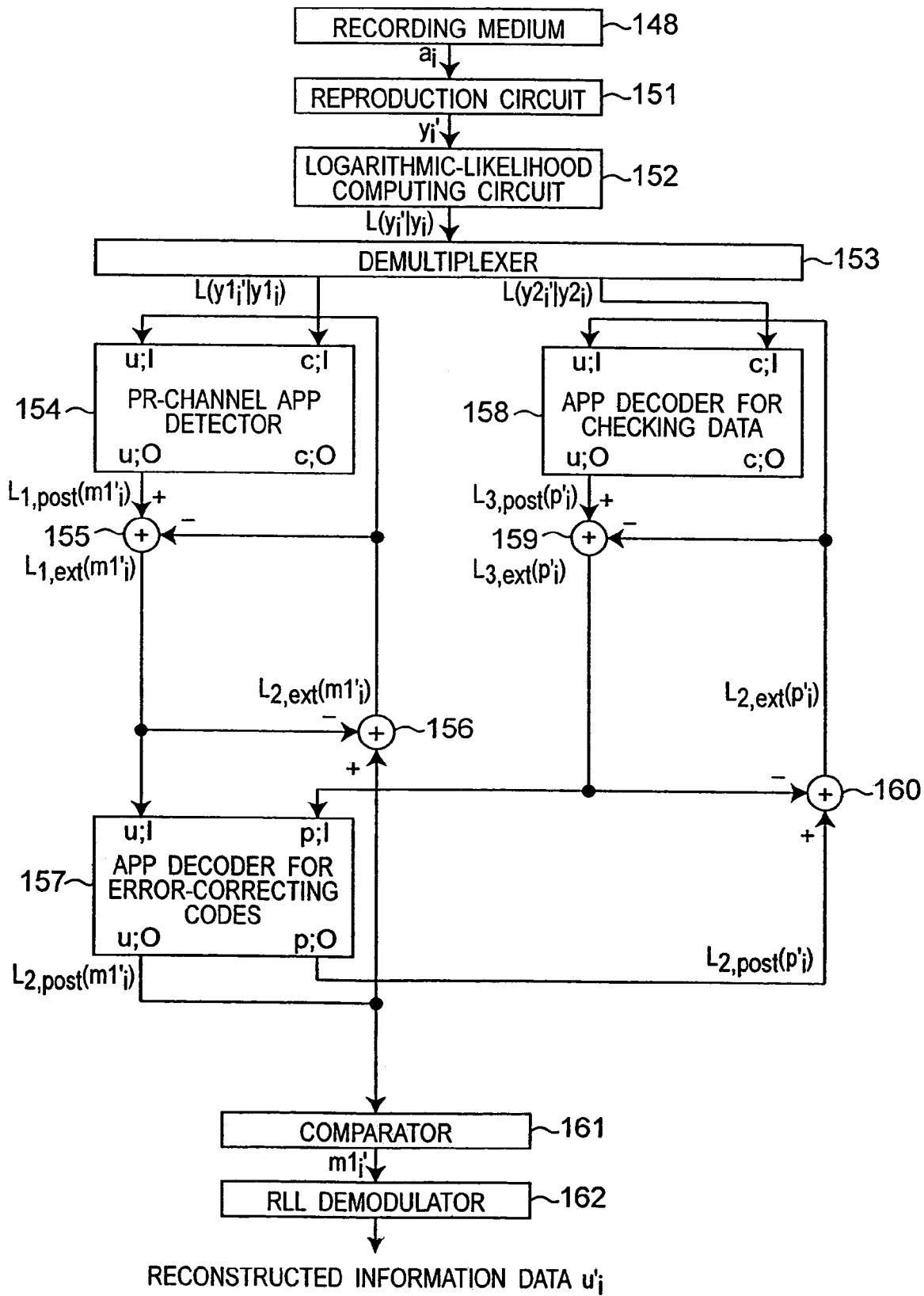
FIG. 14 is a block diagram showing a recording-medium reproducing apparatus in a fifth embodiment of the present invention.
Figure 15:
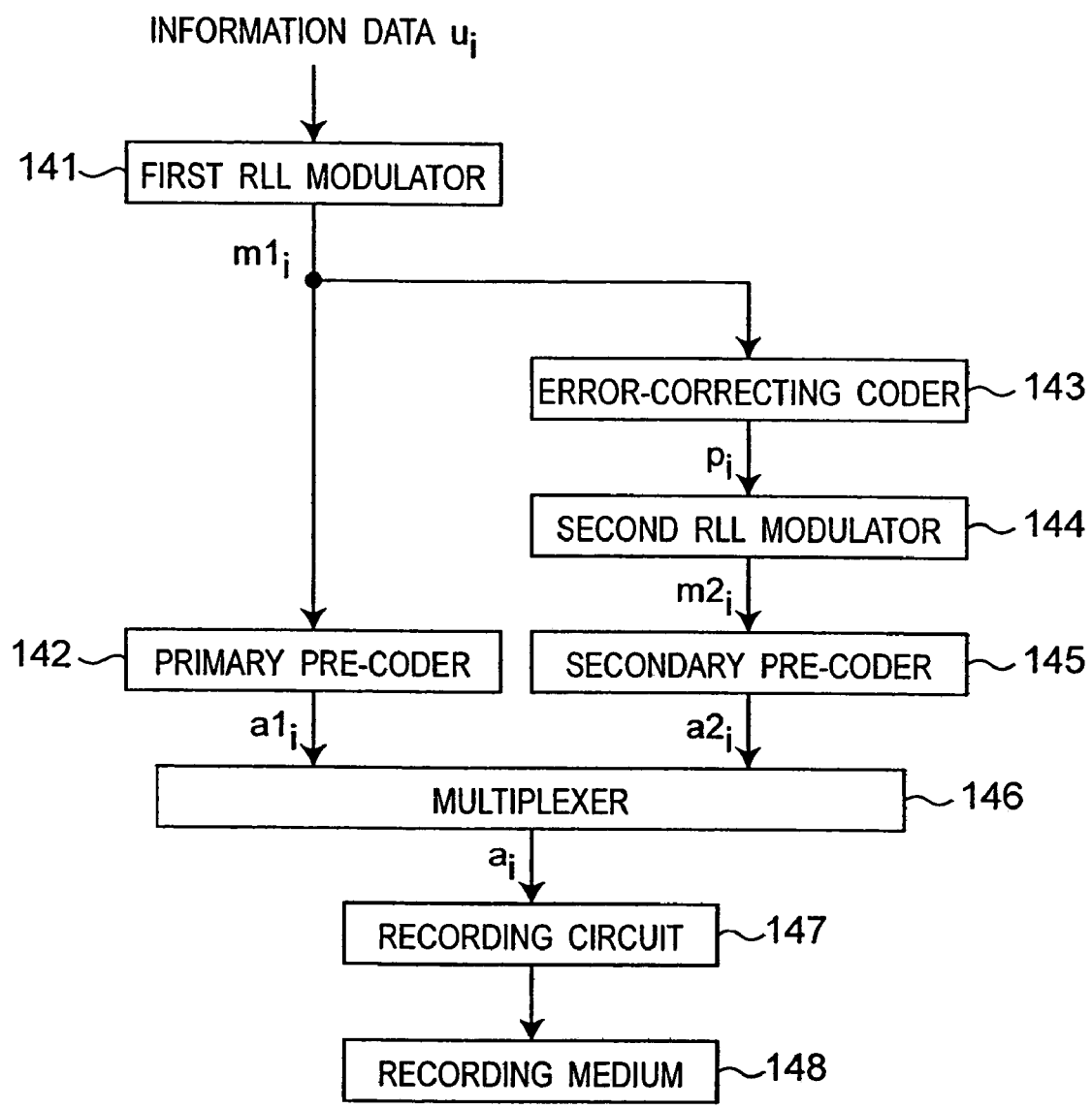
FIG. 15 is a block diagram showing a recording-medium recording apparatus different from those in FIG. 2 and FIG. 12.

FIG. 14 is a block diagram showing a recording-medium reproducing apparatus in a fifth embodiment. FIG. 15 is a block diagram of a recording-medium recording apparatus which records, on a recording medium, channel data a$_i$ reproduced by the recording-medium reproducing apparatus shown in FIG. 14. First, description will be given of the recording-medium recording apparatus.

In the recording-medium recording apparatus shown in FIG. 15, a first RLL modulator 141 performs RLL modulation on inputted information data u$_i$ and outputs primary modulation data m1$_i$. The primary modulation data m1$_i$ is then inputted into a primary pre-coder 142 and an error-correcting coder 143. The primary pre-coder 142 performs NRZI conversion on the inputted primary modulation data m1$_i$ to generate primary channel data a1'$_i$, and outputs the data to a multiplexer 146. The error-correcting coder 143 performs systematic error-correcting coding on the inputted primary modulation data m1$_i$ and outputs checking data p$_i$.

A second RLL modulator 144 performs RLL modulation on the inputted checking data p$_i$ and outputs secondary modulation data m2$_i$. A secondary pre-coder 145 performs NRZI conversion on the inputted secondary modulation data $m2_i$ to generate secondary channel data $a2_i$, and outputs the data to the multiplexer 146.

The multiplexer 146 multiplexes the primary channel data $a1_i$ inputted from the primary pre-coder 142 and the secondary channel data $a2_i$ inputted from the secondary pre-coder 145 and outputs channel data $a_i$. The channel data $a_i$ outputted in this way is recorded on a recording medium 148 by a recording circuit 147. At this point, the recording circuit 147 implements recording by magnetic recording, magneto-optical recording, optical recording or the like. Thus, this recording-medium recording apparatus performs both turbo coding and RLL modulation.

Description is now given of the recording-medium reproducing apparatus shown in FIG. 14. A reproduction circuit 151, a logarithmic likelihood ratio computing circuit 152, a demultiplexer 153, an APP decoder 158 for checking data, a third subtracter 159, a fourth subtracter 160, a comparator 161 and an RLL demodulator 162 have behaviors identical to the reproduction circuit 101, the logarithmic-likelihood computing circuit 102, the demultiplexer 103, the APP decoder 110 for checking data, the third subtracter 111, the fourth subtracter 112, the comparator 114 and the RLL demodulator 115 in the recording-medium reproducing apparatus in the third embodiment shown in FIG. 11.

It is to be noted that the reproduction circuit 151 reproduces channel data recorded on a recording medium 148 and outputs reproduced data $y'_i$. Moreover, the reproduction circuit 151 does not have equivalences of the interleaver 106, the first deinterleaver 108 and the second deinterleaver 113 in the recording-medium reproducing apparatus in the third embodiment shown in FIG. 11. Because of this, extrinsic information $L_{2,ext}(m1'_i)$ regarding primary modulation data derived from a second subtracter 156 is inputted into an information input terminal u;I of a PR-channel APP detector 154 and a first subtracter 155, while extrinsic information $L_{1,ext}(m1'_i)$ regarding primary modulation data derived from the first subtracter 155 is inputted into an information input terminal u;I of an APP decoder 157 for error-correcting codes and the second subtracter 156.

As described above, the recording-medium reproducing apparatus in this embodiment does not have a first interleaver for performing first pseudo-random substitution on the primary modulation data nor a second deinterleaver for performing inverse substitution thereof. Therefore, compared to the recording-medium reproducing apparatus in the third embodiment shown in FIG. 11, the configuration of the recording-medium reproducing apparatus can be simplified.

Moreover, the recording-medium reproducing apparatus has two loops that perform turbo decoding. They are, a first loop in which a logarithmic likelihood ratio relating to primary modulation data is repeatedly delivered between the PR-channel APP detector 154 and the APP decoder 157 for error-correcting codes, and a second loop in which a logarithmic likelihood ratio relating to checking data is repeatedly delivered between the APP decoder 158 for checking data and the APP decoder 157 for error-correcting codes. By executing turbo decoding in these two loops simultaneously, errors in reconstructed information data $u'_i$ can be further decreased lower than those in the case of the turbo decoding executed in one loop, allowing enhanced recording density of the recording medium. Further, tolerances for recording media and tolerances for the recording-medium reproducing apparatus are allowed to be larger.

Sixth Embodiment

Figure 16:
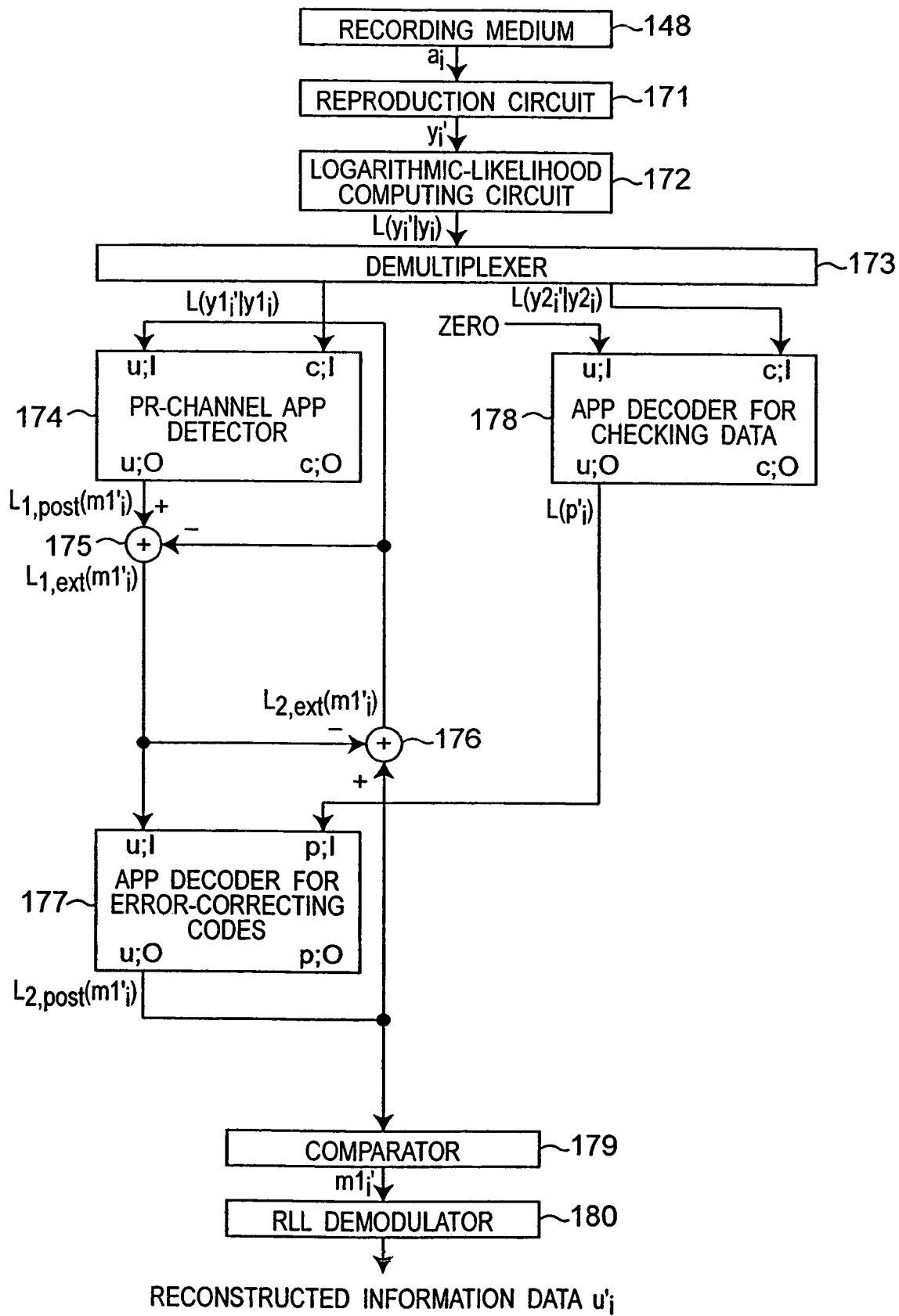
FIG. 16 is a block diagram showing a recording-medium reproducing apparatus in a sixth embodiment of the present invention.
Figure 17:
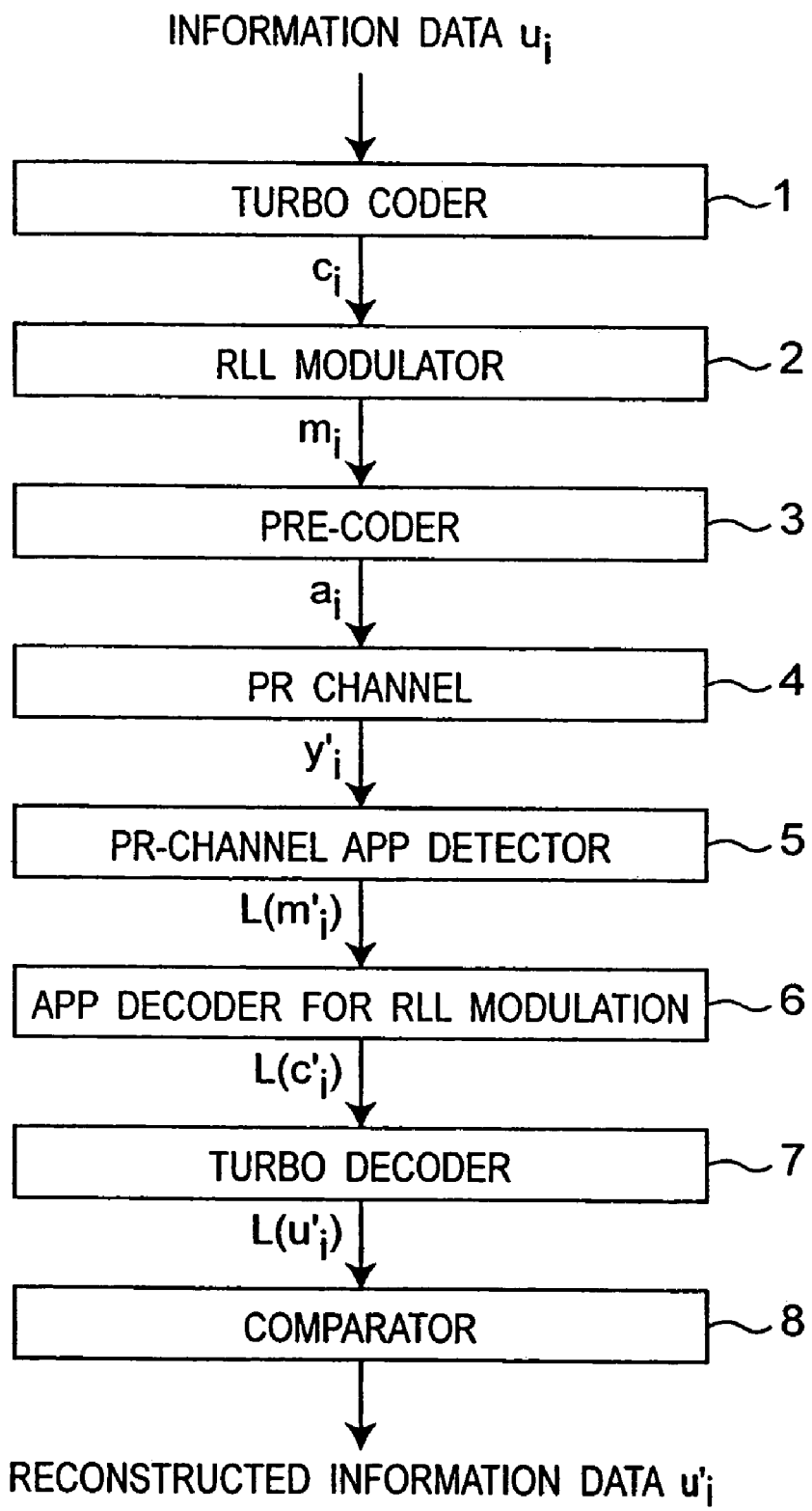
FIG. 17 is a block diagram showing a recording and reproducing apparatus according to background art.

FIG. 16 is a block diagram of a recording-medium reproducing apparatus in this embodiment. As with the case of the recording-medium reproducing apparatus shown in FIG. 14, the recording-medium reproducing apparatus reproduces channel data $a_i$ recorded on a recording medium 148 by a recording-medium recording apparatus shown in FIG. 15. In FIG. 16, a reproduction circuit 171, a logarithmic likelihood ratio computing circuit 172, a demultiplexer 173, a PR-channel APP detector 174, a first subtracter 175, a second subtracter 176, a comparator 179 and an RLL demodulator 180 have behaviors identical to the reproduction circuit 151, the logarithmic-likelihood ratio computing circuit 152, the demultiplexer 153, the PR-channel APP detector 154, the first subtracter 155, the second subtracter 156, the comparator 161 and the RLL demodulator 162 in the recording-medium reproducing apparatus in the fifth embodiment shown in FIG. 14.

The recording-medium reproducing apparatus in this embodiment does not have equivalences of the third subtracter 159 and the fourth subtracter 160 in the recording-medium reproducing apparatus in the fifth embodiment shown in FIG. 14. Moreover, a posteriori probability $L_{2,post}(p'_i)$ of checking data outputted from a checking output terminal p;O of an APP decoder 177 for error-correcting codes is not to be returned to an APP decoder 178 for checking data. Accordingly, a zero is always inputted into an information input terminal u;I of the APP decoder 178 for checking data, while a logarithmic likelihood ratio $L(p'_i)$ relating to checking data outputted from an information output terminal u;O is inputted into a checking input terminal p;I of the APP decoder 177 for error-correcting codes.

Thus, the recording-medium reproducing apparatus in this embodiment has only one turbo decoding loop in which a logarithmic likelihood ratio relating to primary modulation data is repeatedly delivered between the PR-channel APP detector 174 and the APP decoder 177 for error-correcting codes. Executing the turbo decoding in this one loop enables errors in reconstructed information data $u'_i$ to be decreased. This allows enhanced recording density of the recording medium. Further, tolerances for recording media and tolerances for the recording-medium reproducing apparatus are allowed to be larger.

Further, as described above, the recording-medium reproducing apparatus in this embodiment does not have an equivalence of the iterative decoding loop disposed between the APP decoder 158 for checking data and the APP decoder 157 for error-correcting codes in the recording-medium reproducing apparatus in the fifth embodiment shown in FIG. 14, in which a logarithmic likelihood ratio relating to checking data is repeatedly delivered. Therefore, compared to the recording-medium reproducing apparatus in the fifth embodiment, the recording-medium reproducing apparatus can be simplified.

It is to be noted that in the recording-medium reproducing apparatuses in the third embodiment and the fifth embodiment, like the first embodiment in FIG. 7, the APP decoders 110 and 158 for checking data can be constructed from a PR-channel APP detector and an APP decoder for RLL modulation. Similarly, in the recording-medium reproducing apparatuses in the second, fourth and sixth embodiments, the APP decoders 80, 130 and 178 for checking data can be constructed from a PR-channel APP detector and an APP decoder for RLL modulation. In this case, however, the iterative decoding loop in which a logarithmic likelihood ratio relating to checking data is repeatedly delivered, is not needed so that zero should be inputted into the information input terminal u;I of the APP decoder for RLL modulation.

In the case of the third and the fourth embodiment, it is possible to remove the second deinterleavers 113 and 131. In this case, a posteriori probability $L_{1,post}(m1'_i)$ of primary modulation data outputted from the information output terminal u;O of the PR-channel APP detectors 104 and 124 should be inputted into the comparators 114 and 132.

Moreover, in the recording-medium reproducing apparatus in each of the above embodiments, the APP decoders 50, 80, 110, 130, 158 and 178 for checking data as well as the APP decoder 62 for RLL modulation perform RLL demodulation that is soft decoding. Because of this, a computing amount becomes larger than that in the case where hard decoding is performed. However, this soft-decision RLL demodulation is performed on secondary channel data and not on primary modulation data. Generally, a coding rate in error-correcting codes in the recording media field is approx. 90% or more. For example, the coding rate in Literature 1 is %=approx. 89%, while the coding rate in Literature 2 is 95%. In other words, the checking data makes up ⅛=approx. 11% of the entire data in Literature 1, while the checking data makes up only 5% in Literature 2.

More specifically, the RLL demodulation performed by the APP decoders 50, 80, 110, 130, 158 and 178 for checking data as well as the APP decoder 62 for RLL modulation forms only an extremely slim proportion of the total computing amount. Therefore, increase in a computation amount attributed to change of the RLL demodulation for checking data from hard decoding to soft decoding is quite small, so that the RLL demodulation performed by the APP decoders 50, 80, 110, 130, 158 and 178 for checking data as well as the APP decoder 62 for RLL modulation can be soft-decision RLL demodulation without posing any problem.

Further, in the APP decoder 50 for checking data in another configuration shown in FIG. 7, the APP decoder 62 for RLL modulation performs a posteriori probability decoding based on a trellis diagram. However, the present invention is not limited thereto, and therefore the a posteriori probability decoding can be performed based on a demodulation table presenting constraints concerning RLL modulation instead of the trellis diagram. The RLL demodulation based on the demodulation table in this case makes it possible to reduce a computation amount lower than that in RLL demodulation based on the trellis diagram. It is to be noted that the RLL demodulation based on the demodulation table is described in detail in Literatures 1 and 2.

Meantime, the turbo coding is known to be able to obtain a considerably high error-correcting capability by adopting systematic convolutional codes as its constituent codes. Therefore, as shown in each of the above-stated embodiments, the error-correcting coding method adopted in the error-correcting coders 34, 94 and 143 in each recording-medium recording apparatus should preferably be systematic convolutional coding. In this case, the APP decoders 49, 79, 109, 129, 157 and 177 for error-correcting codes in the corresponding recording-medium reproducing apparatus need to perform a posteriori probability decoding in compliance with a constraint concerning the systematic convolutional codes. It is to be noted that the coding method for convolutional codes to be adopted may include well-known BCJR algorism, Max-Log-MAP algorism and SOVA (Soft Output Viterbi Algorithm). The turbo decoding performed in this way allows further reduction of errors in the reconstructed information input terminal $u'_i$.

Furthermore, in the case where the turbo coding is adopted as an error-correcting coding method for the error-correcting coders 34, 94 and 143, the turbo codes to be used should be, for example, parallel concatenated convolutional codes structured by two convolutional coders or serially concatenated convolutional codes. In this case, the APP decoder 49, 79, 109, 129, 157 and 177 for error-correcting codes in the corresponding recording-medium reproducing apparatus need to perform turbo decoding corresponding to the above-stated turbo coding. Thus, setting the APP decoder 49, 79, 109, 129, 157 and 177 for error-correcting codes itself to perform turbo decoding allows further reduction of errors in the reconstructed information data $u'_i$.

Moreover, the error-correcting coding method adopted for the error-correcting coder 34, 94 and 143 in the recording-medium recording apparatus in each of the above-stated embodiment may be the aforementioned LDPC coding method. In this case, the APP decoder 49, 79, 109, 129, 157 and 177 for error-correcting codes in the recording-medium reproducing apparatus need to perform a posteriori probability decoding corresponding to the aforementioned LDPC coding. Sum Product Algorithm is known as the decoding method for the LDPC coding. Thus, setting the APP decoder 49, 79, 109, 129, 157 and 177 for error-correcting codes itself to perform decoding according to the sum product algorithm allows further reduction of errors in the reconstructed information data $u'_i$.

In addition, although the logarithmic-likelihood ratios in the above individual embodiments are real numbers, yet those numbers may be numbers quantized with floating-point precision or fixed-point precision, and furthermore may be numbers of integer precision. Generally, the floating-point precision, the fixed-point precision and the integer precision are ranked in terms of arithmetic precision, higher to lower, in this order.

Further, logarithmic-likelihood ratios have been used as likelihoods to be inputted or outputted by each block in each of the above embodiments, since the use of logarithmic-likelihood ratios allows the computation amount to be reduced. However, without being limited to logarithmic-likelihood ratios, the present invention allows each block to input or output, for example, a probability value as it is. In such a case, the subtracters should be replaced with dividers and the adders should be replaced with multipliers.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by performing at least systematic error-correcting coding on the primary modulation data to form checking data, then performing at least the modulation on the checking data to generate secondary modulation data, and then performing the pre-coding on the secondary modulation data, comprising:

reproducing means reproducing the primary channel data and the secondary channel data recorded on the recording medium and outputting reproduced data;

iterative decoding means, based on the reproduced data, iteratively performing a posteriori probability decoding in compliance with a constraint concerning channel data and constraints concerning pre-codes and a recording and reproducing characteristic, and an a posteriori probability decoding in compliance with a constraint concerning systematic error-correcting codes while repeatedly delivering and receiving a priori information regarding the primary modulation data internally, so as to obtain an a posteriori probability of the primary modulation data; and demodulation means binarizing the a posteriori probability of the primary modulation data derived from the iterative decoding means and then performing demodulation corresponding to the modulation so as to reconstruct the information data.

2. A computer programmed by a decoding processing program, wherein said computer is configured such that said computer functions as the reproducing means, the iterative decoding means and the demodulation means according to claim 1.

3. A program-recorded medium readable by said computer, which contains the decoding processing program according to claim 2.

4. A recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by sequentially performing first pseudo-random substitution and systematic error-correcting coding on the primary modulation data to generate checking data, then sequentially performing second pseudo-random substitution and the modulation on the checking data to generate secondary modulation data, and then performing the pre-coding on the secondary modulation data, comprising:

a reproduction section reproducing the primary channel data and the secondary channel data recorded on the recording medium and outputting reproduced data composed of primary reproduced data and secondary reproduced data;

a communication channel value computing section computing a communication channel value representing a probability per bit in the reproduced data;

a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing is characteristic so as to generate an a posteriori probability of the primary modulation data;

a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section;

a first substitution section performing the first pseudo-random substitution on the extrinsic information regarding the primary modulation data derived from the first computing section to generate extrinsic information regarding post-substitution primary modulation data and outputting the information as a priori information regarding the post-substitution primary modulation data;

a second a posteriori probability decoding section receiving a priori information regarding the checking data, and performing a posteriori probability decoding on the a priori information regarding the checking data and the a priori information regarding the post-substitution primary modulation data derived from the first substitution section in compliance with a constraint concerning systematic error-correcting codes to generate an a posteriori probability of the post-substitution primary modulation data and an a posteriori probability of the checking data;

a second computing section computing extrinsic information regarding the post-substitution primary modulation data updated by the second a posteriori probability decoding section, based on the a priori information regarding the post-substitution primary modulation data derived from the first substitution section and the a posteriori probability of the post-substitution primary modulation data derived from the second a posteriori probability decoding section;

a first inverse substitution section performing inverse substitution of the first pseudo-random substitution on the extrinsic information regarding the post-substitution primary modulation data derived from the second computing section to generate extrinsic information regarding the primary modulation data and outputting the information as a priori information regarding the primary modulation data to the first a posteriori probability decoding section and the first computing section;

a third a posteriori probability decoding section receiving a priori information regarding the post-substitution checking data, and performing a posteriori probability decoding on the a priori information regarding the post-substitution checking data and the communication channel value as to the secondary reproduced data derived from the communication channel value computing section in compliance with a constraint concerning modulation and constraints concerning pre-codes and a recording and reproducing characteristic so as to generate an a posteriori probability of the post-substitution checking data;

a third computing section receiving the a priori information regarding the post-substitution checking data, and, based on the a priori information regarding the post-substitution checking data and the a posteriori probability of the post-substitution checking data derived from the third a posteriori probability decoding section, computing extrinsic information regarding the post-substitution checking data updated by the third a posteriori probability decoding section;

a second inverse substitution section performing inverse substitution of the second pseudo-random substitution on the extrinsic information regarding the post-substitution checking data derived from the third computing section so as to generate extrinsic information regarding the checking data, and outputting the generated information as a priori information regarding the checking data to the second a posteriori probability decoding section;

a fourth computing section computing extrinsic information regarding the checking data updated by the second a posteriori probability decoding section, based on the a priori information regarding the checking data derived from the second inverse substitution section and the a posteriori probability of the checking data derived from the second a posteriori probability decoding section;

a second substitution section performing the second pseudo-random substitution on the extrinsic information regarding the checking data derived from the fourth computing section so as to generate extrinsic information regarding the post-substitution checking data, and outputting the generated information as a priori information regarding the post-substitution checking data to the third a posteriori probability decoding section and the third computing section; and a demodulation section receiving the a posteriori probability of the primary modulation data derived from the first a posteriori probability decoding section or the a posteriori probability of the post-substitution primary modulation data derived from the second a posteriori probability decoding section, and, upon receipt of the a posteriori probability of the primary modulation data, binarizing the a posteriori probability of the primary modulation data and then performing demodulation corresponding to the modulation so as to reconstruct the information data, whereas upon receipt of the a posteriori probability of the post-substitution primary modulation data, sequentially performing inverse substitution of the first pseudo-random substitution and binarization on the a posteriori probability of the post-substitution primary modulation data and then performing demodulation corresponding to the modulation so as to reconstruct the information data, wherein the first and second a posteriori probability decoding sections performs iterative decoding while repeatedly delivering a priori information regarding the primary modulation data therebetween, and the second and third a posteriori probability decoding sections also perform iterative decoding while repeatedly delivering a priori information regarding the checking data therebetween, and wherein after both the iterative decodings have been performed, the demodulation section performs demodulation processing so as to reconstruct the information data.

5. The recording-medium reproducing apparatus according to claim 4, wherein
the recording and reproducing characteristic is a partial response transfer characteristic, and
the constraint concerning the recording and reproducing characteristic adopted by the first and the third a posteriori probability decoding sections is the partial response transfer characteristic.

6. The recording-medium reproducing apparatus according to claim 4, wherein
the modulation is a run-length limited modulation,
the constraint concerning channel data adopted by the first a posteriori probability decoding section is a run-length limit condition, and
the constraint concerning modulation adopted by the third a posteriori probability decoding section is a correspondence rule between data before and after application of the run-length limited modulation.

7. The recording-medium reproducing apparatus according to claim 4, wherein
the pre-coding comprises non-return-to-zero inverted conversion,
the constraint concerning pre-codes adopted by the first a posteriori probability decoding section and the third a posteriori probability decoding section is a non-return-to-zero inverted conversion rule.

8. The recording-medium reproducing apparatus according to claim 4, wherein
the third a posteriori probability decoding section performs the a posteriori probability decoding based on a trellis diagram representing the constraint concerning the modulation and the constraints concerning the pre-codes and recording and reproducing characteristic.

9. The recording-medium reproducing apparatus according to claim 4, wherein
the third a posteriori probability decoding section comprises:
secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and
a checking data decoding means using the a posteriori probability of the secondary modulation data derived from the secondary modulation data decoding means as a priori information to perform a posteriori probability decoding on this a priori information regarding the secondary modulation data and the a priori information regarding the post-substitution checking data derived from the second substitution section in compliance with the constraint concerning the modulation so as to generate the a posteriori probability of the post-substitution checking data.

10. The recording-medium reproducing apparatus according to claim 9, wherein
the secondary modulation data decoding means performs the a posteriori probability decoding based on a trellis diagram representing the constraint concerning the channel data and the constraints concerning the pre-codes and the recording and reproducing characteristic.

11. The recording-medium reproducing apparatus according to claim 9, wherein
the checking data decoding means performs the a posteriori probability decoding based on one of a trellis diagram or a demodulation table representing the constraint concerning the modulation.

12. The recording-medium reproducing apparatus according to claim 4, wherein
the systematic error-correcting coding is systematic convolutional coding, and
the second a posteriori probability decoding section performs the a posteriori probability decoding in compliance with a constraint concerning systematic convolutional codes.

13. The recording-medium reproducing apparatus according to claim 4, wherein
the systematic error-correcting coding is turbo coding, and
the second a posteriori probability decoding section performs the a posteriori probability decoding through turbo decoding corresponding to the turbo coding.

14. The recording-medium reproducing apparatus according to claim 4, wherein
the systematic error-correcting coding is low-density parity check coding, and the second a posteriori probability decoding performs the a posteriori probability decoding through decoding corresponding to the low-density parity check coding.

15. A recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by sequentially performing first pseudo-random substitution and systematic error-correcting coding on the primary modulation data to generate checking data, then sequentially performing second pseudo-random substitution and the modulation on the checking data to generate secondary modulation data, and then performing the pre-coding on the secondary modulation data, comprising:

a reproduction section reproducing the primary channel data and the secondary channel data recorded on the recording medium and outputting reproduced data composed of primary reproduced data and secondary reproduced data;

a communication channel value computing section computing a communication channel value representing a probability per bit in the reproduced data;

a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data;

a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section;

a first substitution section performing the first pseudo-random substitution on the extrinsic information regarding the primary modulation data derived from the first computing section to generate extrinsic information regarding post-substitution primary modulation data and outputting the information as a priori information regarding the post-substitution primary modulation data;

a second a posteriori probability decoding section receiving a priori information regarding the checking data, and performing a posteriori probability decoding on the a priori information regarding the checking data and the a priori information regarding the post-substitution primary modulation data derived from the first substitution section in compliance with a constraint concerning systematic error-correcting codes to generate an a posteriori probability of the post-substitution primary modulation data;

a second computing section computing extrinsic information regarding the post-substitution primary modulation data updated by the second a posteriori probability decoding section, based on the a priori information regarding the post-substitution primary modulation data derived from the first substitution section and the a posteriori probability of the post-substitution primary modulation data derived from the second a posteriori probability decoding section;

a first inverse substitution section performing inverse substitution of the first pseudo-random substitution on the extrinsic information regarding the post-substitution primary modulation data derived from the second computing section to generate extrinsic information regarding the primary modulation data and outputting the information as a priori information regarding the primary modulation data to the first a posteriori probability decoding section and the first computing section;

a third a posteriori probability decoding section performing a posteriori probability decoding on the communication channel value as to the secondary reproduced data derived from the communication channel value computing section in compliance with a constraint concerning modulation and constraints concerning pre-codes and a recording and reproducing characteristic so as to generate an a posteriori probability of the post-substitution checking data;

a second inverse substitution section performing inverse substitution of the second pseudo-random substitution on the a posteriori probability of the post-substitution checking data derived from the third a posteriori probability decoding section so as to generate a priori information regarding the checking data, and outputting the generated a priori information regarding the checking data to the second a posteriori probability decoding section; and a demodulation section receiving the a posteriori probability of the primary modulation data derived from the first a posteriori probability decoding section or the a posteriori probability of the post-substitution primary modulation data derived from the second a posteriori probability decoding section, and, upon receipt of the a posteriori probability of the primary modulation data, binarizing the a posteriori probability of the primary modulation data and then performing demodulation corresponding to the modulation so as to reconstruct the information data, whereas upon receipt of the a posteriori probability of the post-substitution primary modulation data, sequentially performing inverse substitution of the first pseudo-random substitution and binarization on the a posteriori probability of the post-substitution primary modulation data and then performing demodulation corresponding to the modulation so as to reconstruct the information data, wherein the first and second a posteriori probability decoding sections performs iterative decoding while repeatedly delivering a priori information regarding the primary modulation data therebetween, and wherein after the iterative decoding has been performed, the demodulation section performs demodulation processing so as to reconstruct the information data.

16. The recording-medium reproducing apparatus according to claim 15, wherein the recording and reproducing characteristic is a partial response transfer characteristic, and the constraint concerning the recording and reproducing characteristic adopted by the first and the third a posteriori probability decoding sections is the partial response transfer characteristic.

17. The recording-medium reproducing apparatus according to claim 15, wherein the modulation is a run-length limited modulation, the constraint concerning channel data adopted by the first a posteriori probability decoding section is a run-length limit condition, and the constraint concerning modulation adopted by the third a posteriori probability decoding section is a correspondence rule between data before and after application of the run-length limited modulation.

18. The recording-medium reproducing apparatus according to claim 15, wherein the pre-coding comprises non-return-to-zero inverted conversion, the constraint concerning pre-codes adopted by the first a posteriori probability decoding section and the third a posteriori probability decoding section is a non-return-to-zero inverted conversion rule.

19. The recording-medium reproducing apparatus according to claim 15, wherein the third a posteriori probability decoding section performs the a posteriori probability decoding based on a trellis diagram representing the constraint concerning the modulation and the constraints concerning the pre-codes and recording and reproducing characteristic.

20. The recording-medium reproducing apparatus according to claim 15, wherein the third a posteriori probability decoding section comprises:

secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and a checking data decoding means using the a posteriori probability of the secondary modulation data derived from the secondary modulation data decoding means as a priori information to perform a posteriori probability decoding on this a priori information regarding the secondary modulation data in compliance with the constraint concerning the modulation so as to generate the a posteriori probability of the post-substitution checking data.

21. The recording-medium reproducing apparatus according to claim 20, wherein the secondary modulation data decoding means performs the a posteriori probability decoding based on a trellis diagram representing the constraint concerning the channel data and the constraints concerning the pre-codes and the recording and reproducing characteristic.

22. The recording-medium reproducing apparatus according to claim 20, wherein the checking data decoding means performs the a posteriori probability decoding based on one of a trellis diagram or a demodulation table representing the constraint concerning the modulation.

23. The recording-medium reproducing apparatus according to claim 15, wherein the systematic error-correcting coding is systematic convolutional coding, and the second a posteriori probability decoding section performs the a posteriori probability decoding in compliance with a constraint concerning systematic convolutional codes.

24. The recording-medium reproducing apparatus according to claim 15, wherein the systematic error-correcting coding is turbo coding, and the second a posteriori probability decoding section performs the a posteriori probability decoding through turbo decoding corresponding to the turbo coding.

25. The recording-medium reproducing apparatus according to claim 15, wherein the systematic error-correcting coding is low-density parity check coding, and the second a posteriori probability decoding performs the a posteriori probability decoding through decoding corresponding to the low-density parity check coding.

26. A recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by sequentially performing pseudo-random substitution and systematic error-correcting coding on the primary modulation data to generate checking data, then performing the modulation on the checking data to generate secondary modulation data, and then performing the pre-coding on the secondary modulation data, comprising:

a reproduction section reproducing the primary channel data and the secondary channel data recorded on the recording medium and outputting reproduced data composed of primary reproduced data and secondary reproduced data;

a communication channel value computing section computing a communication channel value representing a probability per bit in the reproduced data;

a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data;

a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section;

a first substitution section performing the pseudo-random substitution on the extrinsic information regarding the primary modulation data derived from the first computing section to generate extrinsic information regarding post-substitution primary modulation data and outputting the information as a priori information regarding the post-substitution primary modulation data;

a second a posteriori probability decoding section receiving a priori information regarding the checking data, and performing a posteriori probability decoding on the a priori information regarding the checking data and the a priori information regarding the post-substitution primary modulation data derived from the first substitution section in compliance with a constraint concerning systematic error-correcting codes to generate an a posteriori probability of the post-substitution primary modulation data and an a posteriori probability of the checking data;

a second computing section computing extrinsic information regarding the post-substitution primary modulation data updated by the second a posteriori probability decoding section, based on the a priori information regarding the post-substitution primary modulation data derived from the first substitution section and the a posteriori probability of the post-substitution primary modulation data derived from the second a posteriori probability decoding section;

a first inverse substitution section performing inverse substitution of the pseudo-random substitution on the extrinsic information regarding the post-substitution primary modulation data derived from the second computing section to generate extrinsic information regarding the primary modulation data and outputting the information as the priori information regarding the primary modulation data to the first a posteriori probability decoding section and the first computing section;

a third a posteriori probability decoding section receiving a priori information regarding the checking data, and performing a posteriori probability decoding on the a priori information regarding the checking data and the communication channel value as to the secondary reproduced data derived from the communication channel value computing section in compliance with a constraint concerning modulation and constraints concerning pre-codes and a recording and reproducing characteristic so as to generate an a posteriori probability of the checking data;

a third computing section receiving the a priori information regarding the checking data, and, based on the a priori information regarding the checking data and the a posteriori probability of the checking data derived from the third a posteriori probability decoding section, computing extrinsic information regarding the checking data updated by the third a posteriori probability decoding section, and outputting the extrinsic information as the priori information regarding the checking data to the second a posteriori probability decoding section;

a fourth computing section computing extrinsic information regarding the checking data updated by the second a posteriori probability decoding section, based on the a priori information regarding the checking data derived from the second inverse substitution section and the a posteriori probability of the checking data derived from the second a posteriori probability decoding section; and a demodulation section receiving the a posteriori probability of the primary modulation data derived from the first a posteriori probability decoding section or the a posteriori probability of the post-substitution primary modulation data derived from the second a posteriori probability decoding section, and, upon receipt of the a posteriori probability of the primary modulation data, binarizing the a posteriori probability of the primary modulation data and then performing demodulation corresponding to the modulation so as to reconstruct the information data, whereas upon receipt of the a posteriori probability of the post-substitution primary modulation data, sequentially performing inverse substitution of the pseudo-random substitution and binarization on the a posteriori probability of the post-substitution primary modulation data and then performing demodulation corresponding to the modulation so as to reconstruct the information data, wherein the first and second a posteriori probability decoding sections performs iterative decoding while repeatedly delivering a priori information regarding the primary modulation data therebetween, and the second and third a posteriori probability decoding sections also perform iterative decoding while repeatedly delivering a priori information regarding the checking data therebetween, and wherein after both the iterative decodings have been performed, the demodulation section performs demodulation processing so as to reconstruct the information data.

27. The recording-medium reproducing apparatus according to claim 26, wherein the recording and reproducing characteristic is a partial response transfer characteristic, and the constraint concerning the recording and reproducing characteristic adopted by the first and the third a posteriori probability decoding sections is the partial response transfer characteristic.

28. The recording-medium reproducing apparatus according to claim 26, wherein the modulation is a run-length limited modulation, the constraint concerning channel data adopted by the first a posteriori probability decoding section is a run-length limit condition, and the constraint concerning modulation adopted by the third a posteriori probability decoding section is a correspondence rule between data before and after application of the run-length limited modulation.

29. The recording-medium reproducing apparatus according to claim 26, wherein the pre-coding comprises non-return-to-zero inverted conversion, the constraint concerning pre-codes adopted by the first a posteriori probability decoding section and the third a posteriori probability decoding section is a non-return-to-zero inverted conversion rule.

30. The recording-medium reproducing apparatus according to claim 26, wherein the third a posteriori probability decoding section performs the a posteriori probability decoding based on a trellis diagram representing the constraint concerning the modulation and the constraints concerning the pre-codes and recording and reproducing characteristic.

31. The recording-medium reproducing apparatus according to claim 26, wherein the third a posteriori probability decoding section comprises:

secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and a checking data decoding means using the a posteriori probability of the secondary modulation data derived from the secondary modulation data decoding means as a priori information to perform a posteriori probability decoding on this a priori information regarding the secondary modulation data and the a priori information regarding the checking data derived from the fourth calculating section in compliance with the constraint concerning the modulation so as to generate the a posteriori probability of the checking data.

32. The recording-medium reproducing apparatus according to claim 31, wherein
the secondary modulation data decoding means performs the a posteriori probability decoding based on a trellis diagram representing the constraint concerning the channel data and the constraints concerning the pre-codes and the recording and reproducing characteristic.

33. The recording-medium reproducing apparatus according to claim 31, wherein
the checking data decoding means performs the a posteriori probability decoding based on one of a trellis diagram or a demodulation table representing the constraint concerning the modulation.

34. The recording-medium reproducing apparatus according to claim 26, wherein
the systematic error-correcting coding is systematic convolutional coding, and
the second a posteriori probability decoding section performs the a posteriori probability decoding in compliance with a constraint concerning systematic convolutional codes.

35. The recording-medium reproducing apparatus according to claim 26, wherein
the systematic error-correcting coding is turbo coding, and
the second a posteriori probability decoding section performs the a posteriori probability decoding through turbo decoding corresponding to the turbo coding.

36. The recording-medium reproducing apparatus according to claim 26, wherein
the systematic error-correcting coding is low-density parity check coding, and
the second a posteriori probability decoding performs the a posteriori probability decoding through decoding corresponding to the low-density parity check coding.

37. A recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by sequentially performing pseudo-random substitution and systematic error-correcting coding on the primary modulation data to generate checking data, then performing the modulation on the checking data to generate secondary modulation data, and then performing the pre-coding on the secondary modulation data, comprising:

a reproduction section reproducing the primary channel data and the secondary channel data recorded on the recording medium and outputting reproduced data composed of primary reproduced data and secondary reproduced data;

a communication channel value computing section computing a communication channel value representing a probability per bit in the reproduced data;

a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data;

a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section;

a first substitution section performing the pseudo-random substitution on the extrinsic information regarding the primary modulation data derived from the first computing section to generate extrinsic information regarding post-substitution primary modulation data and outputting the information as the priori information regarding the post-substitution primary modulation data;

a second a posteriori probability decoding section receiving a priori information regarding the checking data, and performing a posteriori probability decoding on the a priori information regarding the checking data and the a priori information regarding the post-substitution primary modulation data derived from the first substitution section in compliance with a constraint concerning systematic error-correcting codes to generate an a posteriori probability of the post-substitution primary modulation data;

a second computing section computing extrinsic information regarding the post-substitution primary modulation data updated by the second a posteriori probability decoding section, based on the a priori information regarding the post-substitution primary modulation data derived from the first substitution section and the a posteriori probability of the post-substitution primary modulation data derived from the second a posteriori probability decoding section;

a first inverse substitution section performing inverse substitution of the pseudo-random substitution on the extrinsic information regarding the post-substitution primary modulation data derived from the second computing section to generate extrinsic information regarding the primary modulation data and outputting the information as the priori information regarding the primary modulation data to the first a posteriori probability decoding section and the first computing section;

a third a posteriori probability decoding section performing a posteriori probability decoding on the communication channel value as to the secondary reproduced data derived from the communication channel value computing section in compliance with a constraint concerning modulation and constraints concerning pre-codes and a recording and reproducing characteristic so as to generate an a posteriori probability of the checking data, and outputting this a posteriori probability as the priori information regarding the checking data to the second a posteriori probability decoding section; and a demodulation section receiving the a posteriori probability of the primary modulation data derived from the first a posteriori probability decoding section or the a posteriori probability of the post-substitution primary modulation data derived from the second a posteriori probability decoding section, and, upon receipt of the a posteriori probability of the primary modulation data, binarizing the a posteriori probability of the primary modulation data and then performing demodulation corresponding to the modulation so as to reconstruct the information data, whereas upon receipt of the a posteriori probability of the post-substitution primary modulation data, sequentially performing inverse substitution of the pseudo-random substitution and binarization on the a posteriori probability of the post-substitution primary modulation data and then performing demodulation corresponding to the modulation so as to reconstruct the information data, wherein the first and second a posteriori probability decoding sections performs iterative decoding while repeatedly delivering a priori information regarding the primary modulation data therebetween, and wherein after the iterative decoding has been performed, the demodulation section performs demodulation processing so as to reconstruct the information data.

38. The recording-medium reproducing apparatus according to claim 37, wherein
the recording and reproducing characteristic is a partial response transfer characteristic, and
the constraint concerning the recording and reproducing characteristic adopted by the first and the third a posteriori probability decoding sections is the partial response transfer characteristic.

39. The recording-medium reproducing apparatus according to claim 37, wherein
the modulation is a run-length limited modulation,
the constraint concerning channel data adopted by the first a posteriori probability decoding section is a run-length limit condition, and
the constraint concerning modulation adopted by the third a posteriori probability decoding section is a correspondence rule between data before and after application of the run-length limited modulation.

40. The recording-medium reproducing apparatus according to claim 37, wherein
the pre-coding comprises non-return-to-zero inverted conversion,
the constraint concerning pre-codes adopted by the first a posteriori probability decoding section and the third a posteriori probability decoding section is a non-return-to-zero inverted conversion rule.

41. The recording-medium reproducing apparatus according to claim 37, wherein
the third a posteriori probability decoding section performs the a posteriori probability decoding based on a trellis diagram representing the constraint concerning the modulation and the constraints concerning the pre-codes and recording and reproducing characteristic.

42. The recording-medium reproducing apparatus according to claim 37, wherein
the third a posteriori probability decoding section comprises:
secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and
a checking data decoding means using the a posteriori probability of the secondary modulation data derived from the secondary modulation data decoding means as a priori information to perform a posteriori probability decoding on this a priori information regarding the secondary modulation data in compliance with the constraint concerning the modulation so as to generate the a posteriori probability of the checking data.

43. The recording-medium reproducing apparatus according to claim 42, wherein
the secondary modulation data decoding means performs the a posteriori probability decoding based on a trellis diagram representing the constraint concerning the channel data and the constraints concerning the pre-codes and the recording and reproducing characteristic.

44. The recording-medium reproducing apparatus according to claim 42, wherein
the checking data decoding means performs the a posteriori probability decoding based on one of a trellis diagram or a demodulation table representing the constraint concerning the modulation.

45. The recording-medium reproducing apparatus according to claim 37, wherein
the systematic error-correcting coding is systematic convolutional coding, and
the second a posteriori probability decoding section performs the a posteriori probability decoding in compliance with a constraint concerning systematic convolutional codes.

46. The recording-medium reproducing apparatus according to claim 37, wherein
the systematic error-correcting coding is turbo coding, and
the second a posteriori probability decoding section performs the a posteriori probability decoding through turbo decoding corresponding to the turbo coding.

47. The recording-medium reproducing apparatus according to claim 37, wherein
the systematic error-correcting coding is low-density parity check coding, and
the second a posteriori probability decoding performs the a posteriori probability decoding through decoding corresponding to the low-density parity check coding.

48. A recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by performing systematic error-correcting coding on the primary modulation data to generate checking data, then performing the modulation on the checking data to generate secondary modulation data, and then performing the pre-coding on the secondary modulation data, comprising:

a reproduction section reproducing the primary channel data and the secondary channel data recorded on the recording medium and outputting reproduced data composed of primary reproduced data and secondary reproduced data;

a communication channel value computing section computing a communication channel value representing a probability per bit in the reproduced data;

a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data;

a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section;

a second a posteriori probability decoding section receiving a priori information regarding the checking data, and performing a posteriori probability decoding on the extrinsic information regarding the primary modulation data derived from the first computing section, which is used as a priori information regarding the primary modulation data, as well as on the a priori information regarding the checking data, in compliance with a constraint concerning systematic error-correcting codes to generate an a posteriori probability of the primary modulation data and an a posteriori probability of the checking data;

a second computing section computing extrinsic information regarding the primary modulation data updated by the second a posteriori probability decoding section, based on the extrinsic information regarding the primary modulation data derived from the first computing section, which is used as a priori information regarding the primary modulation data, as well as based on the a posteriori probability of the primary modulation data derived from the second a posteriori probability decoding section, and outputting the computed extrinsic information as the a priori information regarding the primary modulation data to the first a posteriori probability decoding section and the first computing section;

a third a posteriori probability decoding section receiving a priori information regarding the checking data, and performing a posteriori probability decoding on the a priori information regarding the checking data and the communication channel value as to the secondary reproduced data derived from the communication channel value computing section in compliance with a constraint concerning modulation and constraints concerning pre-codes and a recording and reproducing characteristic so as to generate an a posteriori probability of the checking data;

a third computing section receiving the a priori information regarding the checking data, and, based on the a priori information regarding the checking data and the a posteriori probability of the checking data derived from the third a posteriori probability decoding section, computing extrinsic information regarding the checking data updated by the third a posteriori probability decoding section, and outputting the extrinsic information as a priori information regarding the checking data to the second a posteriori probability decoding section;

a fourth computing section computing extrinsic information regarding the checking data updated by the second a posteriori probability decoding section, based on the a priori information regarding the checking data derived from the second inverse substitution section and the a posteriori probability of the checking data derived from the second a posteriori probability decoding section; and a demodulation section receiving the a posteriori probability of the primary modulation data derived from the first or second a posteriori probability decoding section, then binarizing the a posteriori probability of the primary modulation data, and then performing demodulation corresponding to the modulation so as to reconstruct the information data, wherein the first and second a posteriori probability decoding sections performs iterative decoding while repeatedly delivering a priori information regarding the primary modulation data therebetween, and the second and third a posteriori probability decoding sections also perform iterative decoding while repeatedly delivering a priori information regarding the checking data therebetween, and wherein after both the iterative decodings have been performed, the demodulation section performs demodulation processing so as to reconstruct the information data.

49. The recording-medium reproducing apparatus according to claim 48, wherein the recording and reproducing characteristic is a partial response transfer characteristic, and the constraint concerning the recording and reproducing characteristic adopted by the first and the third a posteriori probability decoding sections is the partial response transfer characteristic.

50. The recording-medium reproducing apparatus according to claim 48, wherein the modulation is a run-length limited modulation, the constraint concerning channel data adopted by the first a posteriori probability decoding section is a run-length limit condition, and the constraint concerning modulation adopted by the third a posteriori probability decoding section is a correspondence rule between data before and after application of the run-length limited modulation.

51. The recording-medium reproducing apparatus according to claim 48, wherein the pre-coding comprises non-return-to-zero inverted conversion, the constraint concerning pre-codes adopted by the first a posteriori probability decoding section and the third a posteriori probability decoding section is a non-return-to-zero inverted conversion rule.

52. The recording-medium reproducing apparatus according to claim 48, wherein the third a posteriori probability decoding section performs the a posteriori probability decoding based on a trellis diagram representing the constraint concerning the modulation and the constraints concerning the pre-codes and recording and reproducing characteristic.

53. The recording-medium reproducing apparatus according to claim 48, wherein
the third a posteriori probability decoding section comprises:
secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and
a checking data decoding means using the a posteriori probability of the secondary modulation data derived from the secondary modulation data decoding means as a priori information to perform a posteriori probability decoding on this a priori information regarding the secondary modulation data and the a priori information regarding the checking data derived from the fourth calculating section in compliance with the constraint concerning the modulation so as to generate the a posteriori probability of the checking data.

54. The recording-medium reproducing apparatus according to claim 53, wherein
the secondary modulation data decoding means performs the a posteriori probability decoding based on a trellis diagram representing the constraint concerning the channel data and the constraints concerning the pre-codes and the recording and reproducing characteristic.

55. The recording-medium reproducing apparatus according to claim 53, wherein
the checking data decoding means performs the a posteriori probability decoding based on one of a trellis diagram or a demodulation table representing the constraint concerning the modulation.

56. The recording-medium reproducing apparatus according to claim 48, wherein
the systematic error-correcting coding is systematic convolutional coding, and
the second a posteriori probability decoding section performs the a posteriori probability decoding in compliance with a constraint concerning systematic convolutional codes.

57. The recording-medium reproducing apparatus according to claim 48, wherein
the systematic error-correcting coding is turbo coding, and
the second a posteriori probability decoding section performs the a posteriori probability decoding through turbo decoding corresponding to the turbo coding.

58. The recording-medium reproducing apparatus according to claim 48, wherein
the systematic error-correcting coding is low-density parity check coding, and
the second a posteriori probability decoding performs the a posteriori probability decoding through decoding corresponding to the low-density parity check coding.

59. A recording-medium reproducing apparatus for reproducing information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by performing systematic error-correcting coding on the primary modulation data to generate checking data, then performing the modulation on the checking data to generate secondary modulation data, and then performing the pre-coding on the secondary modulation data, comprising:
a reproduction section reproducing the primary channel data and the secondary channel data recorded on the recording medium and outputting reproduced data composed of primary reproduced data and secondary reproduced data;
a communication channel value computing section computing a communication channel value representing a probability per bit in the reproduced data;
a first a posteriori probability decoding section receiving a priori information regarding the primary modulation data, and performing a posteriori probability decoding on a priori information regarding the primary modulation data and the communication channel value as to the primary reproduced data derived from the communication channel value computing section in compliance with a constraint concerning channel data and constraints concerning pre-codes and a recording and reproducing characteristic so as to generate an a posteriori probability of the primary modulation data;
a first computing section receiving a priori information regarding the primary modulation data, and computing extrinsic information regarding the primary modulation data updated by the first a posteriori probability decoding section based on the a priori information regarding the primary modulation data and the a posteriori probability of the primary modulation data derived from the first a posteriori probability decoding section;
a second a posteriori probability decoding section receiving a priori information regarding the checking data, and performing a posteriori probability decoding on the extrinsic information regarding the primary modulation data derived from the first computing section, which is used as a priori information regarding the primary modulation data, as well as on the a priori information regarding the checking data, in compliance with a constraint concerning systematic error-correcting codes to generate an a posteriori probability of the primary modulation data;
a second computing section computing extrinsic information regarding the primary modulation data updated by the second a posteriori probability decoding section, based on the extrinsic information regarding the primary modulation data derived from the first computing section, which is used as a priori information regarding the primary modulation data, as well as based on the a posteriori probability of the primary modulation data derived from the second a posteriori probability decoding section, and outputting the computed extrinsic information as the a priori information regarding the primary modulation data to the first a posteriori probability decoding section and the first computing section;
a third a posteriori probability decoding section performing a posteriori probability decoding on the communication channel value as to the secondary reproduced data derived from the communication channel value computing section in compliance with a constraint concerning modulation and constraints concerning pre-codes and a recording and reproducing characteristic so as to generate an a posteriori probability of the checking data, and outputting this a posteriori probability as the priori information regarding the checking data to the second a posteriori probability decoding section; and a demodulation section receiving the a posteriori probability of the primary modulation data derived from the first or second a posteriori probability decoding section, then binarizing the a posteriori probability of the primary modulation data, and then performing demodulation corresponding to the modulation so as to reconstruct the information data, wherein the first and second a posteriori probability decoding sections performs iterative decoding while repeatedly delivering a priori information regarding the primary modulation data therebetween, and wherein after the iterative decoding has been performed, the demodulation section performs demodulation processing so as to reconstruct the information data.

60. The recording-medium reproducing apparatus according to claim 59, wherein the recording and reproducing characteristic is a partial response transfer characteristic, and the constraint concerning the recording and reproducing characteristic adopted by the first and the third a posteriori probability decoding sections is the partial response transfer characteristic.

61. The recording-medium reproducing apparatus according to claim 59, wherein the modulation is a run-length limited modulation, the constraint concerning channel data adopted by the first a posteriori probability decoding section is a run-length limit condition, and the constraint concerning modulation adopted by the third a posteriori probability decoding section is a correspondence rule between data before and after application of the run-length limited modulation.

62. The recording-medium reproducing apparatus according to claim 59, wherein the pre-coding comprises non-return-to-zero inverted conversion, the constraint concerning pre-codes adopted by the first a posteriori probability decoding section and the third a posteriori probability decoding section is a non-return-to-zero inverted conversion rule.

63. The recording-medium reproducing apparatus according to claim 59, wherein the third a posteriori probability decoding section performs the a posteriori probability decoding based on a trellis diagram representing the constraint concerning the modulation and the constraints concerning the pre-codes and recording and reproducing characteristic.

64. The recording-medium reproducing apparatus according to claim 59, wherein the third a posteriori probability decoding section comprises:

secondary modulation data decoding means performing a posteriori probability decoding on the communication channel value as to the secondary reproduced data in compliance with a constraint concerning channel data and constraints concerning pre-codes and a recording and reproducing characteristic so as to generate an a posteriori probability of the secondary modulation data; and a checking data decoding means using the a posteriori probability of the secondary modulation data derived from the secondary modulation data decoding means as a priori information to perform a posteriori probability decoding on this a priori information regarding the secondary modulation data in compliance with the constraint concerning the modulation so as to generate the a posteriori probability of the checking data.

65. The recording-medium reproducing apparatus according to claim 64, wherein the secondary modulation data decoding means performs the a posteriori probability decoding based on a trellis diagram representing the constraint concerning the channel data and the constraints concerning the pre-codes and the recording and reproducing characteristic.

66. The recording-medium reproducing apparatus according to claim 64, wherein the checking data decoding means performs the a posteriori probability decoding based on one of a trellis diagram or a demodulation table representing the constraint concerning the modulation.

67. The recording-medium reproducing apparatus according to claim 59, wherein the systematic error-correcting coding is systematic convolutional coding, and the second a posteriori probability decoding section performs the a posteriori probability decoding in compliance with a constraint concerning systematic convolutional codes.

68. The recording-medium reproducing apparatus according to claim 59, wherein the systematic error-correcting coding is turbo coding, and the second a posteriori probability decoding section performs the a posteriori probability decoding through turbo decoding corresponding to the turbo coding.

69. The recording-medium reproducing apparatus according to claim 59, wherein the systematic error-correcting coding is low-density parity check coding, and the second a posteriori probability decoding performs the a posteriori probability decoding through decoding corresponding to the low-density parity check coding.

70. A method of decoding information data from a recording medium, on which primary channel data and secondary channel data are recorded, the primary channel data having been obtained by performing modulation on the information data to generate primary modulation data and then performing pre-coding on the primary modulation data, and the secondary channel data having been obtained by performing at least systematic error-correcting coding on the primary modulation data to form checking data, then performing at least the modulation on the checking data to generate secondary modulation data, and then performing the pre-coding on the secondary modulation data, comprising:

reproducing the primary channel data and the secondary channel data recorded on the recording medium to generate reproduced data;

based on the reproduced data, iteratively performing a posteriori probability decoding in compliance with a constraint concerning channel data and constraints concerning pre-codes and a recording and reproducing characteristic as well as an a posteriori probability decoding in compliance with a constraint concerning systematic error-correcting codes, while repeatedly delivering and receiving a priori information regarding the primary modulation data, so as to obtain an a posteriori probability of the primary modulation data; and binarizing the obtained a posteriori probability of the primary modulation data and then performing demodulation corresponding to the modulation so as to reconstruct the information data.

* * * * *